US012389610B2

(12) United States Patent
Ogiwara et al.

(10) Patent No.: US 12,389,610 B2
(45) Date of Patent: Aug. 12, 2025

(54) MEMORY DEVICE WITH MEMORY STRINGS USING VARIABLE RESISTANCE MEMORY REGIONS

(71) Applicant: Kioxia Corporation, Tokyo (JP)

(72) Inventors: Ryu Ogiwara, Yokohama Kanagawa (JP); Daisaburo Takashima, Yokohama Kanagawa (JP); Takahiko Iizuka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 241 days.

(21) Appl. No.: 17/877,714

(22) Filed: Jul. 29, 2022

(65) Prior Publication Data

US 2022/0367568 A1 Nov. 17, 2022

Related U.S. Application Data

(62) Division of application No. 16/908,880, filed on Jun. 23, 2020, now abandoned.

(30) Foreign Application Priority Data

Jun. 24, 2019 (JP) ................................. 2019-116756

(51) Int. Cl.
*H10B 63/00* (2023.01)
*G11C 13/00* (2006.01)
(Continued)

(52) U.S. Cl.
CPC ......... *H10B 63/30* (2023.02); *G11C 13/0004* (2013.01); *G11C 13/003* (2013.01);
(Continued)

(58) Field of Classification Search
CPC ........ H10B 63/30; H10B 63/34; H10B 63/84; G11C 13/0004; G11C 13/003; G11C 13/004; G11C 13/0069; G11C 2213/74; G11C 2213/79; G11C 13/0007; G11C 2213/75; H10N 70/253; H10N 70/826;
(Continued)

(56) References Cited

U.S. PATENT DOCUMENTS 5,894,447 A 4/1999 Takashima
9,025,369 B2 5/2015 Takashima
(Continued)

OTHER PUBLICATIONS

Aochi, "BiCS Flash as a Future 3D Non-volatile Memory Technology for Ultra High Density Storage Devices", IEEE, 2009.
(Continued)

*Primary Examiner* — Jerome Leboeuf
(74) *Attorney, Agent, or Firm* — Holtz, Holtz & Volek PC

(57) ABSTRACT

A memory device includes a memory cell and a first select transistor. The memory cell includes a variable resistance memory region, a first semiconductor layer being in contact with the variable resistance memory region, a first insulating layer being in contact with the first semiconductor layer, and a first voltage application electrode being in contact with the first insulating layer. The first select transistor includes a second semiconductor layer, a second insulating layer being in contact with the second semiconductor layer, and a second voltage application electrode extending in the second direction and being in contact with the second insulating layer.

13 Claims, 53 Drawing Sheets

(51) Int. Cl.
*H10N 70/00* (2023.01)
*H10N 70/20* (2023.01)

(52) U.S. Cl.
CPC ........ *G11C 13/004* (2013.01); *G11C 13/0069* (2013.01); *H10N 70/253* (2023.02); *H10N 70/826* (2023.02); *H10N 70/841* (2023.02); *H10N 70/8822* (2023.02); *H10N 70/8825* (2023.02); *H10N 70/8828* (2023.02); *H10N 70/8833* (2023.02)

(58) Field of Classification Search
CPC ............. H10N 70/841; H10N 70/8822; H10N 70/8825; H10N 70/8828; H10N 70/8833; H10N 70/20; H10N 70/231
See application file for complete search history.

(56) References Cited

U.S. PATENT DOCUMENTS

| | | | |
|---|---|---|---|
| 9,177,966 B1* | 11/2015 | Rabkin | ................ H10B 43/35 |
| 9,966,136 B2 | 5/2018 | Ogiwara et al. | |
| 2012/0044742 A1 | 2/2012 | Narayanan | |
| 2012/0243307 A1* | 9/2012 | Takashima | ........... H10N 70/231 |
| | | | 257/E27.081 |
| 2014/0145137 A1 | 5/2014 | Ju et al. | |
| 2017/0040379 A1 | 2/2017 | Sasago et al. | |
| 2019/0371809 A1* | 12/2019 | Yun | ........................ H10B 43/35 |
| 2020/0373355 A1 | 11/2020 | Lien et al. | |
| 2021/0050371 A1* | 2/2021 | Sharangpani | .......... H10B 51/40 |
| 2021/0074914 A1 | 3/2021 | Lee et al. | |

OTHER PUBLICATIONS

Kinoshita, et al., "Scalable 3-D vertical chain-cell-type phase-change memory with 4F2 poly-Si diodes", VLSI Technology (VLSIT), 2012, pp. 35-36.

Nitayama, et al., "Bit Cost Scalable (BiCS) Technology for Future Ultra High Density Memories", IEEE, 2013.

Nitayama, "Bit Cost Scalable (BiCS) Technology for Future Ultra High Density Storage Memories", Symposium on VLSI Technology Digest of Technical Paper, T60-T61, 2013.

Nitayama, et al., "New Memory", The Institute of Electronics, Information and Communications Engineers (IEICE), "Knowledge Base", Group 10, No. 4, Chapter. 5, 2010.

* cited by examiner

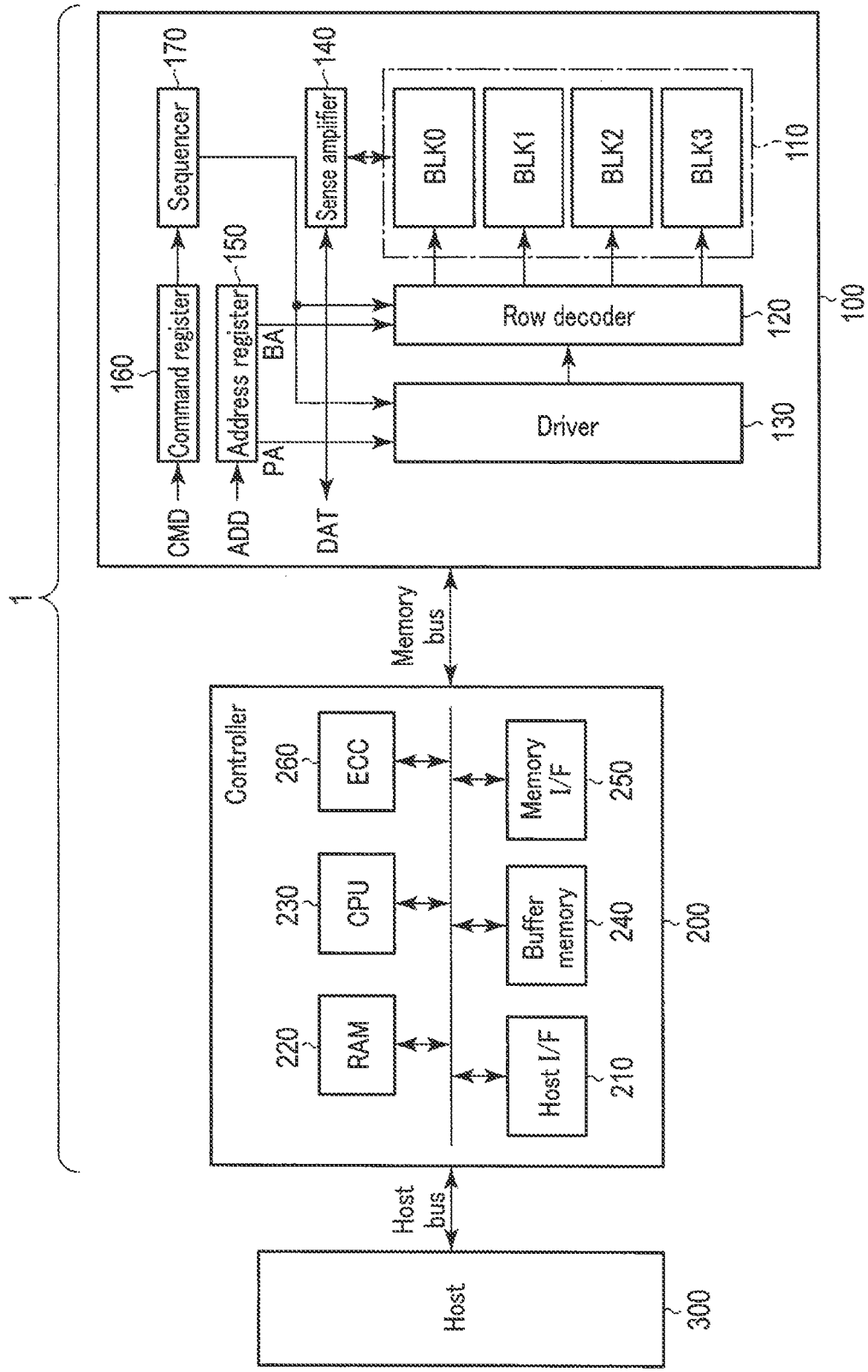
F I G. 1

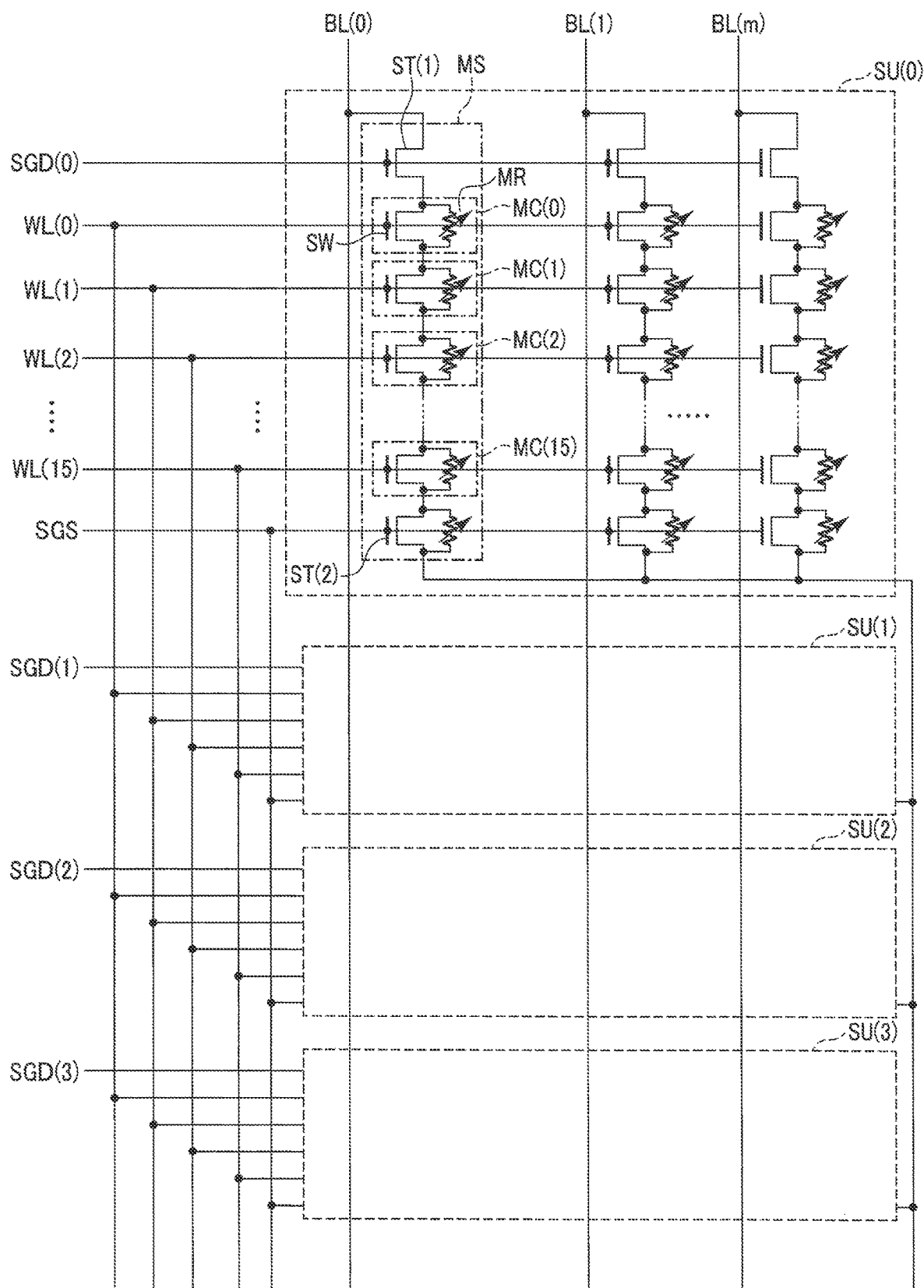
F I G. 18

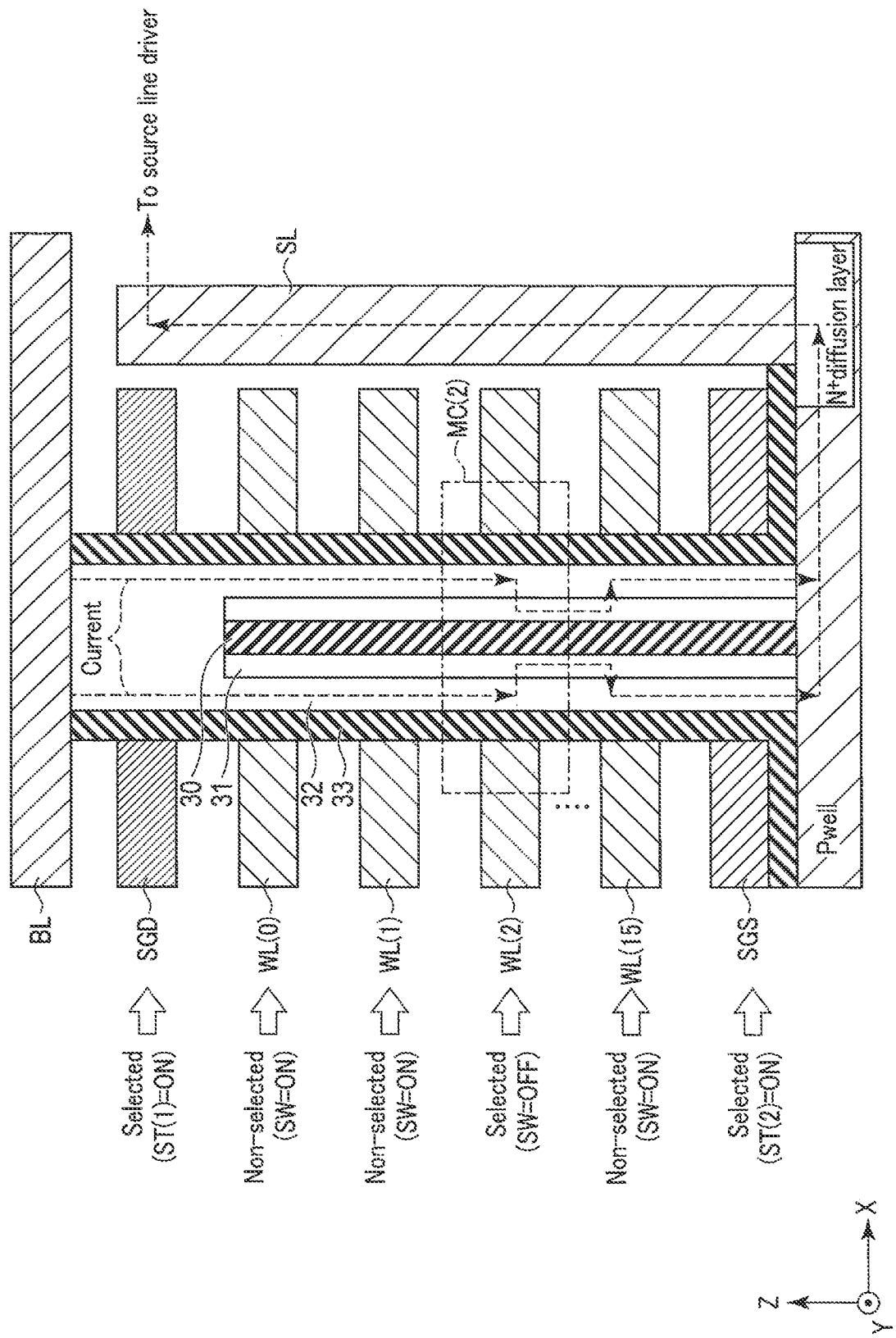
F I G. 26

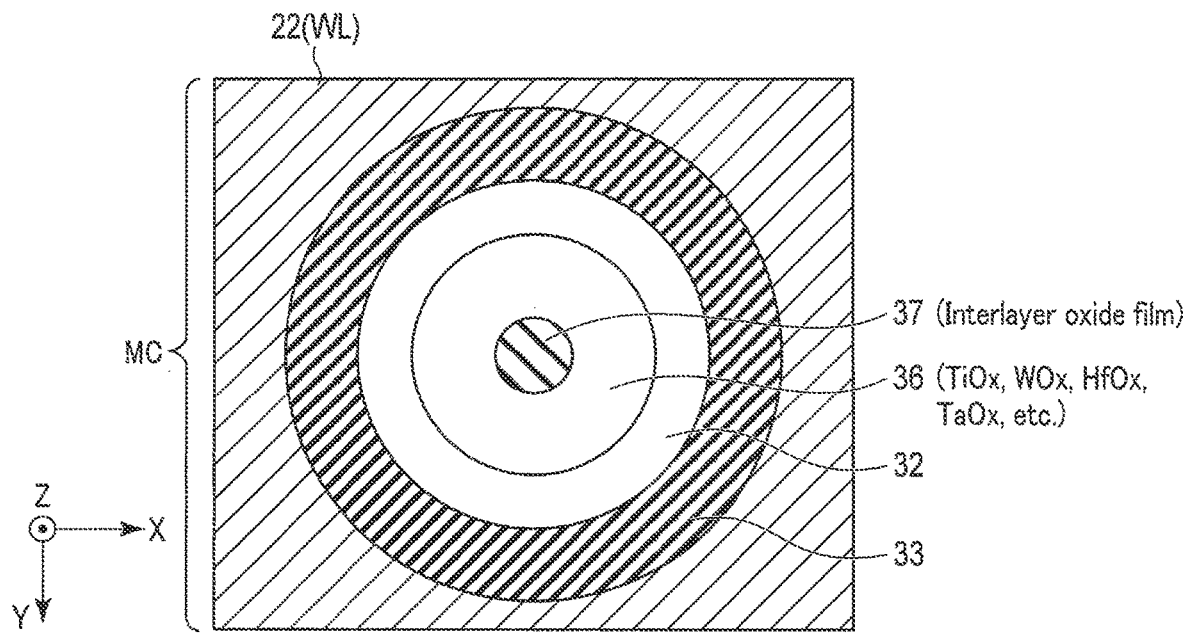
F I G. 31
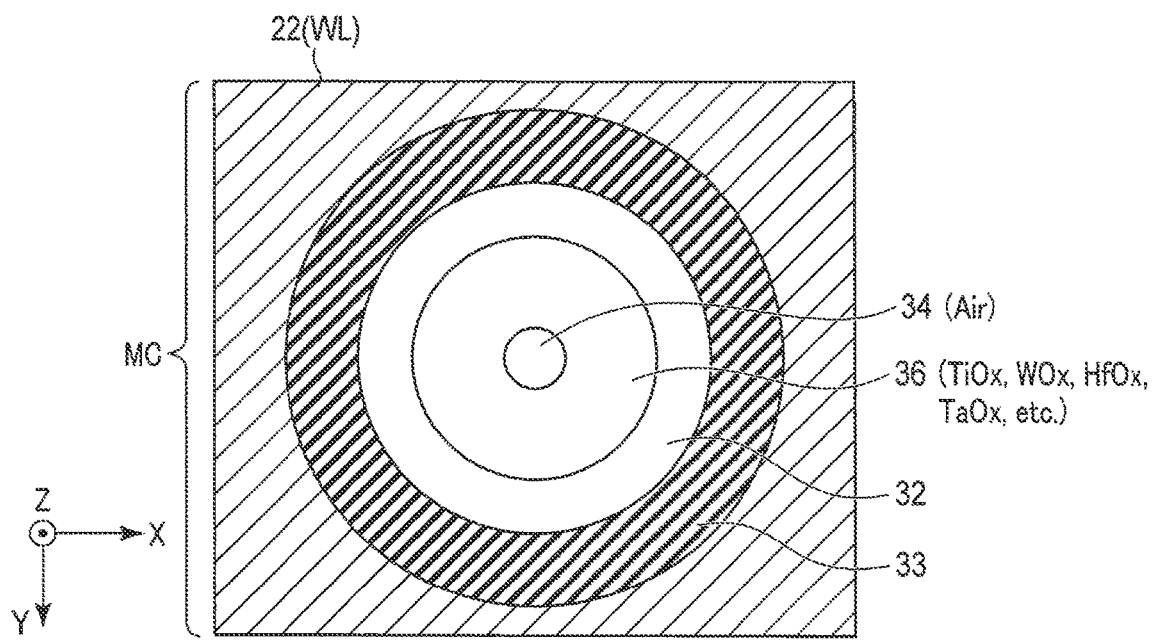
F I G. 32

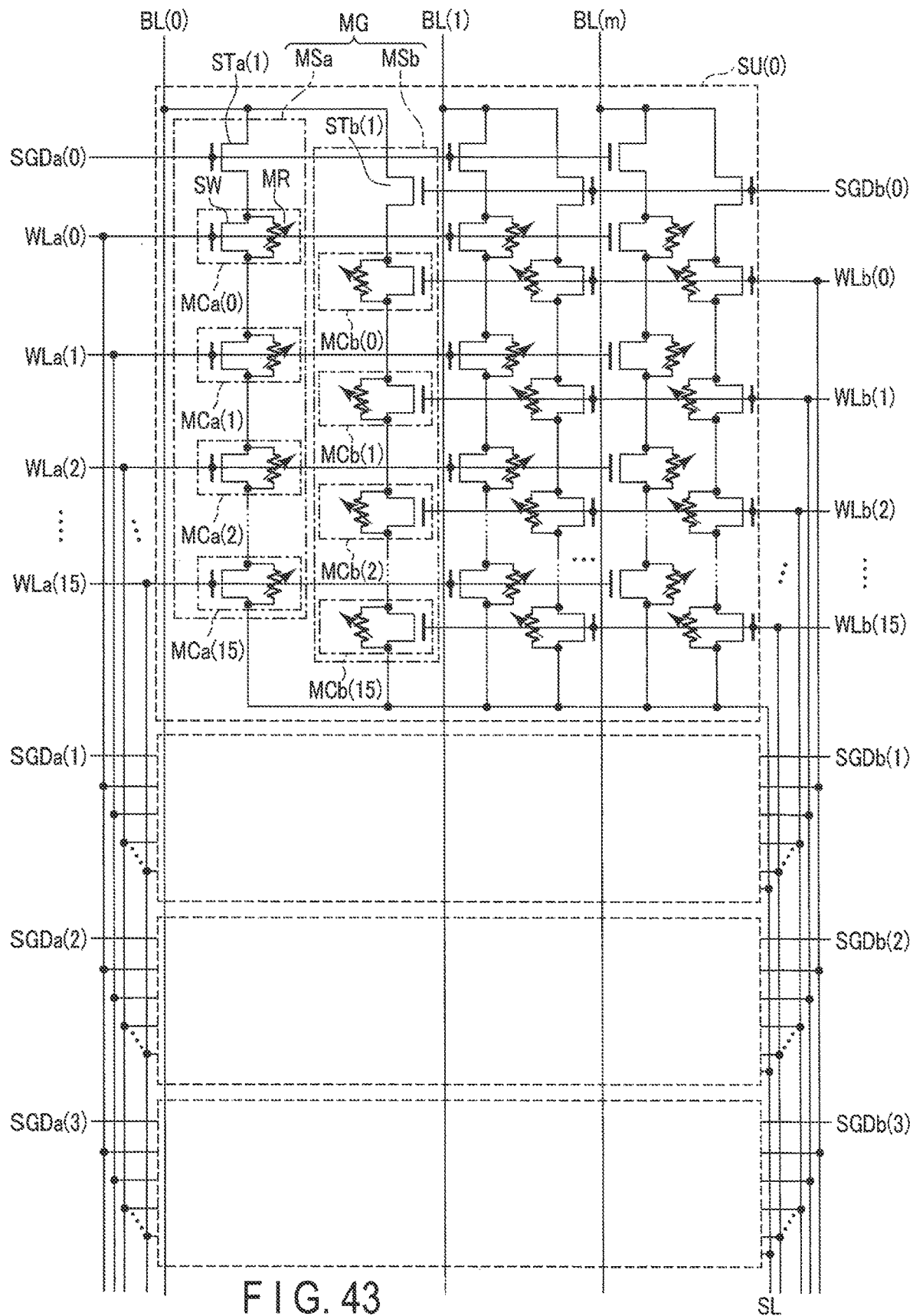
F I G. 43

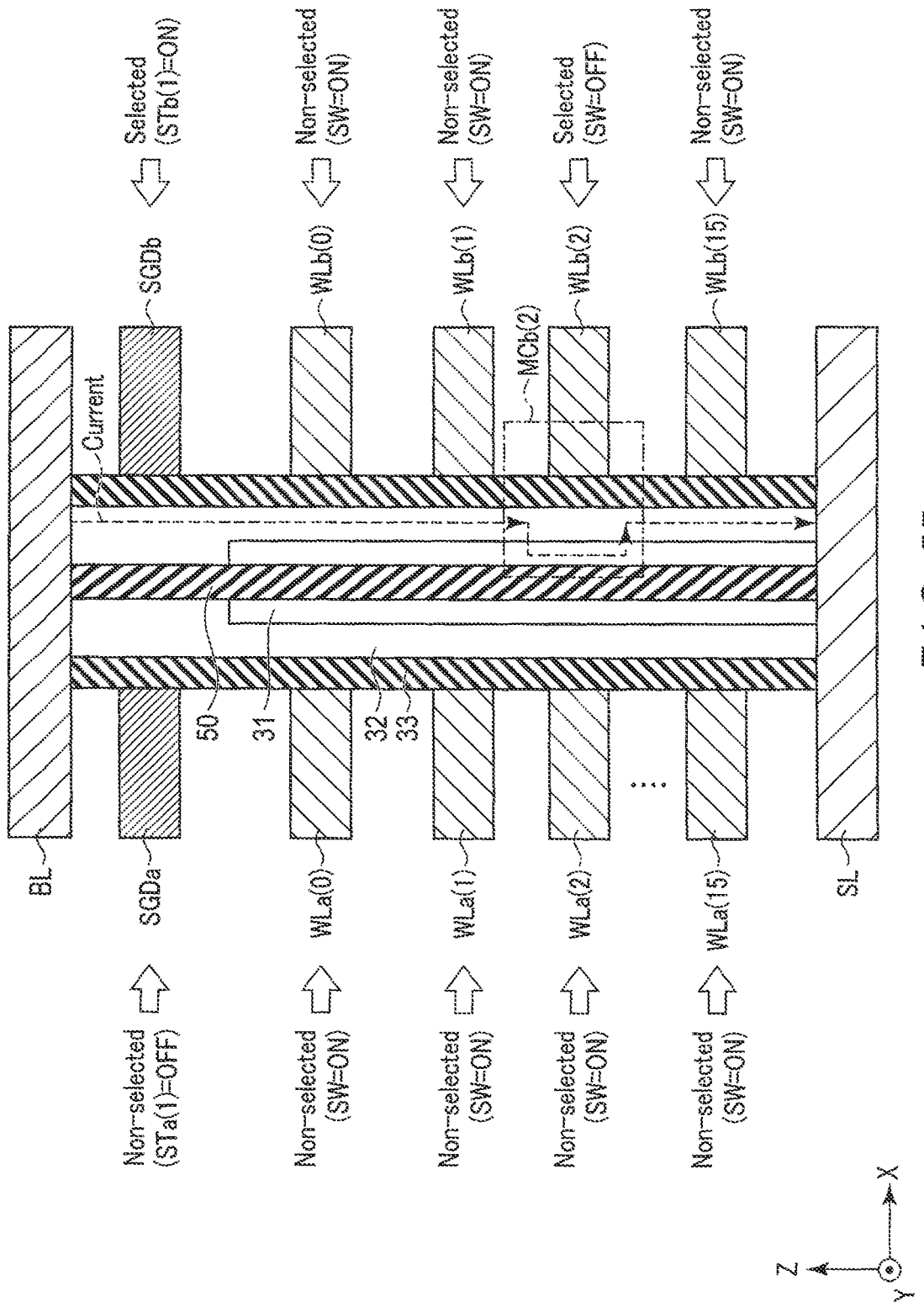
F I G. 55

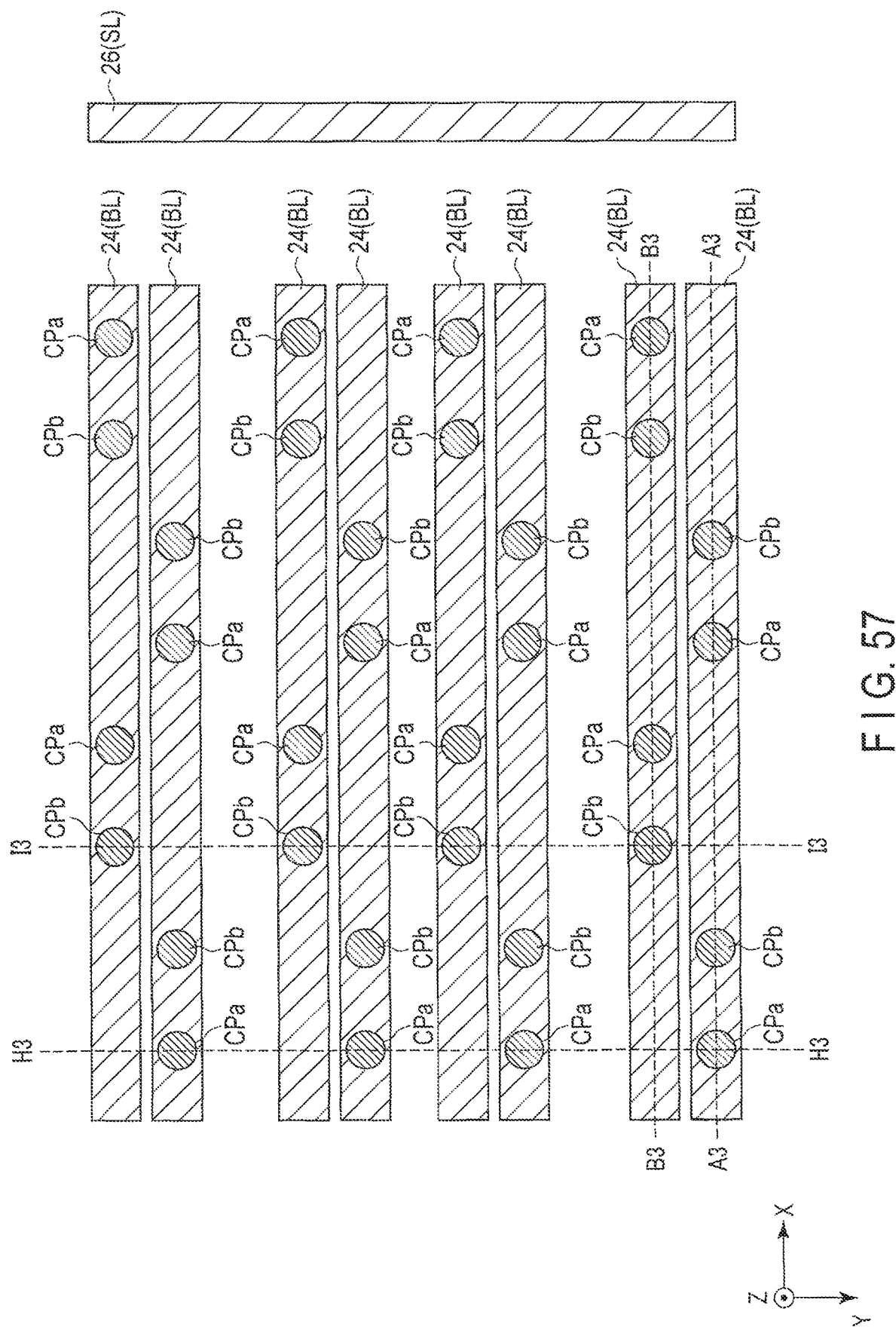
F I G. 57

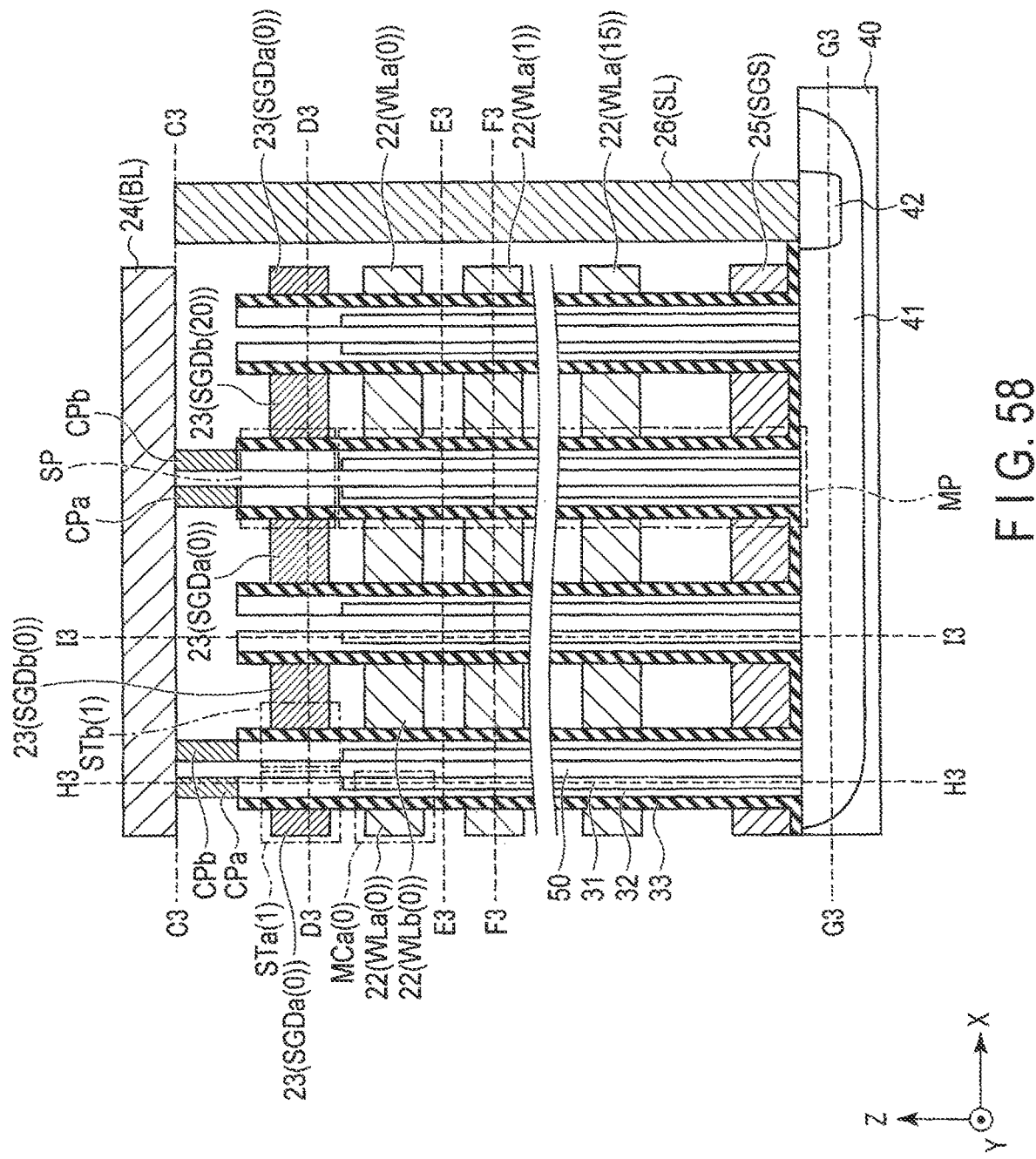
F I G. 58

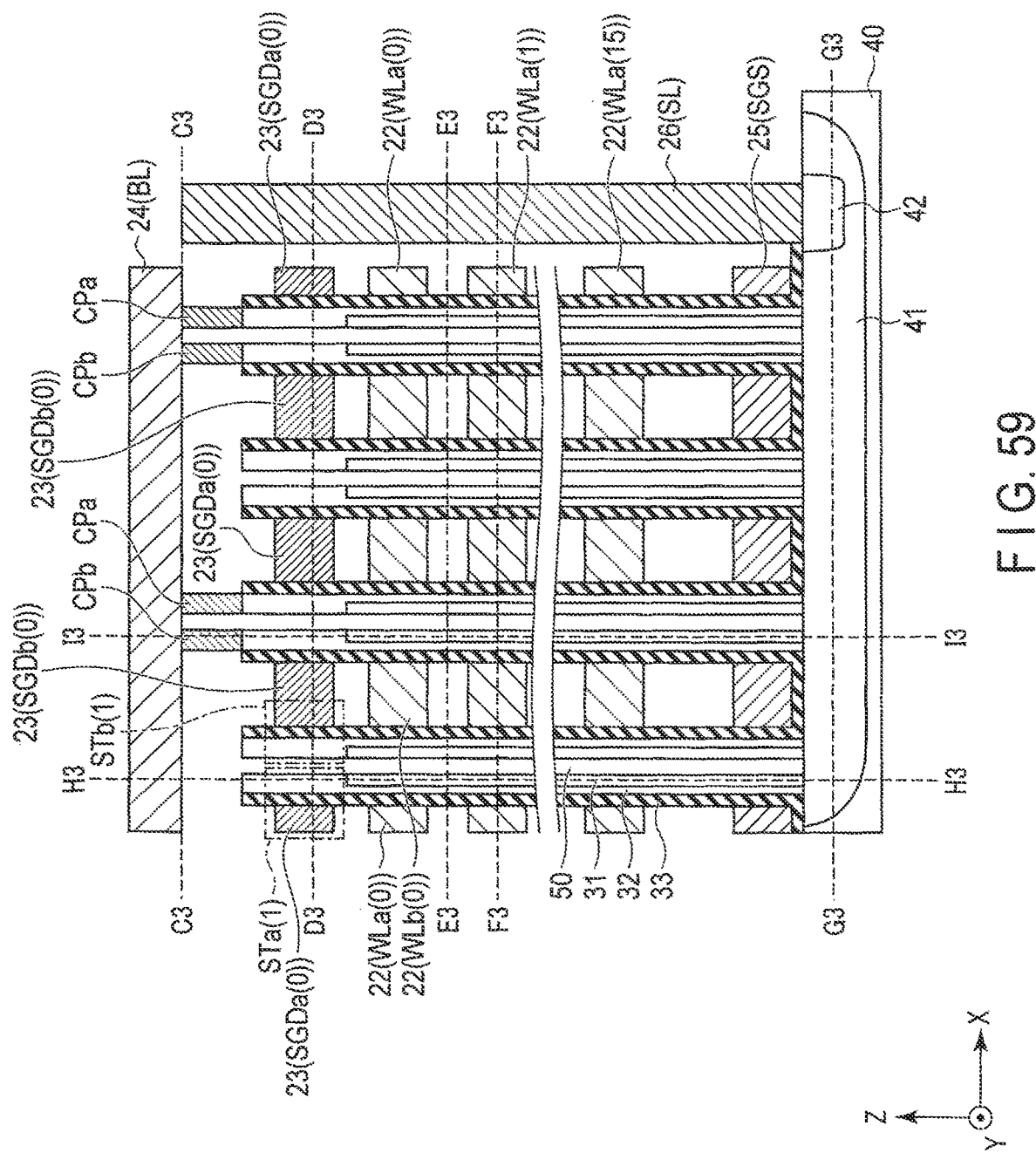
F I G. 59

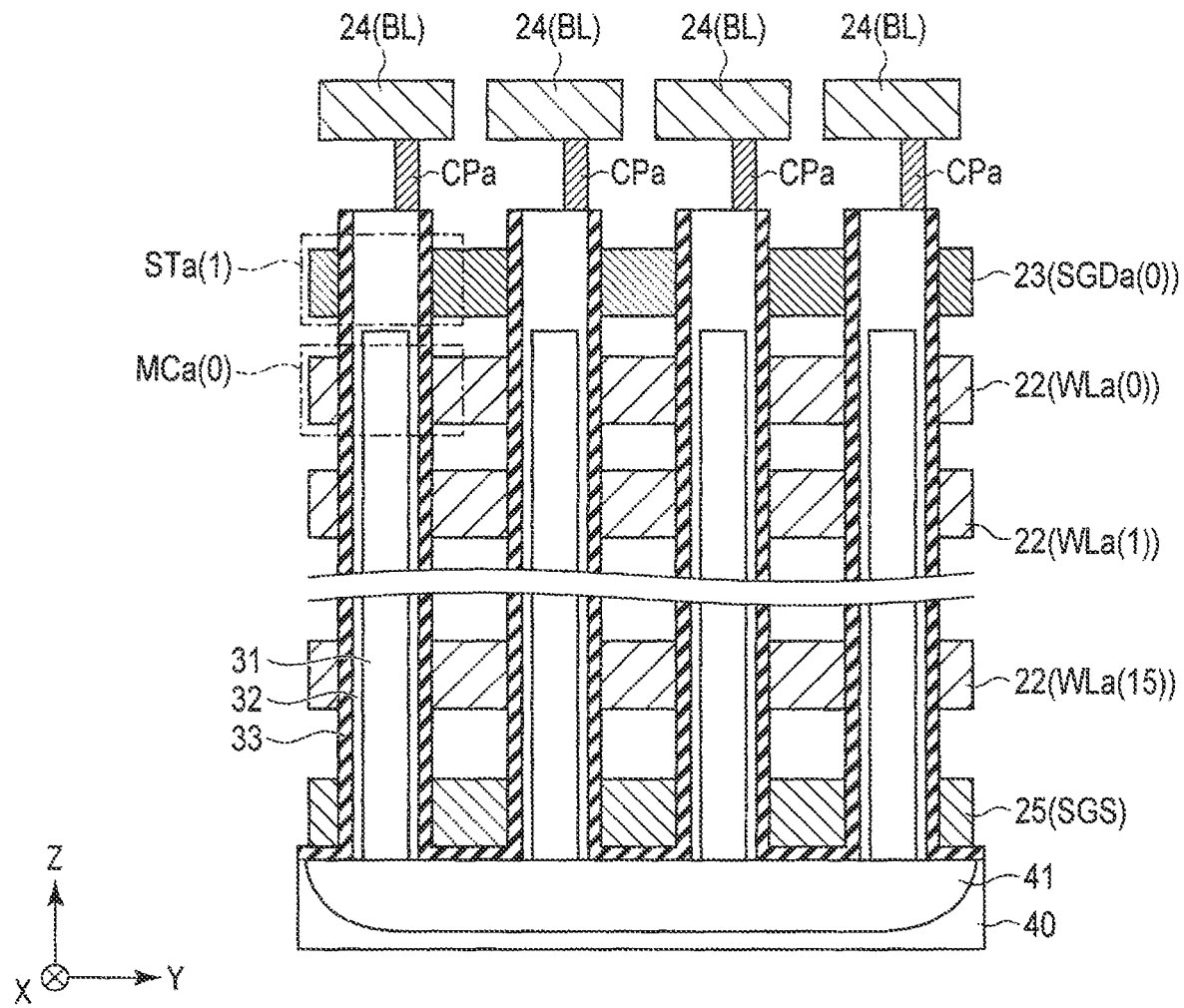
F I G. 64

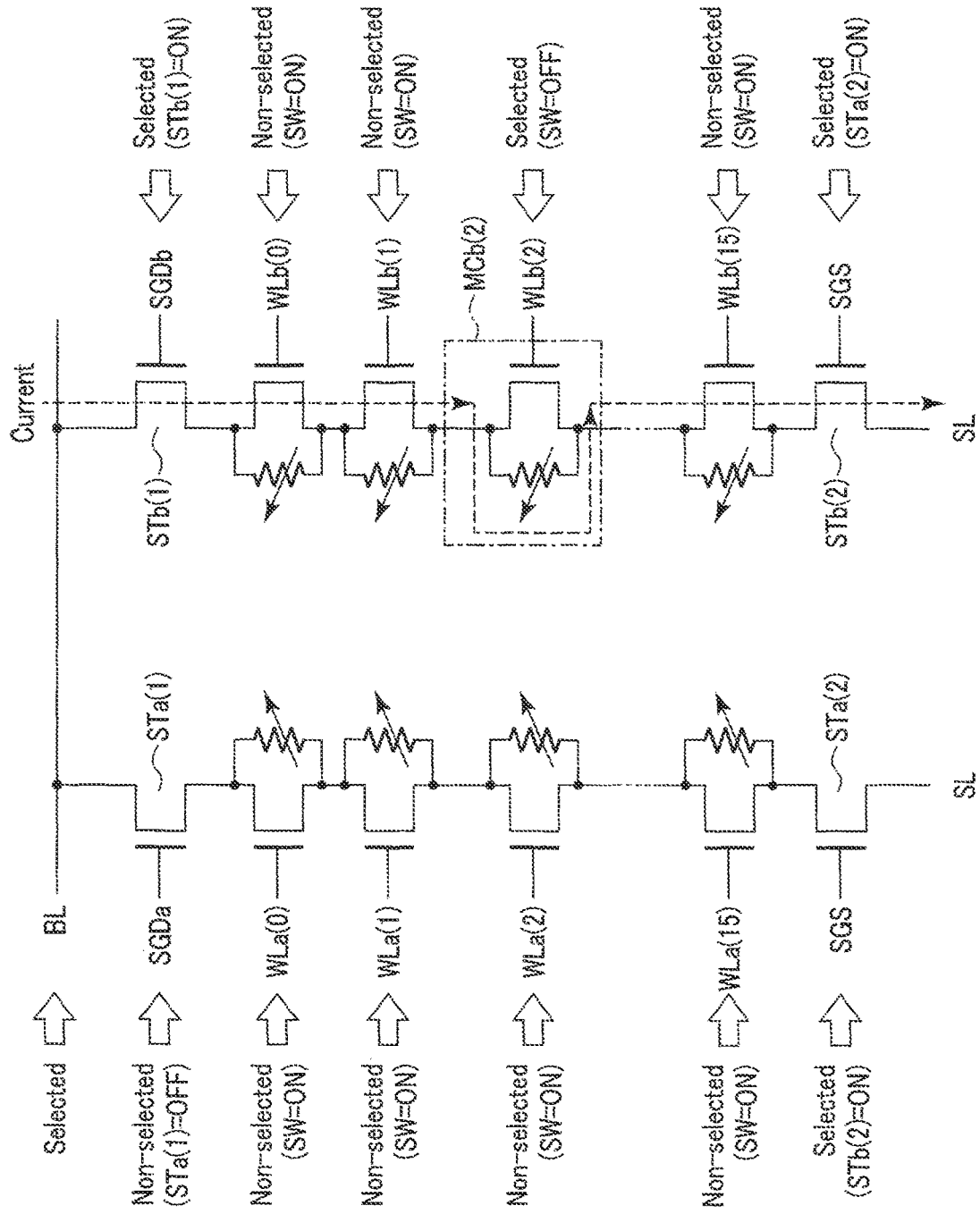
F I G. 66

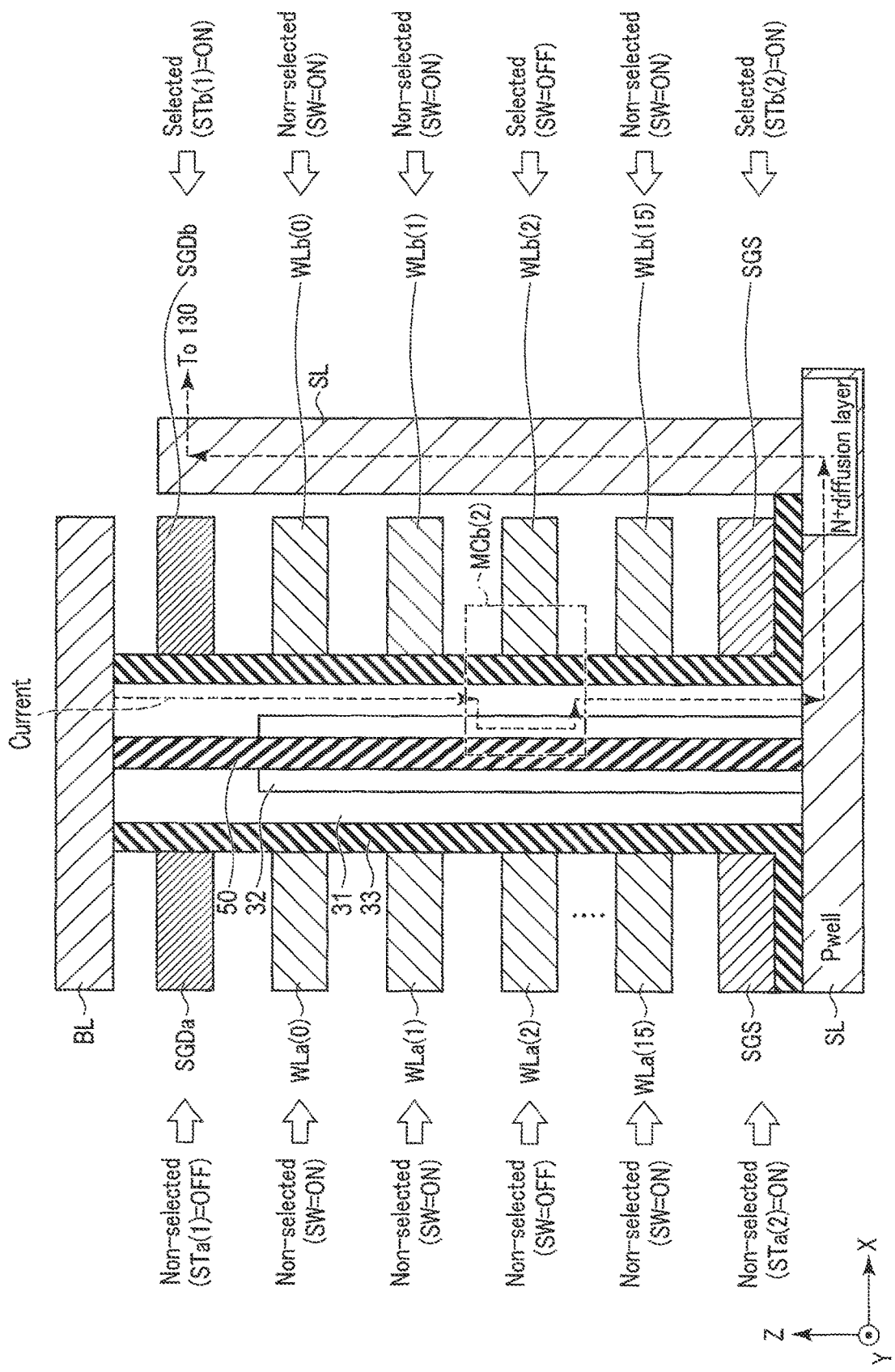
F I G. 67

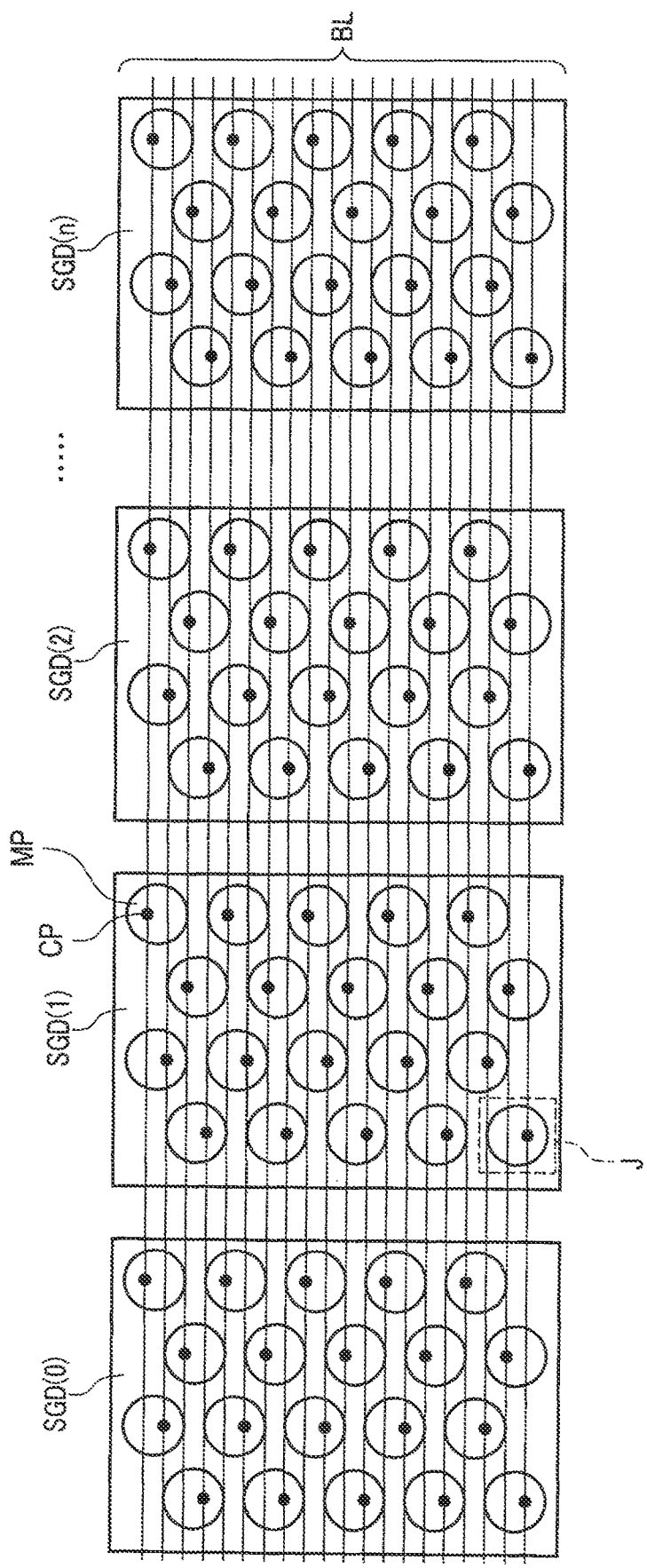
F I G. 72

MEMORY DEVICE WITH MEMORY STRINGS USING VARIABLE RESISTANCE MEMORY REGIONS

CROSS-REFERENCE TO RELATED APPLICATIONS

This application is a Divisional Application of U.S. application Ser. No. 16/908,880, filed Jun. 23, 2020, which is based upon and claims the benefit of priority from prior Japanese Patent Application No. 2019-116756, filed Jun. 24, 2019, the entire contents of all of which are incorporated herein by reference.

FIELD

Embodiments relate to a memory device.

BACKGROUND

Memory devices (semiconductor integrated circuit devices) in which variable resistance memory elements such as resistive random access memory (ReRAM) elements, alloy-based phase-change memory (PCM) elements, interfacial phase-change memory (iPCM) elements, and conductive-bridge RAM (CBRAM) elements are integrated on a semiconductor substrate have been proposed.

For a memory device using such a variable resistance memory element, a three-dimensional structure that can be easily manufactured, reduces the time required for development, and allows for high integration that reduces the processing cost has not been proposed.

BRIEF DESCRIPTION OF THE DRAWINGS

FIG. 1 is a block diagram roughly showing an overall configuration of a memory system.

FIG. 3 is a circuit diagram showing a path of a current flowing through a memory cell when a selector is turned on.

FIG. 18 is a circuit diagram showing a circuit (equivalent circuit) of a memory cell array.

FIG. 26 is a cross-sectional view in which a memory pillar corresponding to a single memory cell string is extracted.

FIG. 31 is a cross-sectional view in which a single memory cell is extracted.

FIG. 32 is a cross-sectional view in which a single memory cell is extracted.

FIG. 43 is a circuit diagram showing a circuit (equivalent circuit) of a memory cell array.

FIG. 55 is a cross-sectional view in which a memory pillar corresponding to two memory cell strings is extracted.

FIG. 57 is a plan view showing a relationship between a bit line of a memory cell array included in a memory chip and a contact plug that couples the bit line and a memory pillar, according to a first modification of the second embodiment.

FIG. 58 is a cross-sectional view taken along line A3-A3 of FIG. 57.

FIG. 59 is a cross-sectional view taken along line B3-B3 of FIG. 57.

FIG. 64 is a cross-sectional view taken along line H3-H3 of FIGS. 58 and 59.

FIG. 66 is a circuit diagram in which two memory cell strings are extracted.

FIG. 67 is a cross-sectional view in which a memory pillar corresponding to two memory cell strings is extracted.

FIG. 72 is a plan view showing a third example of a relationship between memory pillars and bit lines according to the first embodiment.

DETAILED DESCRIPTION

Figure 2:
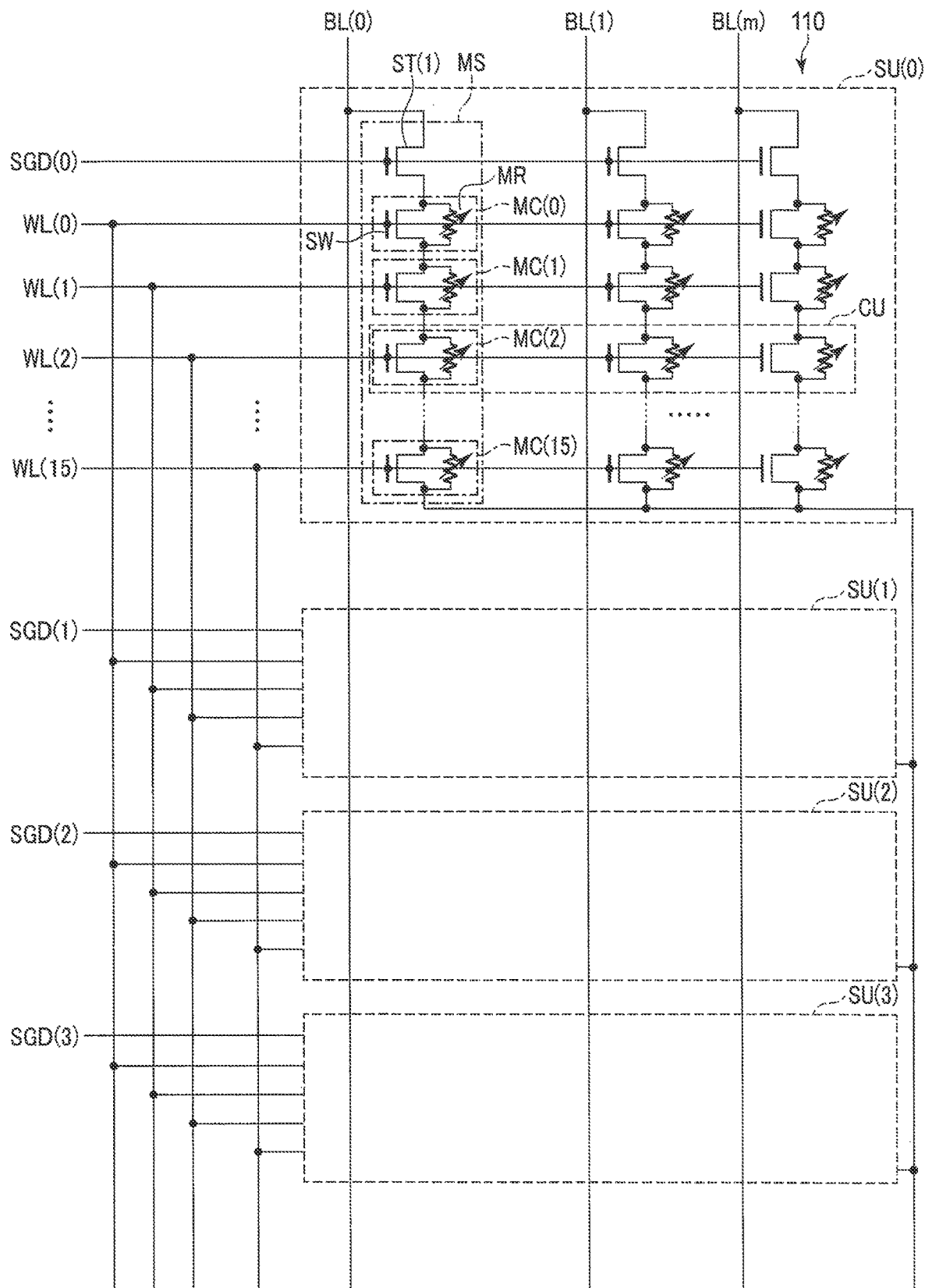
FIG. 2 is a circuit diagram showing a circuit (equivalent circuit) of a memory cell array.

In general, according to one embodiment, a memory device includes: a plurality of memory cells each including: a variable resistance memory region extending in a first direction that is orthogonal to a semiconductor substrate; a first semiconductor layer extending in the first direction and being in contact with the variable resistance memory region; a first insulating layer extending in the first direction and being in contact with the first semiconductor layer; and a first voltage application electrode extending in a second direction that is orthogonal to the first direction and being in contact with the first insulating layer; a first select transistor including: a second semiconductor layer extending in the first direction; a second insulating layer extending in the first direction and being in contact with the second semiconductor layer; and a second voltage application electrode extending in the second direction and being in contact with the second insulating layer; and a memory cell string including the first select transistor, the memory cells, and a third voltage application electrode, the memory cells being coupled in series in the first direction, one end of the first select transistor being coupled to one end of one of the memory cells that is provided at a first end portion, the third voltage application electrode being coupled to one end of one of the memory cells that is provided at a second end portion.

Hereinafter, embodiments will be described with reference to the accompanying drawings. In the description that follows, components having the same function and configuration will be denoted by a common reference numeral.

<1> First Embodiment

A memory system according to a first embodiment will be described.

<1-1> Configuration

<1-1-1> Overall Configuration of Memory System

An overall configuration of the memory system according to the present embodiment will be roughly described, with reference to FIG. 1.

As shown in FIG. 1, a memory system 1 comprises a memory chip 100 and a controller 200. The memory chip 100 and the controller 200 in combination, for example, may configure a single semiconductor device; examples of such a configuration include a memory card such as an SDTM card and a solid state drive (SSD).

The memory chip 100 includes a plurality of memory cells, and stores data in a non-volatile manner. The controller 200 is coupled to the memory chip 100 via a memory bus, and is coupled to a host 300 via a host bus. The controller 200 controls the memory chip 100, and accesses the memory chip 100 in response to a host command received from the host 300. The host 300 is, for example, a digital camera, a personal computer, etc., and the host bus is a bus that is compatible with, for example, an SDTM interface. The memory bus transmits and receives a signal that is compatible with a memory interface.

<1-1-2> Configuration of Controller 200

A detailed configuration of the controller 200 will be described with reference to FIG. 1.

As shown in FIG. 1, the controller 200 includes a host interface circuit (host I/F) 210, an embedded memory (random access memory: RAM) 220, a processor (central processing unit: CPU) 230, a buffer memory 240, a memory interface circuit (memory I/F) 250, and an error checking and correcting (ECC) circuit 260.

The host interface circuit 210 is coupled to the host 300 via the host bus, and transfers a host command and data received from the host 300 to the processor 230 and the buffer memory 240, respectively. In response to an instruction from the processor 230, the host interface circuit 210 transfers the data in the buffer memory 240 to the host 300.

The processor 230 controls the entire operation of the controller 200. Upon receiving, for example, a host command relating to a read operation from the host 300, the processor 230 causes, in response thereto, the memory interface circuit 250 to issue a read command (memory command) to the memory chip 100. Upon receiving a host command relating to a write operation from the host 300, the processor 230 performs a similar operation. Also, the processor 230 performs various processes (e.g., wear leveling) for managing the memory chip 100.

The memory interface circuit 250 is coupled to the memory chip 100 via a memory bus, and controls communications with the memory chip 100. Based on an instruction received from the processor 230, the memory interface circuit 250 transmits a variety of signals to the memory chip 100, and receives a variety of signals from the memory chip 100.

The buffer memory 240 temporarily stores write data to the memory chip 100 and read data from the memory chip 100.

The embedded memory 220 is, for example, a semiconductor memory such as a DRAM and an SRAM, and is used as a work area of the processor 230. The embedded memory 220 stores firmware for managing the memory chip 100, and various types of management tables such as a shift table, a history table, and a flag table, which will be described later.

The ECC circuit 260 performs error detection and correction processes on data stored in the memory chip 100. That is, the ECC circuit 260 generates an error correction code and appends it to write data at the time of data writing, and decodes it at the time of data reading.

<1-1-3> Configuration of Memory Chip 100

Next, a configuration of the memory chip 100 will be described.

As shown in FIG. 1, the memory chip 100 includes a memory cell array 110, a row decoder 120, a driver circuit 130, a sense amplifier 140, an address register 150, a command register 160, and a sequencer 170.

The memory cell array 110 includes a plurality of blocks BLK each including a plurality of non-volatile memory cells respectively associated with rows (words lines) and columns (bit lines). FIG. 1 shows four blocks BLK0-BLK3 as an example. The memory cell array 110 stores data supplied from the controller 200.

The row decoder 120 selects one of the blocks BLK0 to BLK3 based on a block address BA in the address register 150, and selects a word line direction in the selected block BLK.

The driver circuit 130 supplies a voltage to the selected block BLK via the row decoder 120 based on a page address PA in the address register 150. The driver circuit 130 includes, for example, a source line driver, etc.

At the time of data reading, the sense amplifier 140, which includes sense amplifier modules SA provided for respective bit lines BL, senses data DAT read from the memory cell array 110, and performs a necessary computation thereon. The data DAT is then output to the controller 200. At the time of data writing, the sense amplifier 140 transfers write data DAT received from the controller 200 to the memory cell array 110.

The address register 150 stores an address ADD received from the controller 200. The address ADD includes the above-described block address BA and page address PA. The command register 160 stores a command CMD received from the controller 200.

The sequencer 170 controls the operation of the entire memory chip 100 based on the command CMD stored in the command register 160.

<1-1-4> Circuit Configuration of Memory Cell Array 110

Next, a circuit (equivalent circuit) configuration of the memory cell array 110 will be described with reference to FIG. 2.

As shown in FIG. 2, each block BLK of the memory cell array 110 includes, for example, four string units SU (SU(0)-SU(3)). The number of string units SU in each block BLK may be designed to be any number. Each string unit SU includes a plurality of memory cell strings MS.

Each memory cell string MS includes, for example, 16 memory cells MC (MC(0) to MC(15)) and a select transistor ST(1). Hereinafter, when the memory cells MC(0) to MC(15) are not distinguished from one another, they will be referred to as "memory cells MC". The number of select transistors ST(1) included in each memory cell string MS may be designed to be any number greater than one.

Each memory cell MC includes a memory element (variable resistance memory region/variable resistance layer/ variable resistance element) MR and a selector SW. Examples of the memory element MR include an alloy-based phase-change element ($Ge_2Sb_2Te_5$). The memory element MR according to the present embodiment takes either a low resistance state or a high resistance state according to a change in crystallization state. Hereinafter, a change in the crystallization state of the memory element MR will be referred to as a "phase change", a low resistance state (LRS) of the memory element MR will be referred to as a "set state", and a high resistance state (HRS) of the memory element MR will be referred to as a "reset state". In the present embodiment, the selector SW includes a semiconductor layer, a gate insulating film, and a gate electrode. In the memory cell MC, the memory element MR and the selector SW are coupled in parallel. Also, the number of memory cells MC included in each memory cell string MS is not limited to a particular number, and may be 8, 32, 48, 64, 96, 128, etc.

Figure 3:
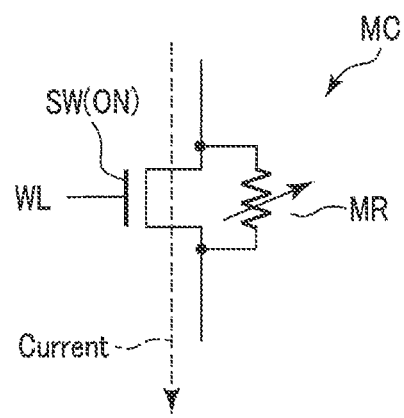

When the memory cell MC is not selected, the selector SW is switched to an on state (a conductive state). When the selector SW is in the on state, as shown in FIG. 3, an inversion layer is formed in the semiconductor layer of the selector SW, and a current flows through the inversion layer. A resistance value of the memory element MR in the low resistance state is 10 times (an order of magnitude) or more higher than a resistance value of the semiconductor layer of the selector SW in the on state. This prevents a current to flow through the memory element MR that is coupled in parallel. It is a memory element MR that stores data in a memory cell MC. Thus, if a current does not flow through the memory element MR, it means that the memory cell is not selected.

Figure 4:
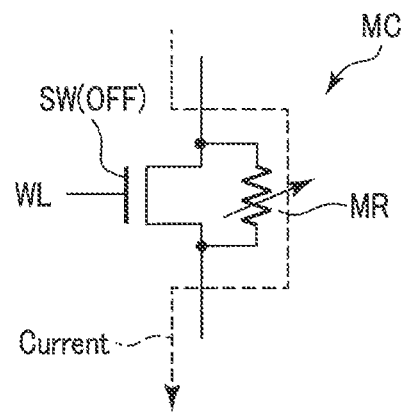
FIG. 4 is a circuit diagram showing a path of a current flowing through a memory cell when a selector is turned off.

When the memory cell MC is selected, the selector SW is switched to an off state (non-conductive state). When the selector SW is in the off state, as shown in FIG. 4, an inversion layer is not formed in the semiconductor layer of the selector SW. A resistance value of the memory element MR in the high resistance state is 10 times (an order of magnitude) or more lower than a resistance value of the semiconductor layer of the selector SW in the off state. This prevents a current to flow through the semiconductor layer, and flows through the memory element MR that is coupled in parallel. If a current flows through the memory element MR, it means that the memory cell is selected.

Referring back to FIG. 2, a further description will be given of the memory cell array 110. The memory cells MC(0) to MC(15) included in each memory cell string MS are coupled in series between the select transistor ST(1) and a source line SL. Control gates of the memory cells MC(0) of a plurality of memory cell strings MS included in the same block BLK are commonly coupled to a word line WL(0). Similarly, control gates of the memory cells MC(1) to MC(15) of a plurality of memory cell strings MS included in the same block BLK are commonly coupled to word lines WL(1) to WL(15).

Hereinafter, when word lines WL(0) to (15) are not distinguished from one another, they will be referred to as "word lines WL".

In the description that follows, a group of memory cells MC that are coupled to a common word line WL in each string unit SU will be referred to as a "cell unit (CU)". Also, a set of 1-bit data items stored in a cell unit will be referred to as a "page". Accordingly, when two-bit data is stored in a single memory cell MC, the cell unit stores two pages of data.

Gates of select transistors ST(1) in each string unit SU are commonly coupled to a select gate line SGD. More specifically, gates of select transistors ST(1) in a string unit SU(0) are commonly coupled to a select gate line SGD(0). Similarly, gates of select transistors ST(1) in a string unit SU(1) are commonly coupled to a select gate line SGD(1). The same is true of string units SU(2) and SU(3).

Hereinafter, when select gate lines SGD (SGD(0), SGD (1), . . . ) are not distinguished from one another, they will be referred to as "select gate lines SGD".

Both the select gate lines SGD and the word lines WL are independently controlled by the row decoder 120.

Drains of select transistors ST (1) of memory cell strings MS in the same column in the memory cell array 110 are commonly coupled to a bit line BL (BL(0) to BL(m), where m is a natural number equal to or greater than 1). That is, the bit line BL commonly couples memory cell strings MS of different blocks BLK. In addition, sources of memory cells MC (15) are commonly coupled to the source line SL.

That is, each string unit SU includes a plurality of memory cell strings MS that are coupled to different bit lines BL and coupled to the same select gate line SGD. Each block BLK includes a plurality of string units SU that share the same word line WL. The memory cell array 110 includes a plurality of blocks BLK that share the same bit line BL.

<1-1-5> Structure of Memory Cell Array 110

Hereinafter, an example structure of the memory cell array 110 according to the first embodiment will be described. In the drawings to which reference will be made below, an "X direction" refers to a direction in which the bit lines BL extend, a "Y direction" corresponds to a direction in which the word lines WL extend, and a "Z direction" corresponds to a direction vertical to a surface of the semiconductor substrate 20 on which the memory cell array 110 is formed. In the drawings, components such as insulating layers (interlayer insulating films), interconnects, contact plugs, etc. are suitably omitted for ease of reference.

Figure 5:
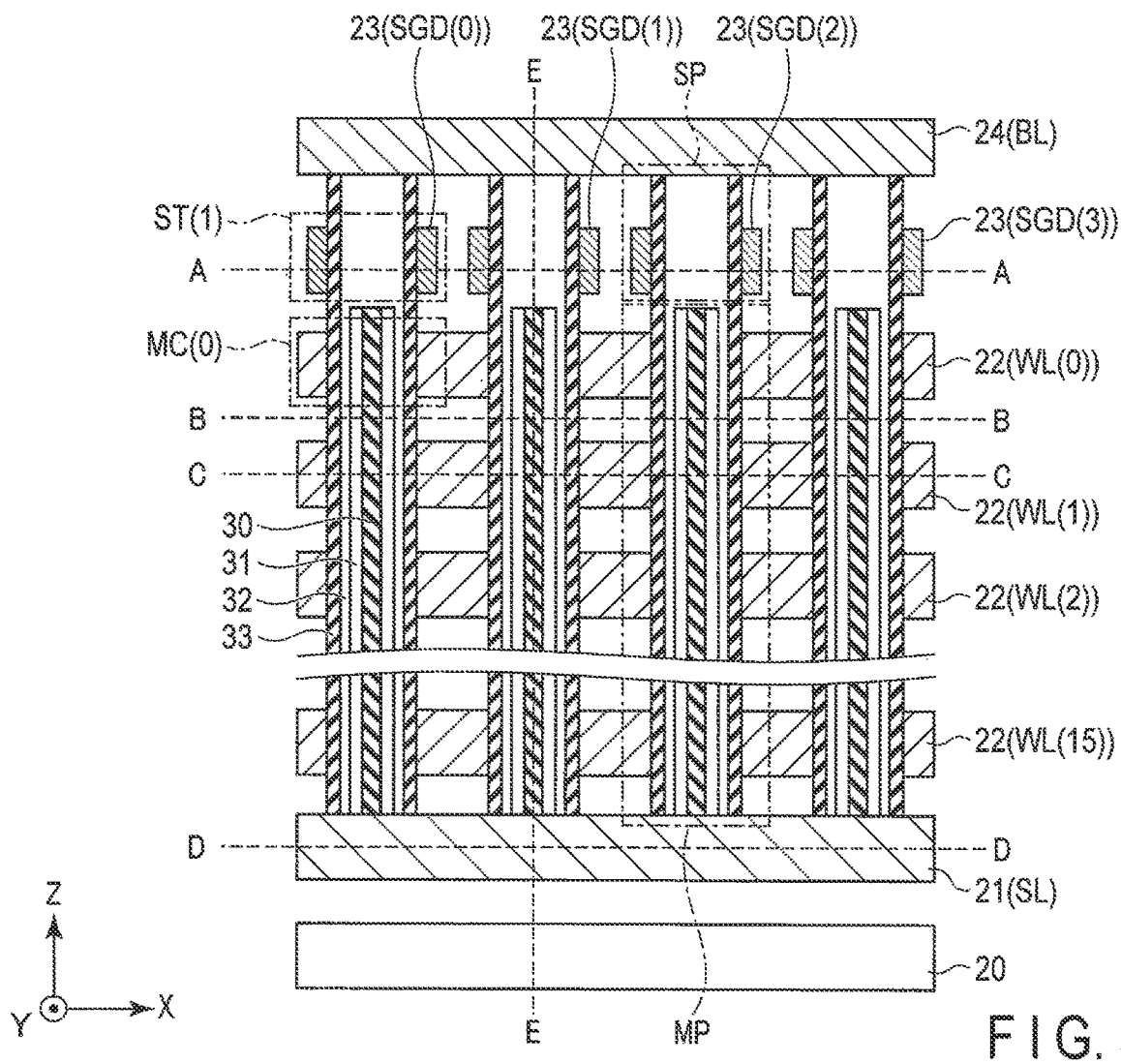
FIG. 5 is a cross-sectional view showing an example of a cross-sectional structure of a memory cell array included in a memory chip 100 according to a first embodiment.

FIG. 5 shows an example of a cross-sectional structure of the memory cell array 110 included in the memory chip 100 according to the first embodiment. As shown in FIG. 5, the memory cell array 110 includes, for example, conductive layers 21 to 24. The conductive layers 21 to 24 are provided above the semiconductor substrate 20.

Specifically, a conductive layer (voltage application electrode) 21 is provided above a semiconductor substrate 20, with an insulating layer interposed therebetween, as viewed in the Z direction. A circuit such as a sense amplifier 140 may be provided, for example, in the insulating layer between the semiconductor substrate 20 and the conductive layer 21. The conductive layer 21 is formed, for example, in a plate shape extending along the XY plane, and is used as a source line SL. The conductive layer 21 contains, for example, silicon (Si).

Insulating layers and conductive layers (voltage application electrode) 22 are alternately stacked above the conductive layer 21 as viewed in the Z direction. The conductive layers 22 are formed, for example, in a plate shape extending along the XY plane. The stacked conductive layers 22 are respectively used as, in the order from the side of the semiconductor substrate 20, word lines WL(15) to WL(0). The conductive layers 22 contain, for example, tungsten (W).

Conductive layers (voltage application electrode) 23, for example, are provided above the topmost conductive layer 22 (WL(0)), with an insulating layer interposed therebetween, as viewed in the Z direction. The conductive layers 23 extend along the Y direction, and are divided by select pillars SP (to be described later) in the X direction. The conductive layers 23 are respectively used as select gate lines SGD(0) to (3). The conductive layers 23 contain, for example, tungsten (W).

A plurality of conductive layers (voltage application electrodes) 24 are formed above the conductive layers 23 as viewed in the Z direction. The conductive layers 24 are formed, for example, in a line shape extending along the X direction, and are used as bit lines BL. The conductive layers 24 contain, for example, copper (Cu).

A memory pillar MP is in a columnar shape that extends along the Z direction, penetrates the conductive layers 22, and reaches, at its bottom portion, the conductive layer 21. A memory pillar MP includes, for example, a core member 30, a variable resistance layer 31, a semiconductor layer 32, and an insulating layer 33. Specifically, a memory hole MH that penetrates the stacked structure of the conductive layers 22 and insulating layers and reaches, at its bottom portion, the conductive layer 21 is provided. The memory hole MH is, for example, in a cylindrical form extending along the Z direction. Through the sequential formation of the insulating layer 33, the semiconductor layer 32, the variable resistance layer 31, and the core member 30 inside (on an inner wall of) the memory hole MH, a memory pillar MP is configured. Specifically, a memory pillar MP includes a cylindrical insulating layer 33 which covers the inner wall of the memory hole MH and extends along the Z direction, a cylindrical semiconductor layer 32 which covers an inner wall of the insulating layer 33 and extends along the Z direction, and a cylindrical or columnar-shaped variable resistance memory region 31 which covers an inner wall of the semiconductor layer 32 and extends along the Z direction.

A columnar-shaped select pillar SP that penetrates the conductive layers 23 is formed on the memory pillar MP. The select pillar SP includes, for example, the semiconductor layer 32 and the insulating layer 33. Specifically, a select pillar SP is configured by providing an SGD hole SH that penetrates the conductive layers 23 and reaches, at its bottom portion, the memory pillar MP, and sequentially forming an insulating layer 33 and a semiconductor layer 32 inside the SGD hole SH.

A layer including an interface between the memory hole MH and the SGD hole SH is included in a layer between the topmost conductive layer 22 and the conductive layers 23.

The core member 30 contains, for example, an insulator such as a silicon nitride (SiN). The core member 30 is, for example, in a columnar shape that extends along the Z direction.

The variable resistance layer 31 covers a side surface (outer periphery) of the core member 30 (is in contact with the core member 30). The variable resistance layer 31 is, for example, formed in a cylindrical shape that extends along the Z direction. A bottom portion of the variable resistance layer 31 is, for example, in contact with the conductive layer 21.

The semiconductor layer 32 in the memory pillar MP covers a side surface (outer periphery) of the variable resistance layer 31 (is in contact with the variable resistance layer 31). The semiconductor layer 32 in the memory pillar MP is, for example, formed in a cylindrical shape extending along the Z direction. The bottom portion of the semiconductor layer 32 is, for example, in contact with the conductive layer 21.

The semiconductor layer 32 in the select pillar SP is, for example, in a columnar shape. The bottom of the semiconductor layer 32 of the select pillar SP is in contact with the semiconductor layer 32 of the memory pillar MP, the variable resistance layer 31, and the core member 30.

The insulating layer 33 covers a side surface of the semiconductor layer 32. The insulating layer 33 includes, for example, a portion that is formed in a cylindrical shape. The insulating layer 33 includes an insulator such as silicon oxide ($SiO_2$).

The conductive layer 22 covers part of a side surface of the insulating layer 33 in the memory pillar MP (namely, is in contact with the insulating layer 33).

The conductive layer 23 covers part of a side surface of the insulating layer 33 in the select pillar SP (namely, is in contact with the insulating layer 33).

Figure 6:
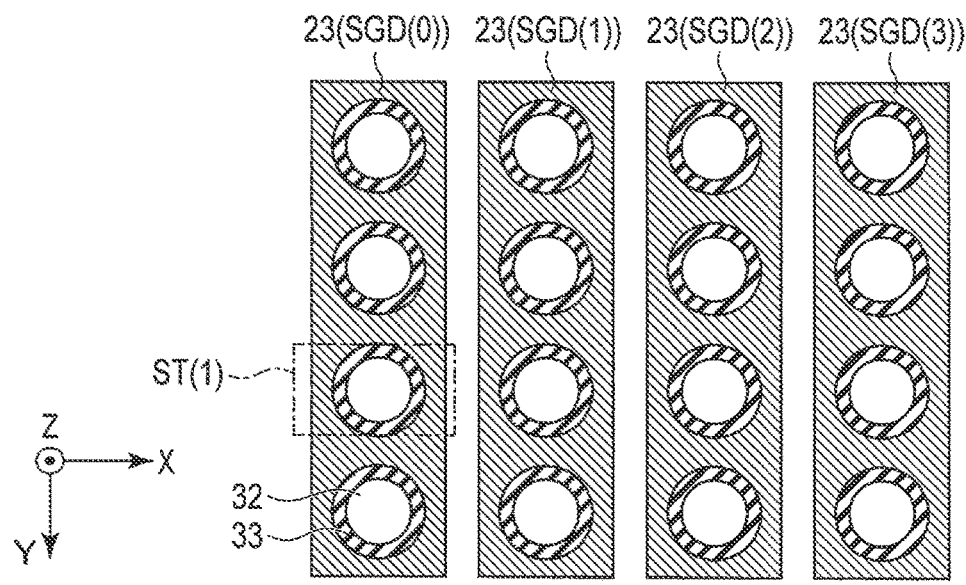
FIG. 6 is a cross-sectional view taken along line A-A of FIG. 5.

Next, a cross-sectional view of the conductive layers 23 with reference to FIG. 6 will be described. FIG. 6 is a cross-sectional view taken along line A-A of FIG. 5.

As shown in FIG. 6, an insulating layer 33 and a semiconductor layer 32 are formed in an SGD hole SH that penetrates the conductive layer 23. The conductive layers 23 function as select gate lines SGD(0) to SGD(3) of the select transistors ST(1), the insulating layer 33 functions as a gate insulating film of the select transistor ST(1), and the semiconductor layer 32 functions as a semiconductor layer of the select transistor ST(1). Through the use of the select transistor ST(1), it is possible to select memory pillars MP for each word line. When the select transistor ST(1) is switched on, an inversion layer is formed in the semiconductor layer 32 that is in contact with the variable resistance layer 31 of the memory pillar MP, and the memory pillar MP can be selected by letting a current flow through the inversion layer.

Figure 7:
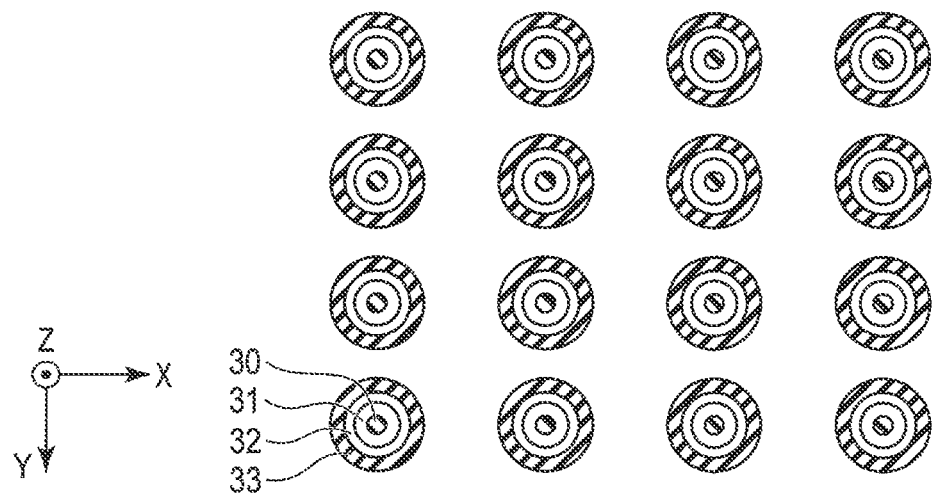
FIG. 7 is a cross-sectional view taken along line B-B of FIG. 5.

Next, a cross-sectional view of portions between the memory cells MC in the Z direction will be described with reference to FIG. 7. FIG. 7 is a cross-sectional view taken along line B-B of FIG. 5. The core member 30, the variable resistance layer 31, the semiconductor layer 32, and the insulating layer 33 shown in FIG. 7 correspond to portions between the memory cells MC in the Z direction, and a current flows through the semiconductor layer 32.

Figure 8:
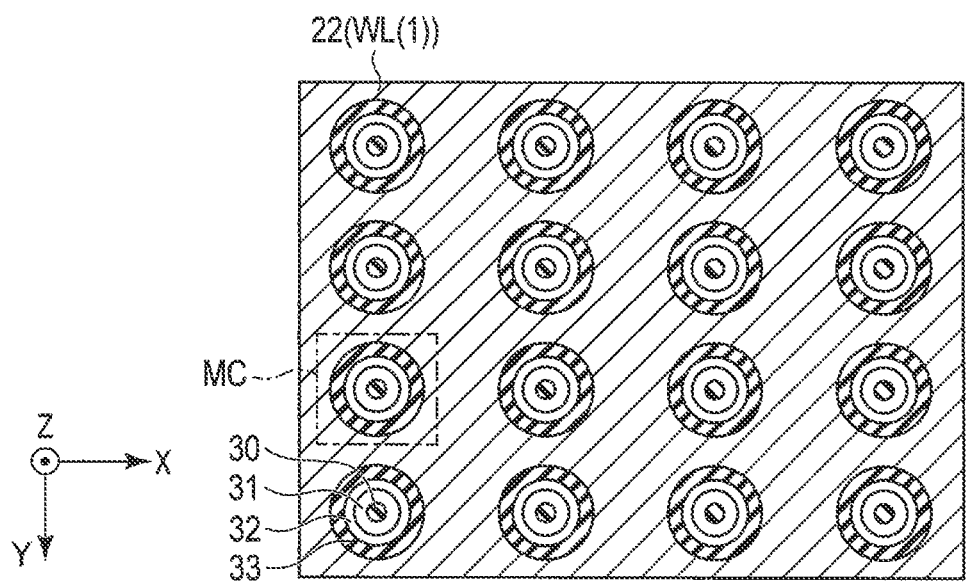
FIG. 8 is a cross-sectional view taken along line C-C of FIG. 5.
Figure 9:
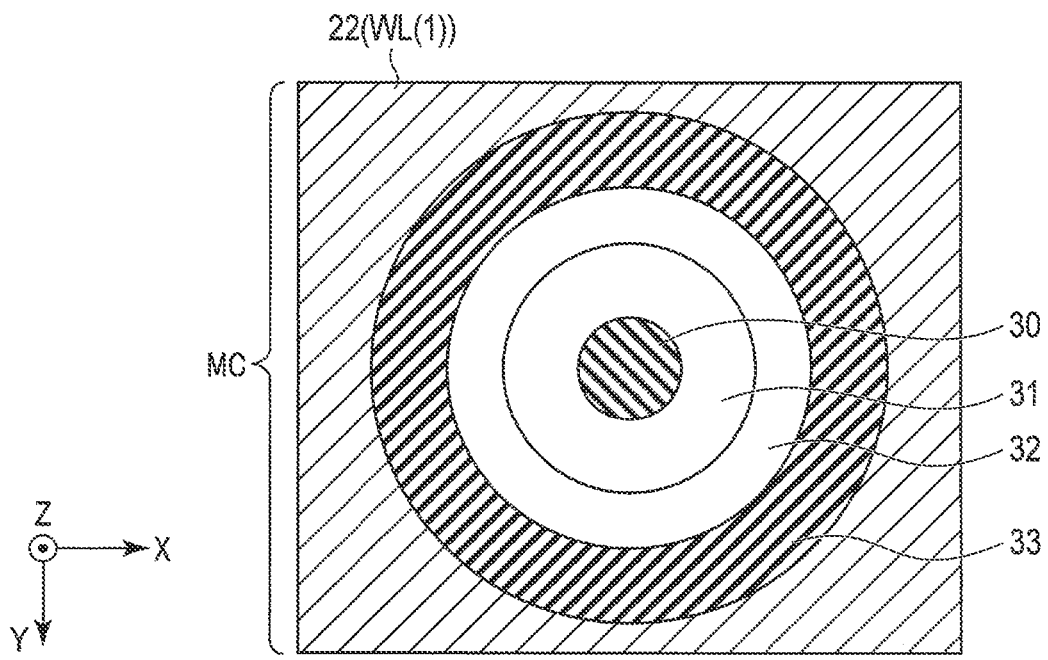
FIG. 9 is a cross-sectional view in which a single memory cell is extracted.

Next, a cross-sectional view of the conductive layers 22 will be described with reference to FIGS. 8 and 9. FIG. 8 is a cross-sectional view taken along line C-C of FIG. 5. FIG. 9 is a cross-sectional view in which a single memory cell MC is extracted.

As shown in FIG. 9, a memory cell MC is provided at an intersection between a plate-shaped word line WL and a memory pillar MP. Specifically, an insulating layer 33, a semiconductor layer 32, a variable resistance layer 31, and a core member 30 are provided in a memory hole MH that penetrates the conductive layers 22, as shown in FIG. 9. The conductive layer 22 functions as a word line WL of a selector SW of a memory cell MC, the insulating layer 33 functions as a gate insulating film of the selector SW of the memory cell MC, and the semiconductor layer 32 functions as a semiconductor layer of the selector SW of the memory cell MC. The variable resistance layer 31 functions as a memory element MR of the memory cell MC.

Figure 10:
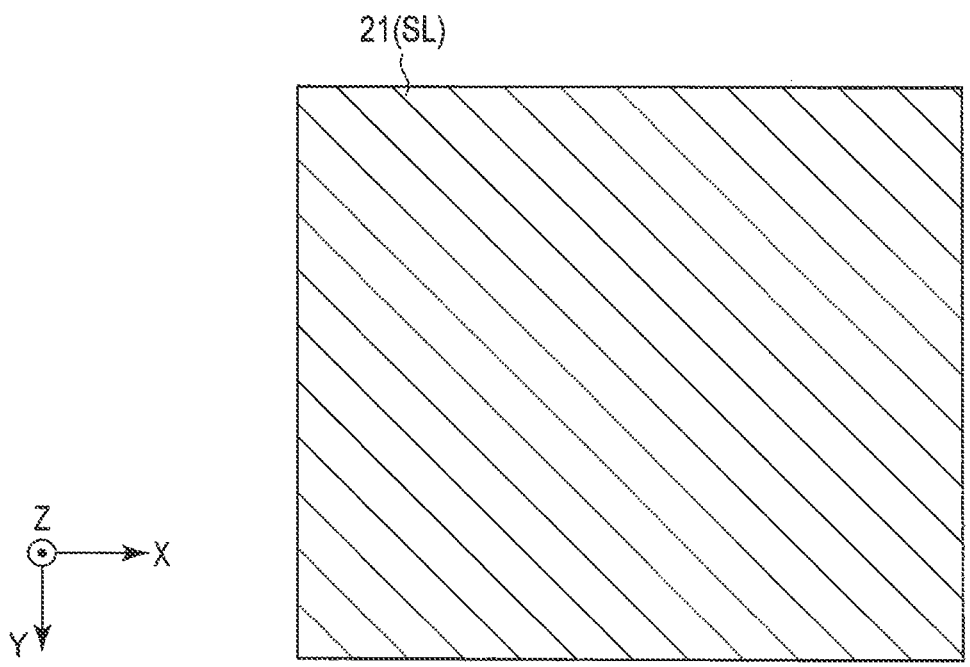
FIG. 10 is a cross-sectional view taken along line D-D of FIG. 5.

Next, a cross-sectional view of the conductive layer 21 will be described with reference to FIG. 10. FIG. 10 is a cross-sectional view taken along line D-D of FIG. 5.

The conductive layer 21 is in a plate shape, and is set to a constant low voltage to let a current flow therethrough from the bit line BL. As shown in FIG. 10, the conductive layer 21 (source line) is in a plate shape, similarly to the conductive layer 22 (word line).

Figure 11:
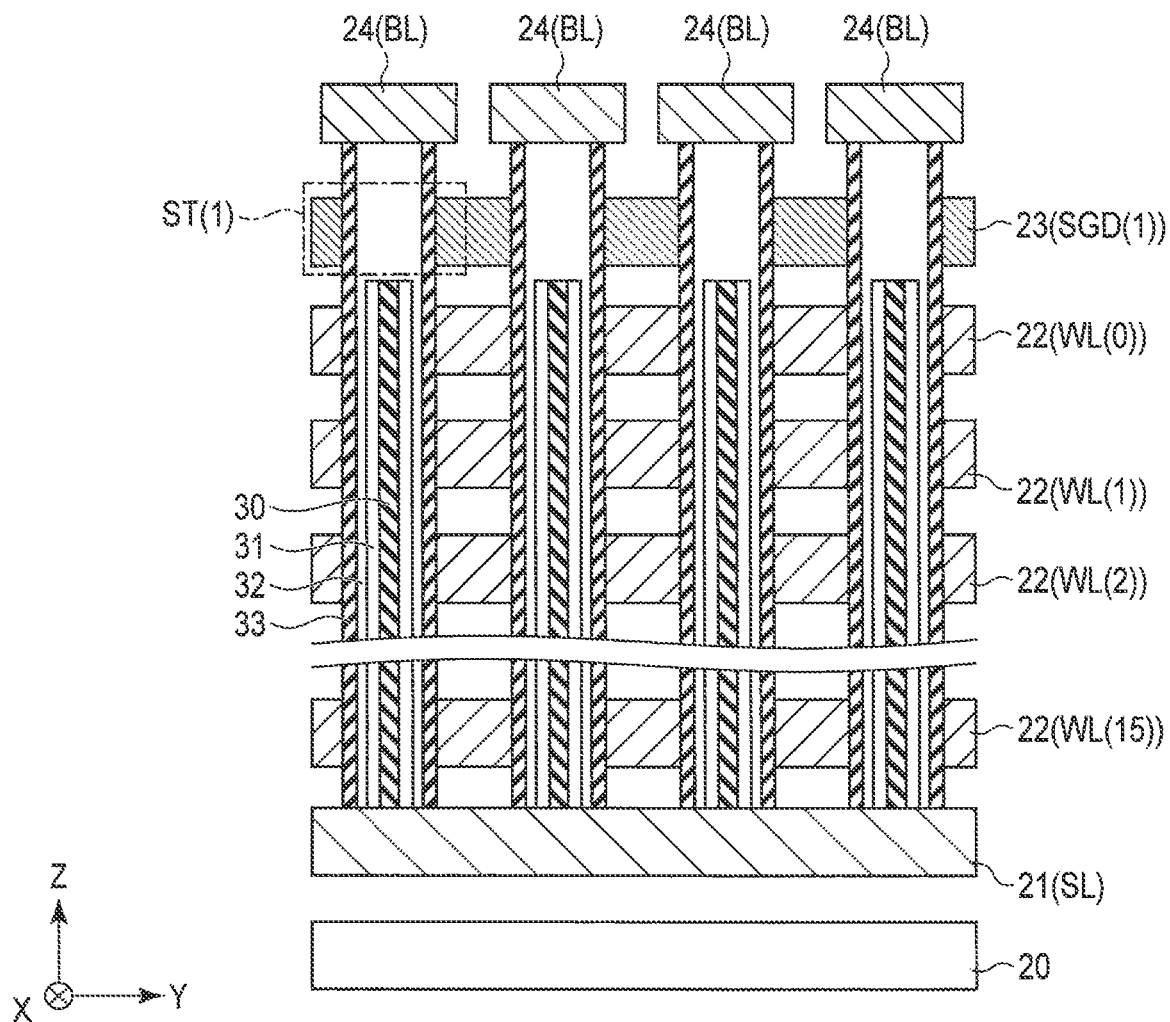
FIG. 11 shows a cross-sectional view along a direction orthogonal to the cross section shown in FIG. 5.

Next, an example of a cross-sectional structure of the memory cell array 110 will be described with reference to FIG. 11. FIG. 11 is a cross-sectional view taken along line E-E of FIG. 5. FIG. 11 shows a cross-sectional view along a direction orthogonal to the cross section shown in FIG. 5. Referring to FIGS. 5 and 11 in combination, it can be seen that the memory pillar MP is in a concentric shape about the core member 30.

<1-2> Operation

<1-2-1> Overview

Next, an overview of an operation of the memory chip 100 according to the present embodiment will be described.

Read and write operations in the memory chip 100 according to the present embodiment are performed by letting a current flow between the bit line BL and the source line SL.

Figure 12:
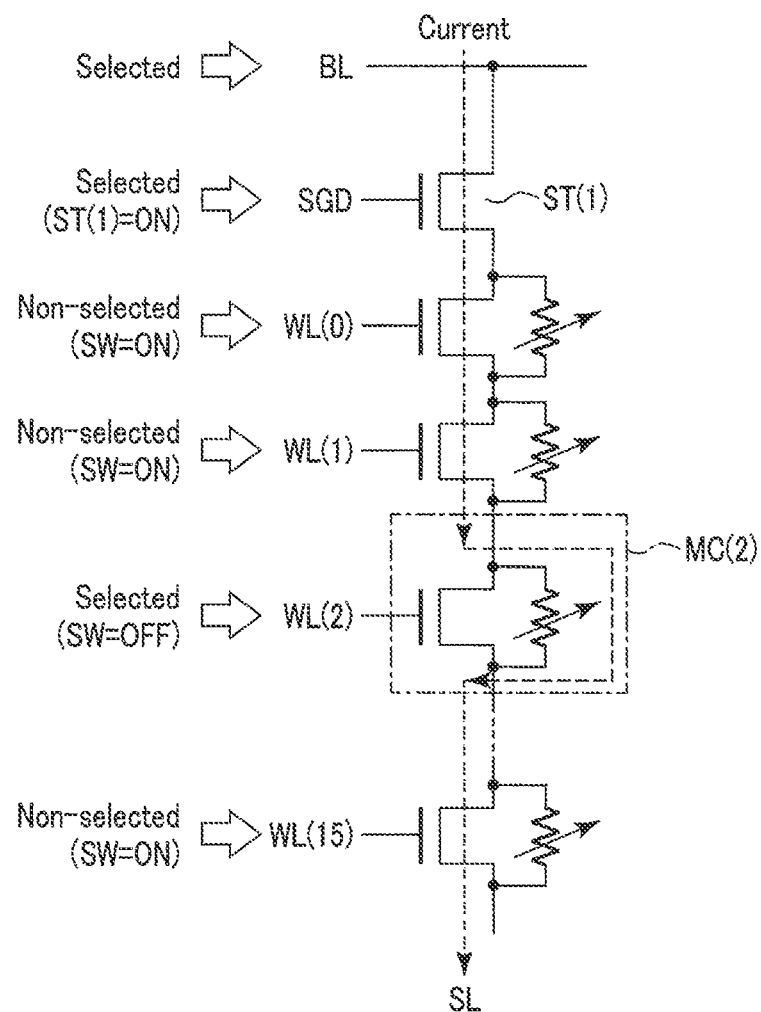
FIG. 12 is a circuit diagram in which a single memory cell string is extracted.
Figure 13:
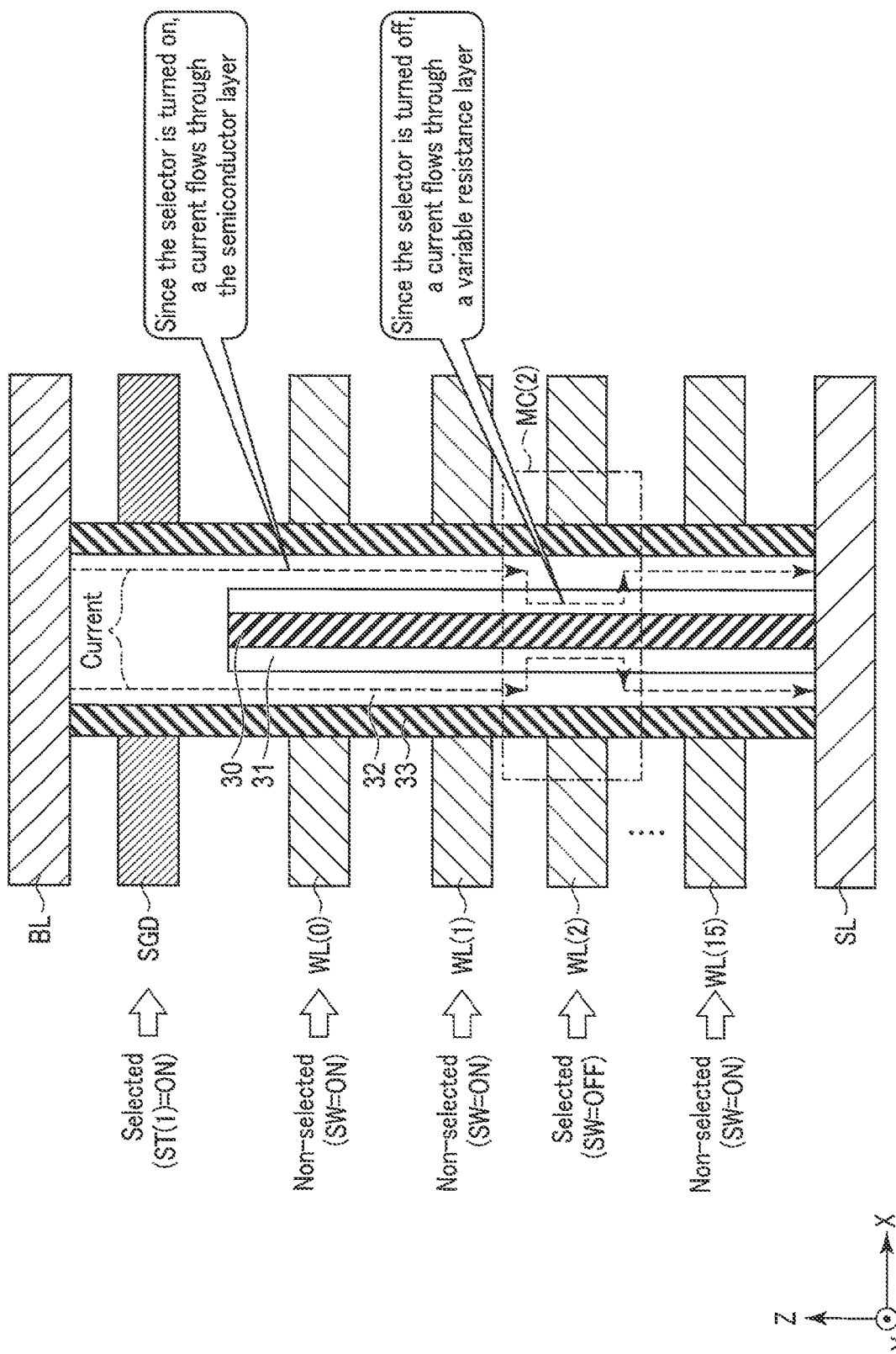
FIG. 13 is a cross-sectional view in which a memory pillar corresponding to a single memory cell string is extracted.

A brief description will be given of a method of selecting a memory cell MC with reference to FIGS. 12 and 13. FIG. 12 is a circuit diagram in which a single memory cell string MS is extracted. FIG. 13 is a cross-sectional view in which a memory pillar MP corresponding to a single memory cell string MS is extracted.

As shown in FIGS. 12 and 13, a predetermined voltage (positive voltage) is applied to a select gate line SGD of a select transistor ST(1) that is in contact with a memory pillar MP to which a memory cell MC (e.g., MC(2)) to be selected belongs. Thereby, an inversion layer is formed in a semiconductor layer of the select transistor ST(1), allowing a current to flow therethrough (the select transistor ST(1) is switched on). This causes the bit line BL, the select transistor ST(1), and the semiconductor layer of the memory pillar MP that is in contact with the select transistor ST(1) to be brought into conduction. Also, a word line WL(2) corresponding to the select memory cell MC(2) is brought to 0 [V], and word lines WL(0), (1), and (3) to (15) corresponding to the non-selected memory cells MC are applied with a predetermined voltage (positive voltage). Thereby, a current path between the bit line BL and the source line SL flows through a variable resistance layer MR in the memory cell MC(2) to be selected, and flows through semiconductor layers of selectors SW in the non-selected memory cells MC(0), (1) and (3) to (15). Since a core member 30, which is an insulating layer, is provided at a central portion of the memory pillar MP, as shown in FIG. 13, a current flows through the variable resistance layer 31 that surrounds the core member 30 in the selected memory cell MC. Examples of the material of the variable resistance layer 31 include an alloy-based phase-change element ($Ge_2Sb_2Te_5$).

With the above-described configuration, it is possible to select a variable resistance layer both in a read operation and a write operation. When the present scheme is compared with a three-dimensional NAND-type flash memory, it has the advantages that it can operate at a lower voltage and at a higher speed, that there are less restrictions on the number of times of rewriting, and that the writing time is shorter.

In addition, unlike the vertical chain-cell-type PCM in the publicly-known non-patent document ('Scalable 3-D vertical chain-cell-type phase-change memory with $4F^2$ poly-Si diodes', M. Kinoshita, et. al., HITACHI Sympo. on VLSI Tech. 2012, pp. 35-36), a diode need not be provided as a select element below a memory pillar MP. This is advantageous in terms of the reduced time for development, simplified processing, and the reduced manufacturing cost.

The present embodiment relates to a variable resistance memory in which an erase operation does not exist, unlike a three-dimensional NAND-type flash memory.

Also, a write operation or a read operation is performed by letting a current flow between a bit line BL and a source line SL by turning on the select transistor ST(1). This eliminates the necessity to select all the memory cell strings MS, allowing selection to be performed for any bit line (column) that is coupled to a single select gate line.

To prevent a write operation or a read operation from being performed in a certain memory cell string MS, the voltage of the source line should be set to be equal to the voltage of the bit line; in this case, a write operation or a read operation will not be performed.

In addition, unlike a three-dimensional NAND-type flash memory, an erase operation need not be performed in units of blocks BLK, and a write operation can be set/reset in units of select transistors ST(1).

A word line serves the role of selecting a memory cell MC in the stacking direction (Z direction). Accordingly, a word line may be shared among gate electrodes of a plurality of memory cells MC in the same XY plane. Similarly, a source line may be shared among a plurality of memory cell string MS. In particular, a source line may be shared among a plurality of memory cell strings MS that are adjacent to each other in the bit line direction.

Let us assume, for example, that the word line WL and the source line SL are in a plate shape extending along both the bit line direction and the word line direction. Selection of the memory cell MC need to be performed by switching the select transistor ST(1) to the on state and then letting a current flow from the bit line BL to the source line SL. Accordingly, even if the word line WL and the source line SL are selected in a plate shape, only the selected select transistor ST(1) and the memory cell MC that is in contact with the selected word line WL directly below the selected bit line BL are selected.

As described above, selection of the memory cell MC is performed by letting a current flow via the bit line BL. Accordingly, the sequencer 170 is configured to output a control signal in such a manner, for example, that a read operation and a write operation are simultaneously performed for each bit line.

The sequencer 170 is capable of outputting a control signal in such a manner that a reset write operation and a set write operation are performed for each bit line.

<1-2-2> Waveform

As described above, in the memory chip 100 according to the present embodiment, a voltage that causes the selector SW of the selected memory cell MC to be turned off and a voltage causes the selector SW of the non-selected memory cell MC to be turned on are applied to the word lines WL, respectively. Subsequently, in the memory chip 100, a voltage that causes a select transistor corresponding to the selected memory cell to be turned on is applied to the select gate line SGD, thus bringing the bit line BL and the memory pillar MP to which the select memory cell belongs into conduction. In this manner, a current flows through a semiconductor layer of a selector SW in a non-selected memory cell, and flows through a memory element MR in a selected memory cell.

Figure 14:
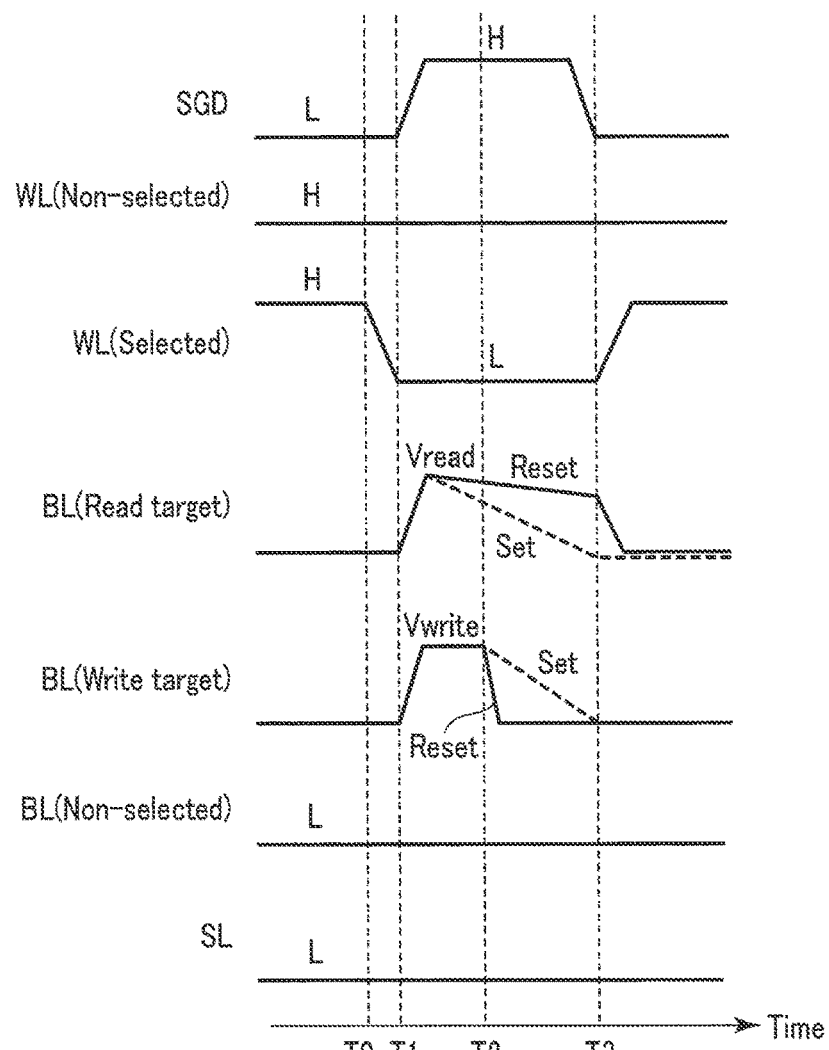
FIG. 14 shows a timing chart of an operation waveform.

A description will be given of an operation waveform of the memory chip 100 according to the present embodiment, with reference to FIG. 14. FIG. 14 shows a timing chart of an operation waveform.

First, a case of a read operation will be described. At time T0, the sequencer 170 maintains the voltage of the non-selected bit line BL (BL (Non-selected)) and the source line SL at an L level. The sequencer 170 maintains the voltage of the non-selected word line WL (WL(Non-selected)) at H level (L<H). The sequencer 170 causes the voltage of the selected word line WL (WL(Selected) to fall from an H level to L level. At time T1 and thereafter, the sequencer 170 maintains the voltage of the selected word line WL at the L level.

At time T1, the sequencer 170 increases the voltage of the select gate line SGD of a select transistor corresponding to the selected memory cell MC from the L level to the H level. Since the voltage of the non-selected word line WL is maintained at the H level, the selector SW in the non-selected memory cell MC is maintained in the on state.

The sequencer 170 applies the read voltage Vread to the bit line BL (BL (Read target)), and then brings the bit line BL to a floating state. Thereby, the voltage of the bit line BL gradually falls (the voltage is substantially maintained until time T3) when the selected memory cell MC is in the high-resistance (reset) state, and the voltage of the bit line BL rapidly falls when the selected memory cell MC is in the low-resistance (set) state. By causing the sense amplifier 140 to sense the H/L level of the voltage of the bit line BL after a predetermined period of time has passed since a voltage is applied to the bit line BL, a read operation is performed.

Next, a case of a write operation will be described. At time T0, an operation similar to a read operation is performed.

In a write operation, the sequencer 170 applies a write pulse (voltage) Vwrite to the bit line BL (BL(Write target)) at time T1, and causes the voltage to rapidly fall at time T2, thereby performing a write operation in the high-resistance reset state. When the sequencer 170 applies a write pulse (voltage) Vwrite to the bit line BL at time T1 and causes the voltage to gradually fall at time T2, a write operation is performed in the low-resistance set state. At this time, it is important to keep the voltage of the non-selected bit line BL equal to the voltage of the source line SL (e.g., at the L level). A memory cell MC is selected by application of a voltage to a bit line BL. If the voltage of a non-selected bit line BL is increased, the selection would be erroneous, resulting in erroneous writing. A voltage should be selectively applied only to a bit line BL to be read or written.

<1-2-3> Memory Cell Selection Method

Next, a memory cell selection method that is applicable to the present embodiment will be described.

Figure 15:
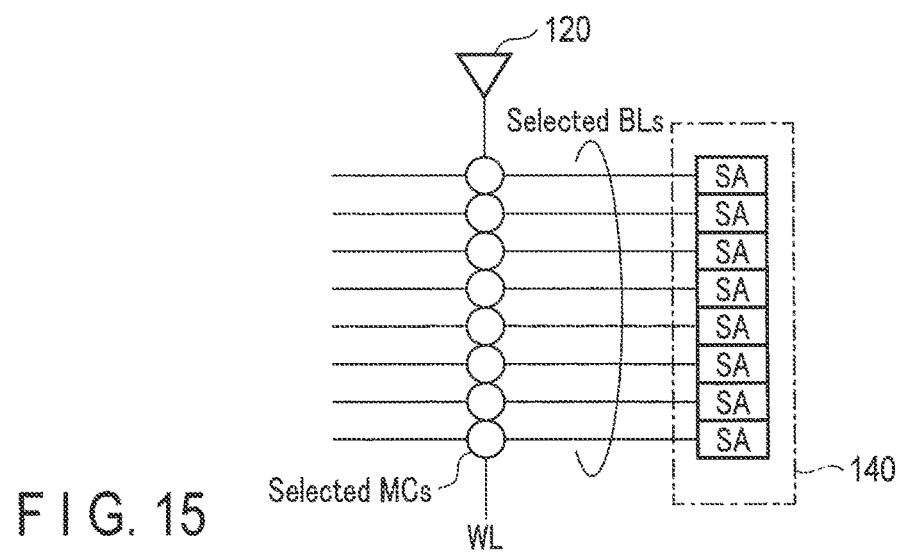
FIG. 15 shows a relationship among selected memory cells, a selected word line, bit lines, and sense amplifiers according to a first example of a memory cell selection method.

FIG. 15 shows a relationship among selected memory cells MC, a selected word line WL, bit lines BL, and a sense amplifier 140 in a first example of a memory cell selection method according to the present embodiment. Of a plurality of word lines WL, only the selected word line WL is shown for the sake of simplicity.

As shown in FIG. 15, by selecting one of word lines WL, all the corresponding memory cells MC are selected, and the voltages of the bit lines BL are sensed as signals by the sense amplifier modules SA that are provided for the respective bit lines BL. The sense amplifier modules SA are included in the sense amplifier 140.

Figure 16:
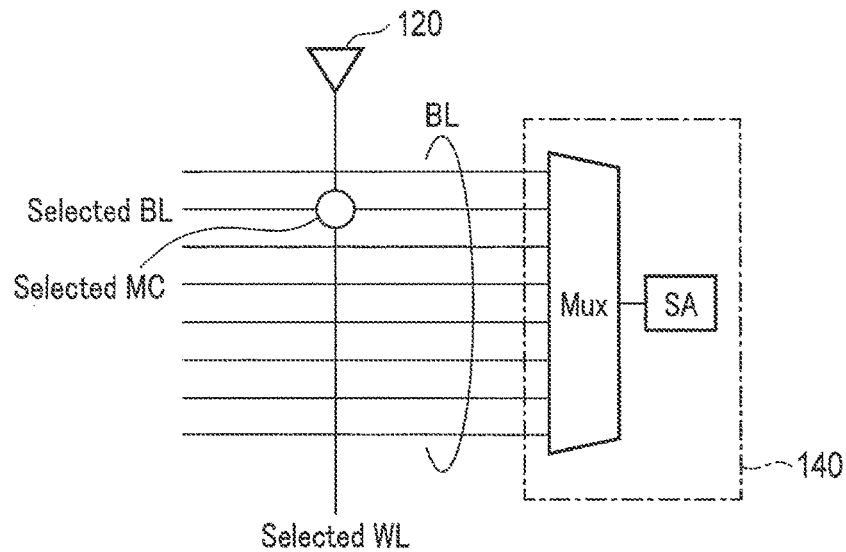
FIG. 16 shows a relationship among a selected memory cell, a selected word line, bit lines, and a sense amplifier according to a comparative example of a memory cell selection method.

FIG. 16 shows a relationship among a selected memory cell MC, a selected word line WL, bit lines BL, and a sense amplifier 140 according to a comparative example of the memory cell selection method. Of a plurality of word lines WL, only the selected word line WL is shown for the sake of simplicity.

The sense amplifier 140 shown in FIG. 16 includes an MUX coupled to a plurality of bit lines BL, and a sense amplifier module SA coupled to the MUX.

As shown in FIG. 16, by selecting a single word line WL and a single bit line BL, a memory cell MC at the intersection is selected, and the MUX receives the voltages of the bit line BL as signal, and transfers the signal to the sense amplifier module SA. Such a configuration is referred to as a "cross-point" type.

Figure 17:
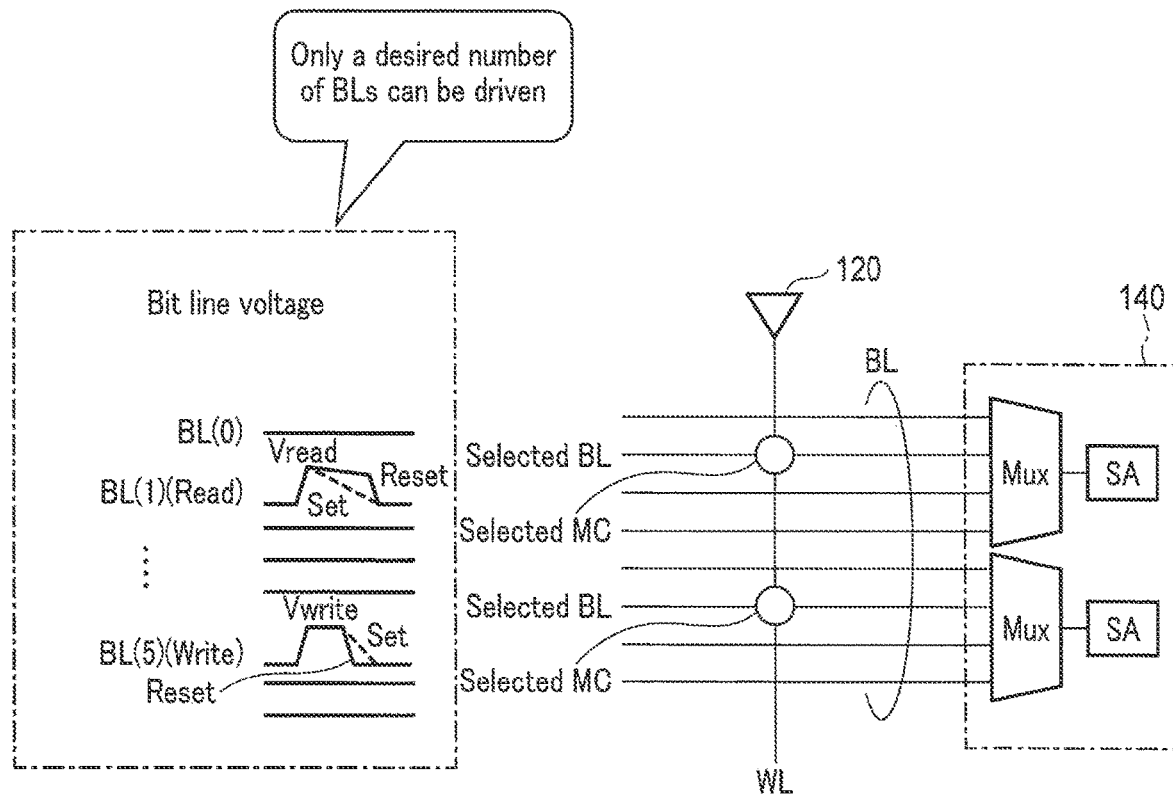
FIG. 17 shows a relationship among selected memory cells, a selected word line, bit lines, and sense amplifiers according to a second example of a memory cell selection method.

FIG. 17 shows a relationship among selected memory cells MC, a selected word line WL, bit lines BL, and a sense amplifier 140 in a third example of a memory cell selection method according to the present embodiment. Of a plurality of word lines WL, only the selected word line WL is shown for the sake of simplicity.

The sense amplifier 140 shown in FIG. 17 includes a plurality of sets of MUX and sense amplifier module SA, with each MUX coupled to a plurality of bit lines BL, and each sense amplifier SA coupled to the corresponding MUX.

As shown in FIG. 17, by selecting a single word line WL and causing a given number of selected bit lines BL to operate, memory cells MC are selected.

In a variable resistance memory, when a voltage and a current are applied to a bit line BL, a memory cell that belongs to the bit line BL is selected. Accordingly, only a bit line BL corresponding to a memory cell MC that is to be a target of a read operation or a write operation is driven.

It is also possible to simultaneously perform a read operation and a write operation for each bit line BL, and to simultaneously perform a reset write operation and a set write operation for each bit line BL.

This is a difference from the cross point type described with reference to FIG. 16.

It is possible, for example, to simultaneously perform a read operation and a write operation on a single bit line BL, in units of four bit lines BL, as shown in FIG. 17. In this case, the sense amplifier module SA can be shared among the four bit lines BL, and the selected bit line BL can be selected by the MUX.

Specifically, in the configuration shown in FIG. 17, a read operation is performed on a memory cell MC that belongs to a bit line BL(1), and a write operation can be simultaneously performed on a memory cell MC that belongs to a bit line BL(5).

<1-3> Advantageous Effects

According to the above-described embodiment, the memory chip 100 is configured in such a manner that a memory element capable of setting a data value of one or more bits according to a resistance value is disposed at the center of a memory pillar MP, with the periphery of the memory element covered with a semiconductor layer, and the periphery thereof further covered with an insulating layer and a word line, and the memory element is, at its upper end, coupled to a bit line via a select transistor, and is, at its lower end, coupled to a source line without intervention of a select transistor.

Bit-cost scalable (BiCS™) flash memories have been proposed and commercialized as non-volatile memories (three-dimensional NAND-type flash memories) in which memory cells are perpendicularly stacked on a semiconductor substrate for high integration. In such a three-dimensional NAND-type flash memory, NAND-type flash memories with a planar structure (two-dimensional NAND-type flash memories) are three-dimensionally arranged. Similarly to a two-dimensional NAND-type flash memory, a three-dimensional NAND-type flash memory has problems such as the constraints on the number of times of rewriting and the length of time required for programming.

Memory cells of a three-dimensional NAND-type flash memory contain silicon and an oxide-nitride-oxide (ONO) film. In a three-dimensional NAND-type flash memory, when a voltage is applied to a word line WL, electrons are trapped in SiN, corresponding to "N" of the ONO film of the memory cell via the silicon of the memory cell. Thereby, the threshold value of the memory cell is shifted, and information is stored in the memory cell.

On the other hand, as an example of a three-dimensional phase-change memory (PCM), a vertical chain-cell-type PCM has been proposed (see the above-described non-patent document). In this example, a channel of a transistor is formed so as to cover a pillar of a PCM layer. Selection of a memory cell is performed by applying a voltage to a selected bit line, and applying voltages Vreset, Vset, and Vread to a selected word line.

When a gate of the selected memory cell is turned off and a gate of a non-selected memory cell is turned on, a current flows through a PCM layer in the selected memory cell, and a current flows through silicon in the non-selected memory cell.

Problems with this example are that, since a diode for selection (select transistor) is provided below a pillar, it is necessary to develop such a diode, and to perform separate processes for the diode and layers above the diode. In addition, a problem arises that only a memory cell at the intersection of a word line and a bit line can be selected. The first publicly-known example of an equivalent circuit that configures a chain-type memory cell string in which a plurality of memory cells each including a variable resistance element and a select transistor coupled in parallel are coupled in series, and a block select transistor is coupled to one end of the series of memory cells is disclosed in Patent Document (U.S. Pat. No. 5,894,447) filed in 1997, However, three-dimensional examples were not proposed.

Moreover, an example of a chain PCM has been proposed, as disclosed in Patent Document 2 (U.S. Pat. No. 9,025,369); however, there is a problem that a three-dimensional structure for high integration is not proposed.

Furthermore, a patent has been proposed in which right and left current paths are separately provided in the above-described vertical chain-cell-type PCM structure, with a block select transistor coupled to its upper portion, to double the integration, as disclosed in Patent Document 3 (U.S. Pat. No. 9,966,136); however, since a diode needs to be provided as a select element below a pillar, there are still problems of the necessity to develop such a diode and the necessity to perform separate processes for the diode and layers above the diode.

As described above, the memory cell array 110 according to the present embodiment is configured in such a manner that an ONO film portion of a memory pillar in a three-dimensional NAND-type flash memory is replaced with an oxide film, and a variable resistance layer is provided inside the oxide film. In addition, unlike the example disclosed in the non-patent document, a diode for selection (select transistor between a source line and a memory cell) is not provided.

It is thereby possible to solve the above-described problems and to achieve reduction in the time required for development and facilitation of the processing. When a voltage is applied to a bit line with a select transistor and a word line selected, a given number of memory cells at the intersection of the select transistor and the bit line are automatically selected. Accordingly, a given operation can be performed on memory cells of a select transistor of a given bit line simultaneously. In the above-described non-patent document, the cross-point type ReRAM, etc., there is a problem of a voltage drop in the X and Y directions. However, since a source line is shared among memory cells of a plurality of word lines and bit lines, a voltage drop in the source line caused by the current can be greatly reduced.

As described above, according to the present embodiment, it is possible to obtain a three-dimensional variable resistance memory at the lowest possible cost with the highest possible integration, by omitting, in particular, a diode that is provided as a select element.

<1-4> First Modification
<1-4-1> Outline

Next, a first modification of the first embodiment will be described. In the above-described embodiment, a conductive layer is disposed as a source line in parallel with a semiconductor substrate. In the first modification according to the first embodiment, a semiconductor layer (P-well region) is provided as a conductive layer corresponding to a source line, and a select transistor ST(2) is provided between the source line and memory cells.

<1-4-2> Circuit Configuration of Memory Cell Array 110

A circuit configuration (equivalent circuit) of a memory cell array 110 according to a first modification of the first embodiment will be described with reference to FIG. 18.

As shown in FIG. 18, each of a plurality of memory cell strings MS further includes, for example, a select transistor ST(2), in addition to 16 memory cells MC (MC(0) to MC(15)) and a select transistor ST(1), compared with the circuit shown in FIG. 2.

In the example of FIG. 18, a memory element MR coupled in parallel with the select transistor ST(1) may be provided. Alternatively, a memory element MR coupled in parallel with the select transistor ST(2) may be omitted.

The memory cells MC(0) to MC(15) included in each memory cell string MS are coupled in series between the select transistor ST(1) and the select transistor ST(2).

Gates of select transistors ST(2) in each block BLK are coupled in common to a select gate line SGS. The select gate line SGS may be provided for each string unit SU.

Hereinafter, when select gate lines SGD (SGD(0), SGD (1), . . . ) are not distinguished from one another, they will be referred to as "select gate lines SGD".

Both the select gate lines SGD and SGS and the word lines WL are independently controlled by the row decoder 120.

In the memory cell string MS, Drain of select transistor ST(2) is coupled to a source of a memory cell MC(15). Sources of the select transistors ST(2) in the memory cell array 110 are commonly coupled to the source line SL.

By bringing the select gate line SGS of the select transistor ST(2) to the H level, an inversion layer is formed in the semiconductor layer of the select transistor ST(2) and the semiconductor substrate, allowing a current to flow through the source line SL.

<1-4-3> Structure of Memory Cell Array 110

Hereinafter, an example structure of the memory cell array 110 according to the first modification of the first embodiment will be described. In the first modification of the first embodiment, a select transistor ST(2) is provided on a semiconductor substrate. When the select transistor ST(2) is turned on, an inversion layer is formed in a P-well region of the semiconductor substrate, and a current flows through a source line via an N-type diffusion layer provided in the semiconductor substrate.

Figure 19:
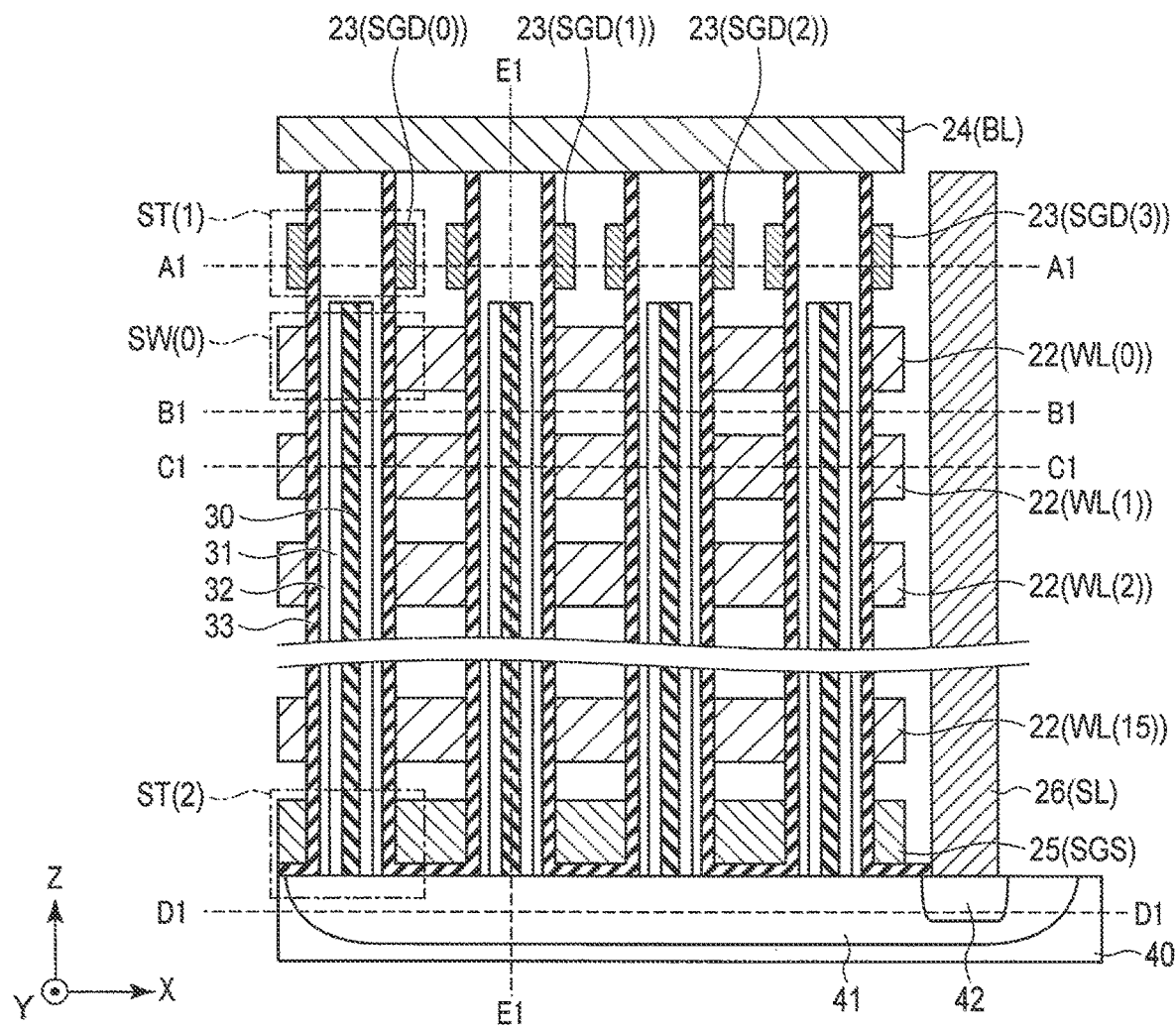
FIG. 19 is a cross-sectional view showing an example of a cross-sectional structure of a memory cell array included in a memory chip according to a first modification of the first embodiment.

FIG. 19 shows an example of a cross-sectional structure of the memory cell array 110 included in the memory chip 100 according to the first modification of the first embodiment. Specifically, a P-well region 41 is provided in a surface region of the semiconductor substrate 40, and an N-type diffusion layer ($N^+$ diffusion layer) 42 is provided in the P-well region 41, as shown in FIG. 19. The semiconductor substrate 40 is, for example, formed in a plate shape extending along the XY plane, and contains silicon (Si).

On the P-well region 41, a conductive layer (voltage application electrode) 25 is provided, with an insulating layer 33 interposed therebetween. The conductive layer 25 is, for example, formed in a plate shape extending along the XY plane, and functions as a select gate line SGS. The conductive layer 25 contains, for example, tungsten (W).

On the N-type diffusion layer 42, a conductive layer 26 is provided. The conductive layer 26 is, for example, formed in a plate shape extending along the ZY plane, and functions as a source line SL. The conductive layer 26 contains, for example, tungsten (W).

The select transistor ST(2) includes a conductive layer 25, a semiconductor layer 32, and a P-well region 41. When the conductive layer 25 is brought to an H level, an inversion layer is formed in the semiconductor layer 32 and the P-well region 41, allowing a current to flow therethrough.

Insulating layers and conductive layers 22 are alternately stacked above the conductive layer 25. The conductive layers 22 are formed, for example, in a plate shape extending along the XY plane. The conductive layers 22 are respectively used as, in the order from the side of the semiconductor substrate 40, word lines WL(15) to WL(0). The conductive layers 22 contain, for example, tungsten (W).

Conductive layers 23, for example, are provided above the topmost conductive layer 22 (WL(0)), with an insulating layer interposed therebetween. The conductive layers 23 extend along the Y direction, and are divided by select pillars SP (to be described later) in the X direction. The conductive layers 23 are respectively used as select gate lines SGD(0) to SGD(3). The conductive layers 23 contain, for example, tungsten (W).

Conductive layers 24 are provided above the conductive layers 23. The conductive layers 24 are formed, for example, in a line shape extending along the X direction, and are used as bit lines BL. The conductive layers 24 contain, for example, copper (Cu).

Figure 20:
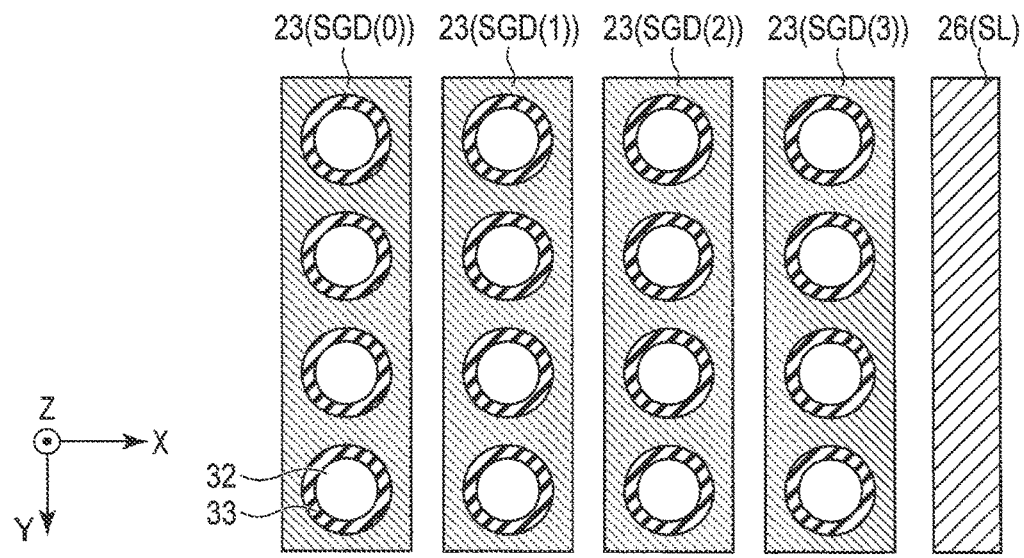
FIG. 20 is a cross-sectional view taken along line A1-A1 of FIG. 19.

Next, a cross-sectional view of the conductive layers 23 will be described with reference to FIG. 20. FIG. 20 is a cross-sectional view taken along line A1-A1 of FIG. 19. As shown in FIG. 20, a current that is collected into the diffusion layer in the P-well region 41 is collected into a semi-plate-shaped source line SL, flows up to the topmost layer, and then flows to a source line driver (not illustrated).

Figure 21:
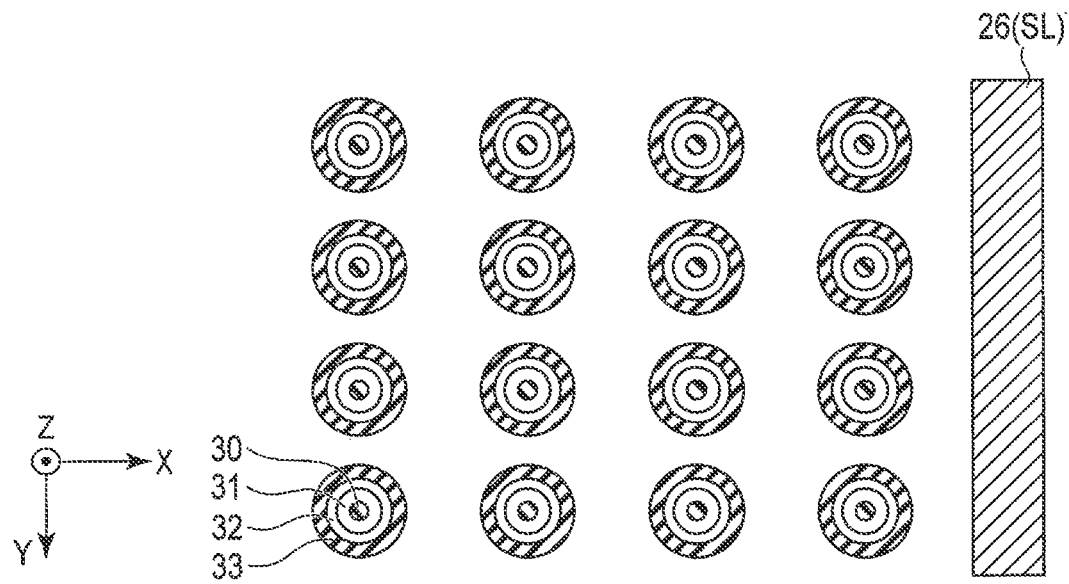
FIG. 21 is a cross-sectional view taken along line B1-B1 of FIG. 19.

Next, a cross-sectional view of portions between the memory cells MC in the Z direction will be described with reference to FIG. 21. FIG. 21 is a cross-sectional view taken along line B1-B1 of FIG. 19. FIG. 21 shows memory pillars of portions between memory cells MC, which configuration is different from that of the first embodiment in that a plate-shaped source line SL that is orthogonal to the semiconductor substrate 40 is provided. The source line SL shown in FIG. 21 is a midway path that allows the current collected by the diffusion layer in the P-well region 41 to flow up to upper layers.

Figure 22:
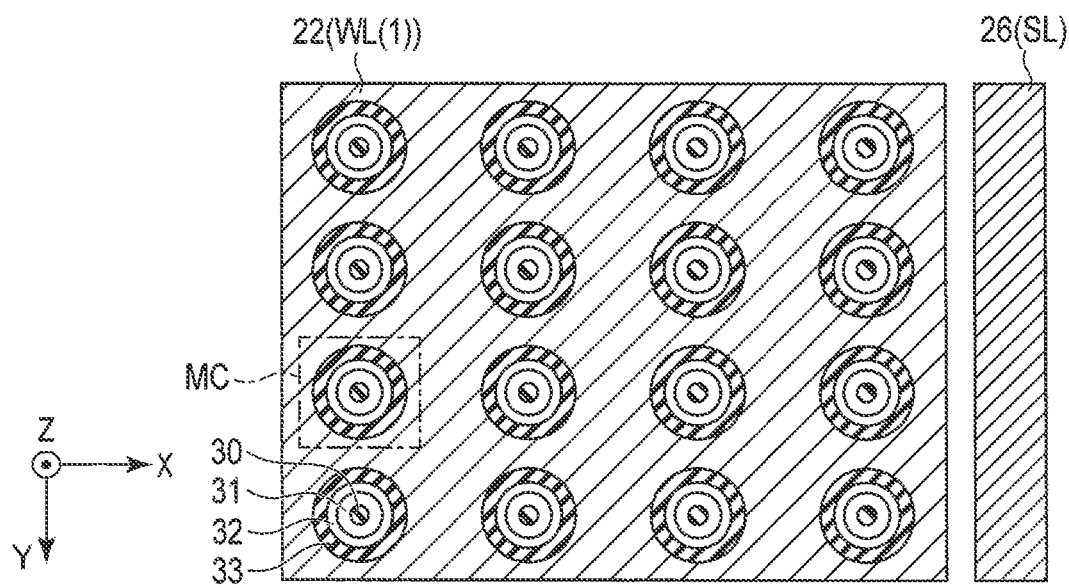
FIG. 22 is a cross-sectional view taken along line C1-C1 of FIG. 19.

Next, a cross-sectional view of the conductive layers 22 will be described with reference to FIG. 22. FIG. 22 is a cross-sectional view taken along line C1-C1 of FIG. 19. The configuration of FIG. 22 is different from that of the first embodiment in that a plate-shaped source line that is orthogonal to the semiconductor substrate 40 is provided. The source line SL shown in FIG. 22 is a midway path that allows the current collected by the diffusion layer in the P-well region 41 to flow up to upper layers.

Figure 23:
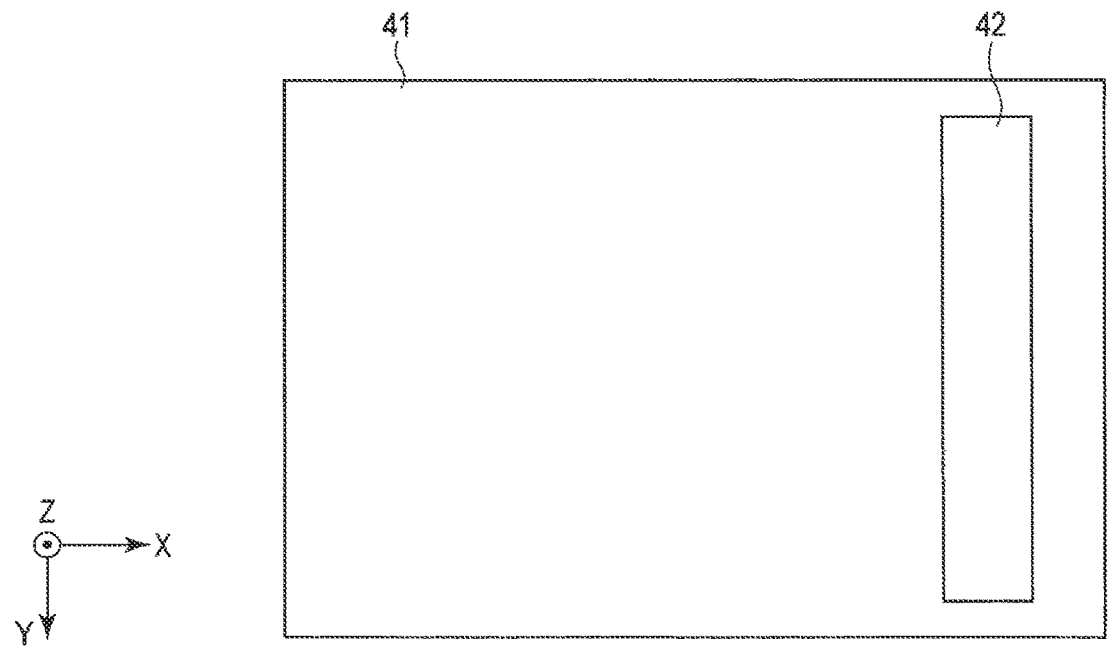
FIG. 23 is a cross-sectional view taken along line D1-D1 of FIG. 19.

Next, a cross-sectional view of the P-well region 41 will be described with reference to FIG. 23. FIG. 23 is a cross-sectional view taken along line D1-D1 of FIG. 19. As shown in FIG. 23, a current that flows down from the bit line BL through the memory pillar MP reaches the P-well region 41, and then flows through an inversion layer which is formed in the P-well region 41 by the select transistor ST(2) in the on state, and reaches the diffusion layer 42. Thereafter, the current enters the source line SL, flows to the top, and then flows to a source line driver (not illustrated).

Figure 24:
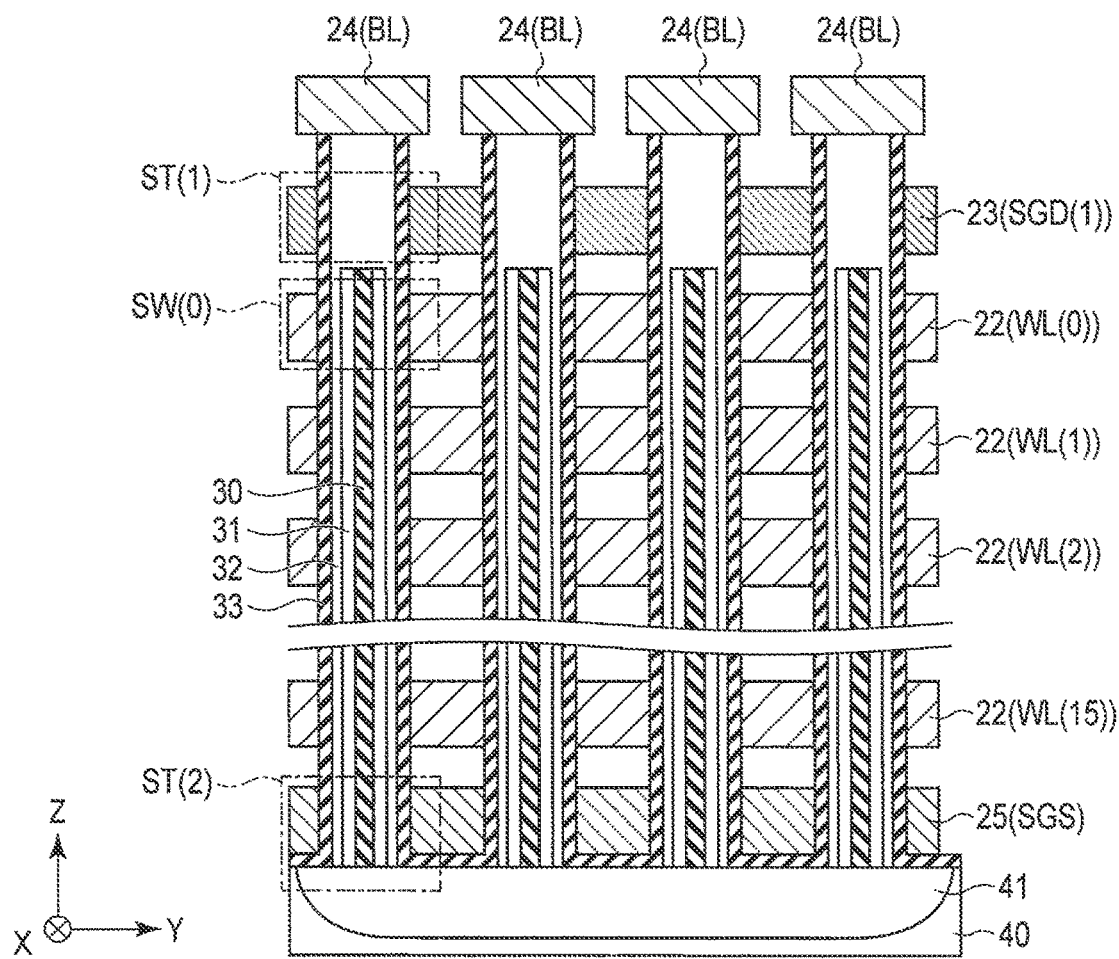
FIG. 24 is a cross-sectional view taken along line E1-E1 of FIG. 19.

Next, an example of a cross-sectional structure of the memory cell array 110 will be described with reference to FIG. 24. FIG. 24 is a cross-sectional view taken along line E1-E1 of FIG. 19. FIG. 24 shows a cross-sectional view along a direction orthogonal to the cross section shown in FIG. 19. Referring to FIGS. 24 and 19 in combination, it can be seen that the memory pillar MP is in a concentric shape about the core member 30.

An advantageous effect of the first modification of the first embodiment, compared with the first embodiment, is that the processing can be facilitated by omitting a step of providing a conductive layer as a source line SL in the bottommost layer, and by forming the select gate lines SGS in the bottommost layer in the same step as the step of forming the word lines WL.

<1-4-4> Operation

Next, an outline of the operation of the memory chip 100 according to the first modification of the first embodiment will be described.

In the memory chip 100 according to the first modification of the first embodiment, read and write operations are performed by letting a current flow between the bit line BL and the source line SL.

Figure 25:
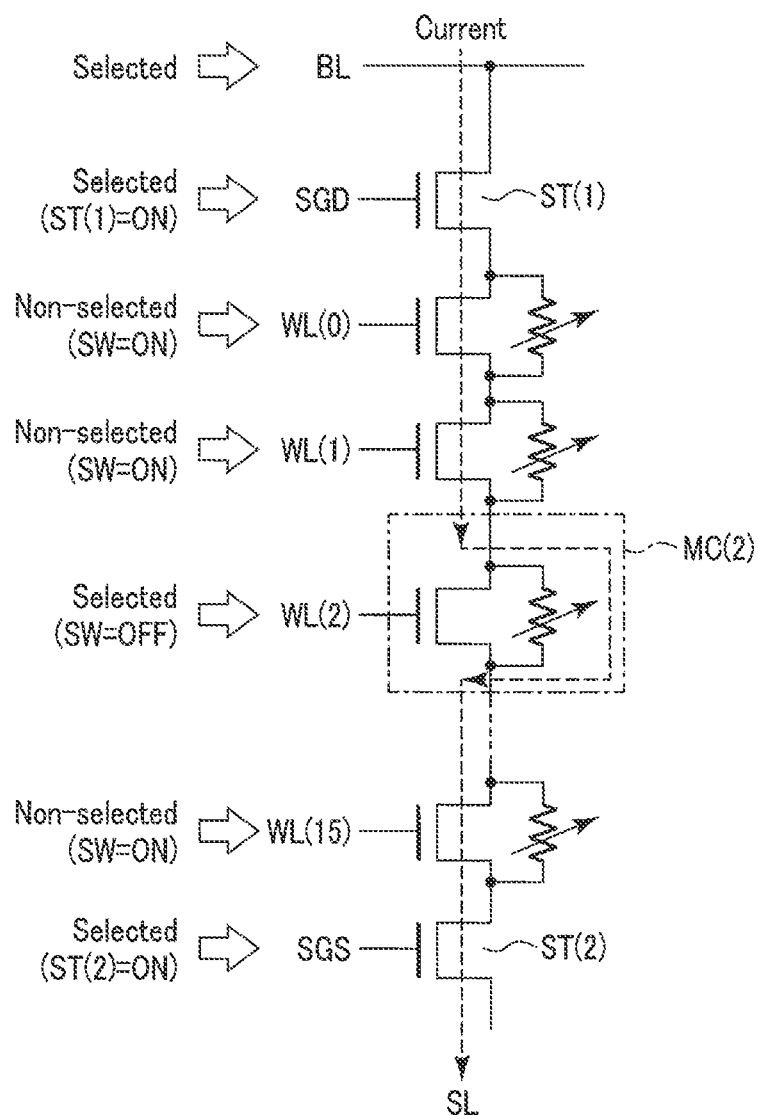
FIG. 25 is a circuit diagram in which a single memory cell string is extracted.

A brief description will be given of a method of selecting a memory cell MC that performs a read or write operation, with reference to FIGS. 25 and 26. FIG. 25 is a circuit diagram in which a single memory cell string MS is extracted. FIG. 26 is a cross-sectional view in which a memory pillar MP corresponding to a single memory cell string MS is extracted.

As shown in FIGS. 25 and 26, a predetermined voltage (positive voltage) is applied to a select gate line SGD of a select transistor ST(1) that is in contact with a memory pillar MP to which a memory cell MC (e.g., MC(2)) to be selected belongs. Thereby, an inversion layer is formed in a semiconductor layer of the select transistor ST(1), allowing a current to flow therethrough (the select transistor ST(1) is switched on). This causes the bit line BL, the select transistor ST(1), and the semiconductor layer of the memory pillar MP that is in contact with the select transistor ST(1) to be brought into conduction. Also, a word line WL(2) corresponding to the selected memory cell MC(2) is applied with 0 [V], and word lines WL(0), (1), and (3) to (15) corresponding to the non-selected memory cells MC are applied with a predetermined voltage (positive voltage). Thereby, a current path between the bit line BL and the source line SL flows through a variable resistance layer MR in the memory cell MC(2) to be selected, and flows through semiconductor layers of selectors SW in the non-selected memory cells MC(0), (1) and (3) to (15). Since a core member 30, which is an insulating layer, is provided at a central portion of the memory pillar MP, as shown in FIG. 26, a current flows through the variable resistance layer 31 that surrounds the core member 30 in the selected memory cell MC. Also, a predetermined voltage is applied to the select gate line SGS of the select transistor ST(2). Thereby, an inversion layer is formed in a semiconductor layer of the select transistor ST(2), allowing a current to flow therethrough (the select transistor ST(2) is switched on). This causes the bit line BL, the select transistor ST(1), the semiconductor layer of the memory pillar MP that is in contact with the select transistor ST(1), the select transistor ST(2), and the source line SL to be brought into conduction.

With the above-described configuration, it is possible to select a variable resistance layer both in a read operation and a write operation. When the present scheme is compared with a three-dimensional NAND-type flash memory, it has the advantages that it can operate at a lower voltage and at a higher speed, that there are less restrictions on the number of times of rewriting, and that the writing time is shorter.

<1-5> Second Modification

Next, a second modification of the first embodiment will be described. In the second modification of the first embodiment, another example of the memory cell MC will be described.

<1-5-1> Pattern 1

Figure 27:
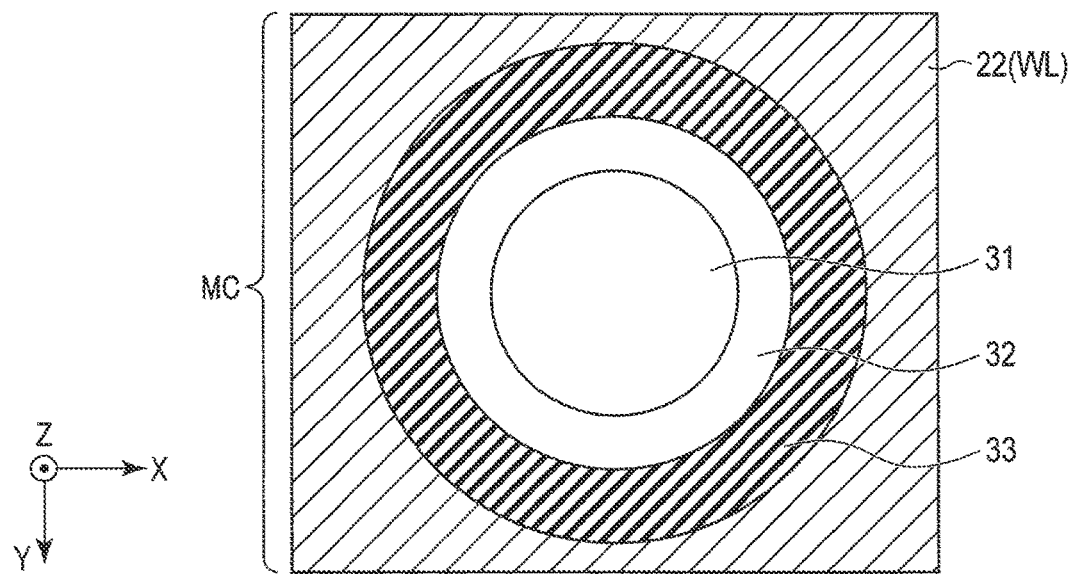
FIG. 27 is a cross-sectional view in which a single memory cell is extracted.
Figure 28:
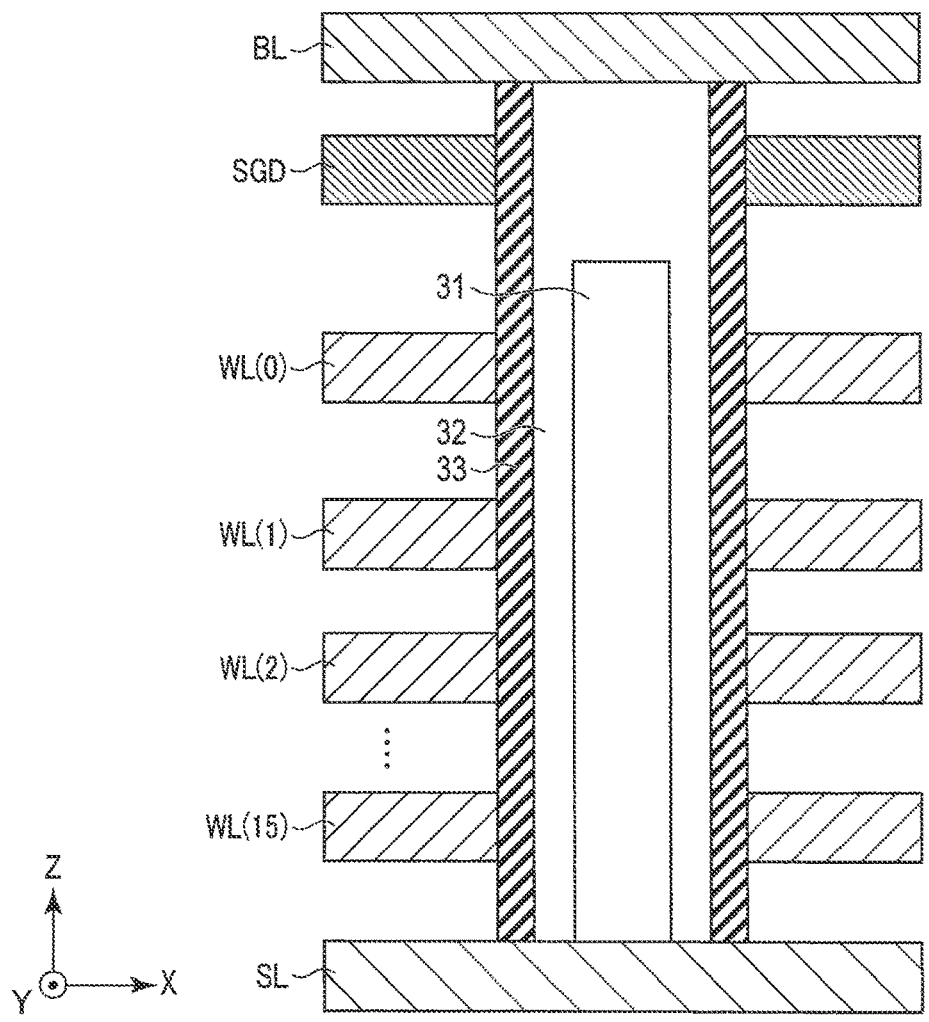
FIG. 28 is a cross-sectional view in which a memory pillar corresponding to a single memory cell string is extracted.

First, Pattern 1 of the second modification of the first embodiment will be described with reference to FIGS. 27 and 28. FIG. 27 is a cross-sectional view in which a single memory cell MC is extracted. FIG. 28 is a cross-sectional view in which a memory pillar MP corresponding to a single memory cell string MS is extracted.

As shown in FIGS. 27 and 28, in the memory cell MC, an insulating layer 33, a semiconductor layer 32, and a variable resistance layer 31 are provided in a memory hole MH that penetrates the conductive layers 22. The difference from the first embodiment is that a core member 30 is not provided in the memory pillar MP.

<1-5-2> Pattern 2

Figure 29:
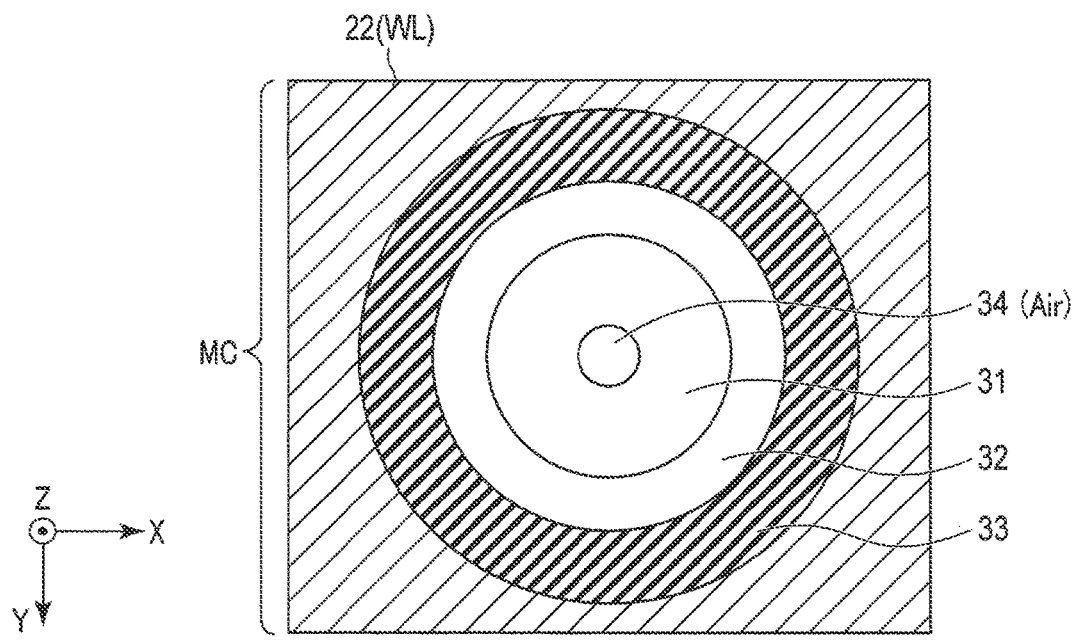
FIG. 29 is a cross-sectional view in which a single memory cell is extracted.

Next, Pattern 2 of the second modification of the first embodiment will be described with reference to FIG. 29. FIG. 29 is a cross-sectional view in which a single memory cell MC is extracted.

As shown in FIG. 29, in the memory cell MC, an insulating layer 33, a semiconductor layer 32, a variable resistance layer 31, and air 34 are provided in a memory hole MH that penetrates the conductive layers 22. The difference from the first embodiment is that the air 34 is provided in the memory pillar MP instead of the core member 30.

<1-5-3> Pattern 3

Figure 30:
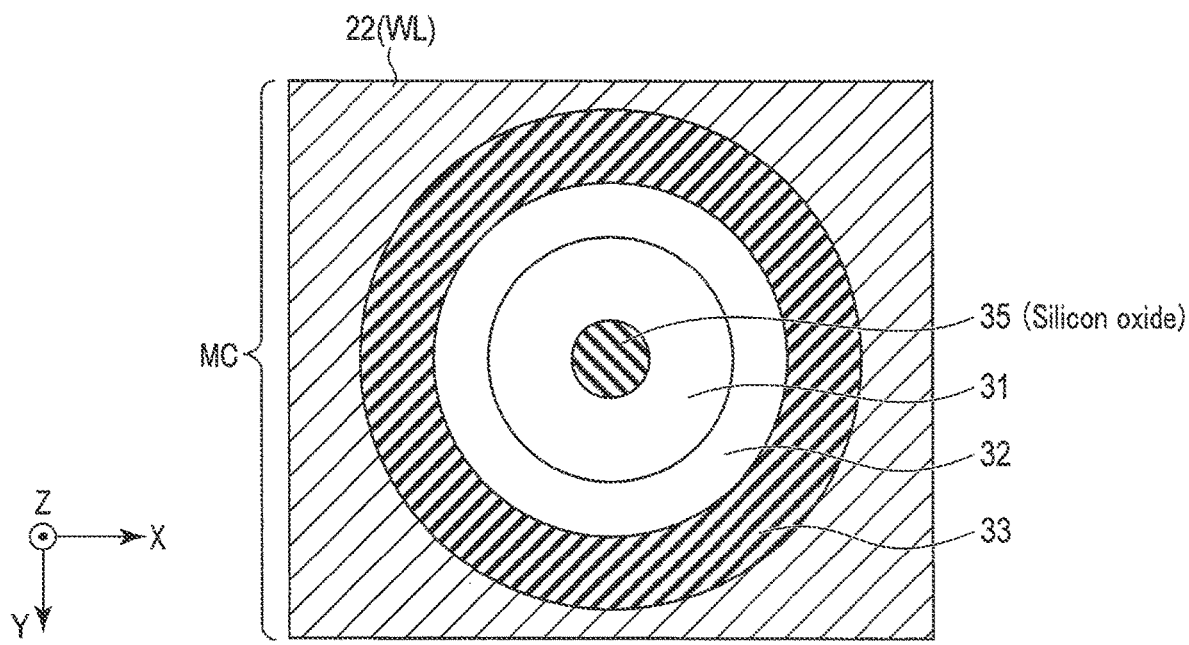
FIG. 30 is a cross-sectional view in which a single memory cell is extracted.

Next, Pattern 3 of the second modification of the first embodiment will be described with reference to FIG. 30. FIG. 30 is a cross-sectional view in which a single memory cell MC is extracted.

As shown in FIG. 30, in the memory cell MC, an insulating layer 33, a semiconductor layer 32, a variable resistance layer 31, and a silicon oxide film 35 are provided in a memory hole MH that penetrates the conductive layers 22. The difference from the first embodiment is that a silicon oxide film 35 is provided in the memory pillar MP instead of the core member 30.

<1-5-4> Pattern 4

Next, Pattern 4 of the second modification of the first embodiment will be described with reference to FIG. 31. FIG. 31 is a cross-sectional view in which a single memory cell MC is extracted.

As shown in FIG. 31, in the memory cell MC, an insulating layer 33, a semiconductor layer 32, a variable resistance layer 36, and an interlayer oxide film 37 are provided in a memory hole MH that penetrates the conductive layers 22. The variable resistance layer 36 includes a magnetic tunnel junction (MTJ) element (which may contain a CoFe alloy, an NiFe alloy, or the like), or a variable resistance film of $TiO_x$, $WO_x$, $HfO_x$, $TaO_x$, etc. that is used in a ReRAM.

<1-5-5> Pattern 5

Next, Pattern 5 of the second modification of the first embodiment will be described with reference to FIG. 32. FIG. 32 is a cross-sectional view in which a single memory cell MC is extracted.

As shown in FIG. 32 in the memory cell MC, an insulating layer 33, a semiconductor layer 32, a variable resistance layer 36, and air 34 are provided in a memory hole MH that penetrates the conductive layers 22. The variable resistance layer 36 includes a magnetic tunnel junction (MTJ) element (which may contain a CoFe alloy, an NiFe alloy, or the like), or a variable resistance film of $TiO_x$, $WO_x$, $HfO_x$, $TaO_x$, etc. that is used in a ReRAM. The difference from Pattern 4 of the second modification of the first embodiment is that the air 34 is provided in the memory pillar MP, instead of an interlayer oxide film 37.

<1-5-6> Pattern 6

Figure 33:
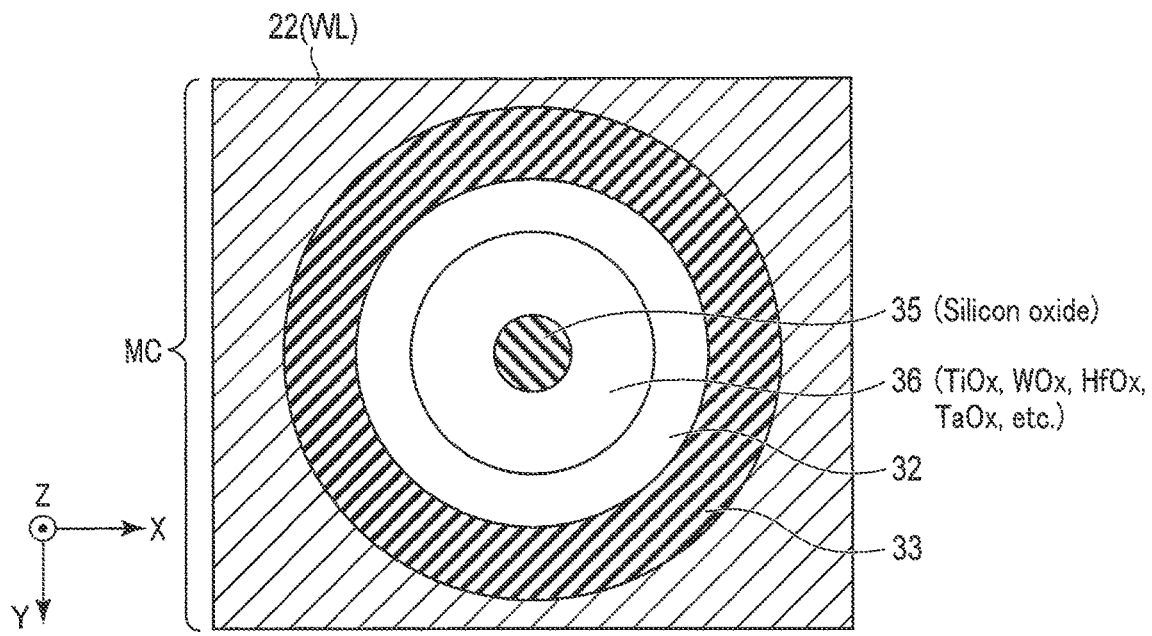
FIG. 33 is a cross-sectional view in which a single memory cell is extracted.

Next, Pattern 6 of the second modification of the first embodiment will be described with reference to FIG. 33. FIG. 33 is a cross-sectional view in which a single memory cell MC is extracted.

As shown in FIG. 33, in the memory cell MC, an insulating layer 33, a semiconductor layer 32, a variable resistance layer 36, and a silicon oxide film 35 are provided in a memory hole MH that penetrates the conductive layers 22. The variable resistance layer 36 includes a magnetic tunnel junction (MTJ) element (which may contain a CoFe alloy, an NiFe alloy, or the like), or a variable resistance film of $TiO_x$, $WO_x$, $HfO_x$, $TaO_x$, etc. that is used in a ReRAM.

As described in Patterns 1-6 above, a variety of configurations and materials can be used for the variable resistance material.

When a positive voltage is applied to a word line WL, an inversion layer is formed in a semiconductor layer 32, and a current flows through the inversion layer.

When a voltage of 0 [V] is applied to a word line WL, an inversion layer is not formed in a semiconductor layer 32, and a current flows through the above-described various variable resistance layers. The air and the silicon oxide film disposed at the center of the memory pillar MP functions as an insulating layer, similarly to silicon nitride.

<1-5-7> Pattern 7

Figure 34:
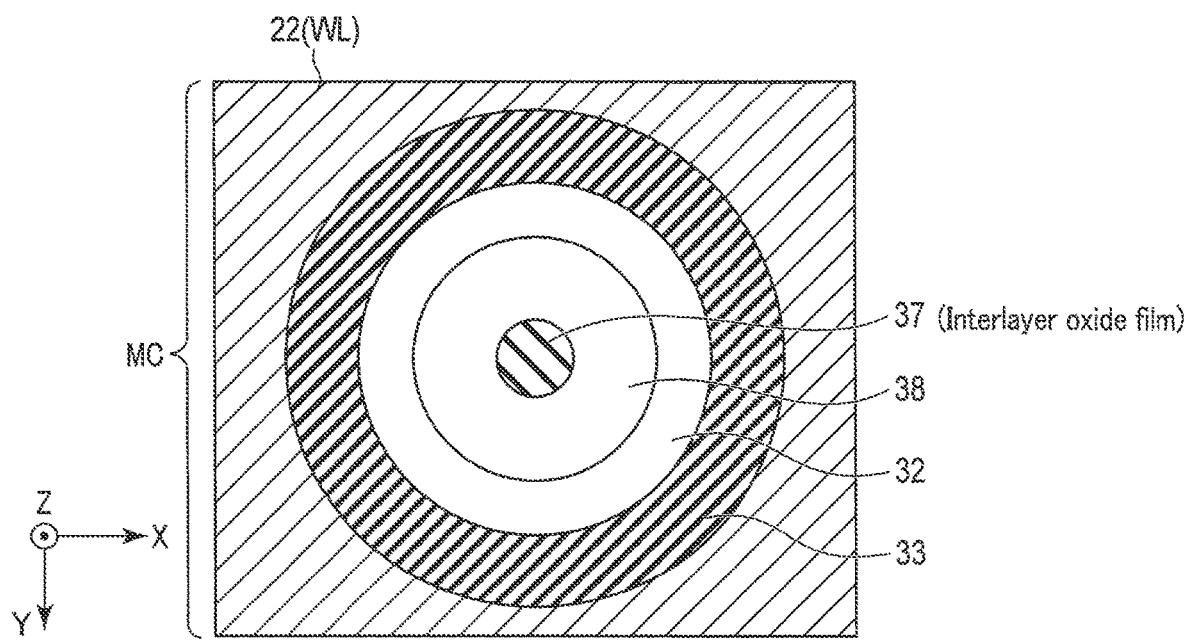
FIG. 34 is a cross-sectional view in which a single memory cell is extracted.
Figure 35:
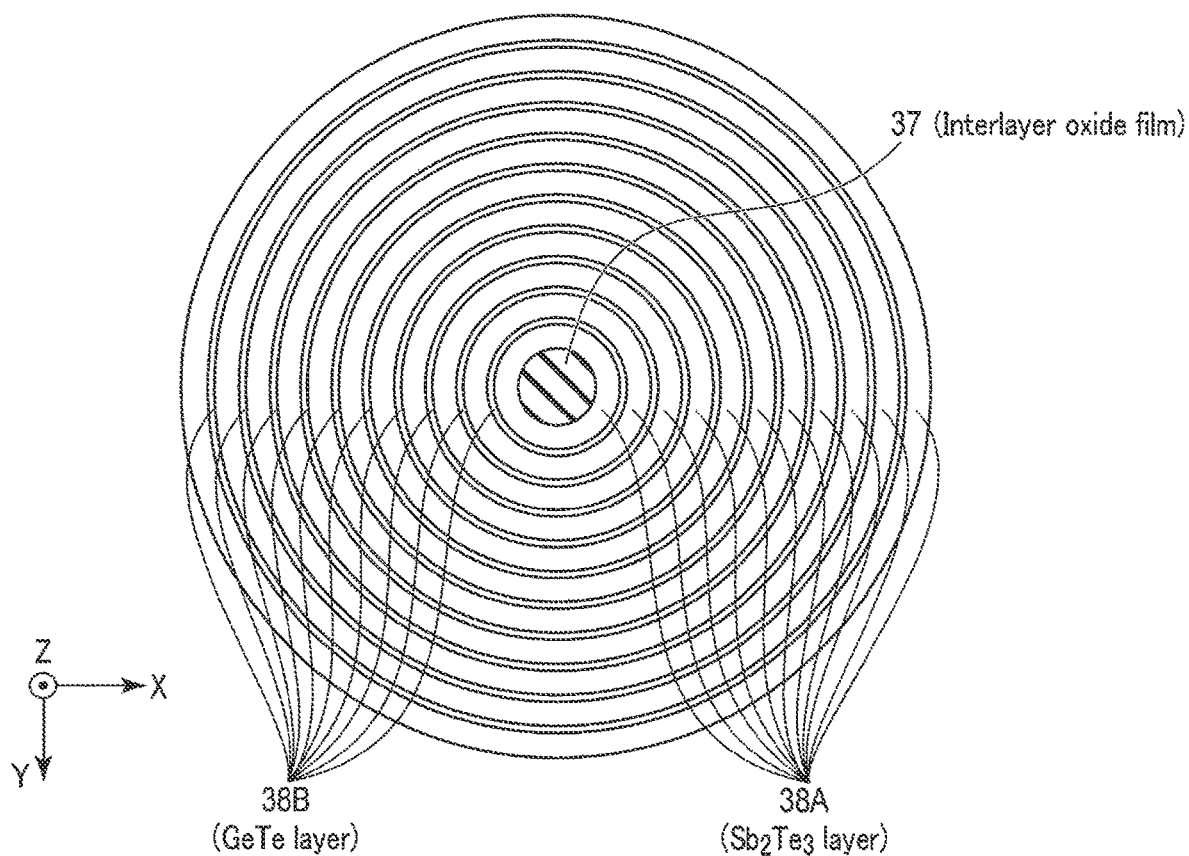
FIG. 35 is a cross-sectional view in which the variable resistance layer of FIG. 34 is shown in more detail.
Figure 36:
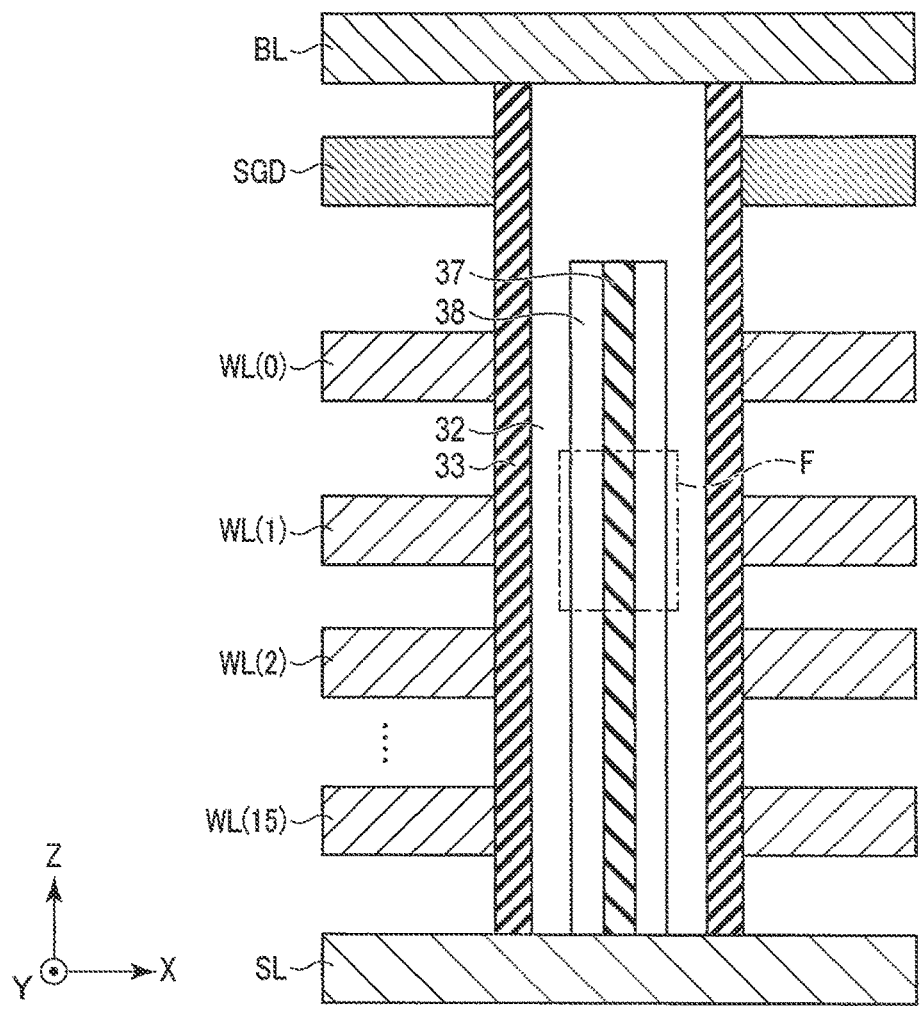
FIG. 36 is a cross-sectional view in which a memory pillar corresponding to a single memory cell string is extracted.
Figure 37:
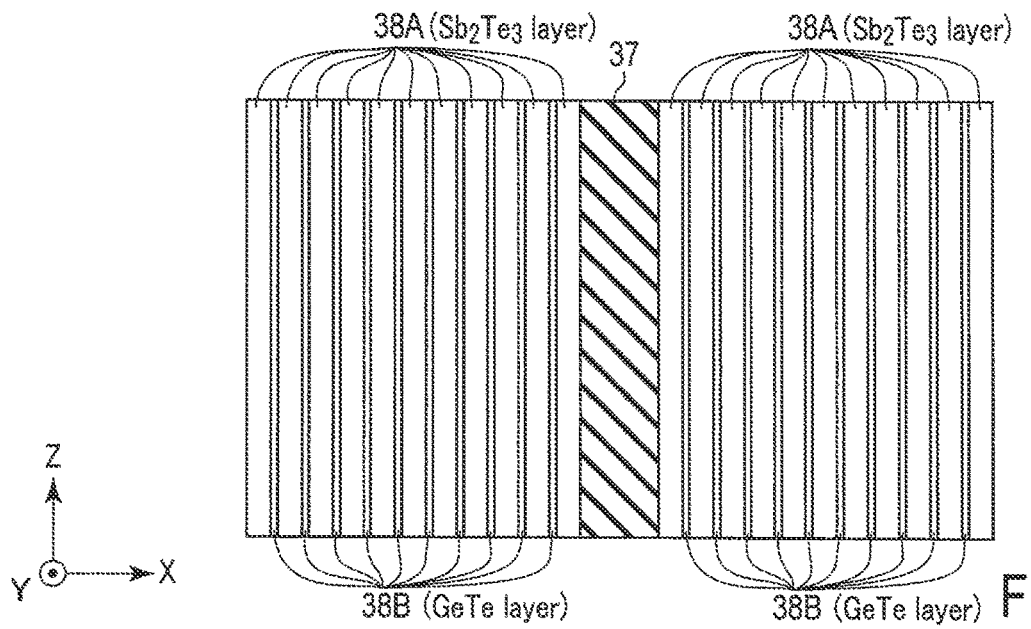
FIG. 37 is a cross-sectional view showing F of FIG. 36.

Next, Pattern 7 of the second modification of the first embodiment will be described with reference to FIGS. 34 to 37. FIG. 34 is a cross-sectional view in which a single memory cell MC is extracted. FIG. 35 is a cross-sectional view in which the variable resistance layer of FIG. 34 is shown in more detail. FIG. 36 is a cross-sectional view in which a memory pillar MP corresponding to a single memory cell string MS is extracted. FIG. 37 is a cross-sectional view showing F of FIG. 36.

As shown in FIGS. 34 and 35, in the memory cell MC, an insulating layer 33, a semiconductor layer 32, a variable resistance layer 38, and an interlayer oxide film 37 are provided in a memory hole MH that penetrates the conductive layers 22. In the variable resistance layer 38, superlattice layers of $Sb_2Te_3$ (38A) and GeTe (38B), which function as interfacial phase-change memories (iPCM), are alternately stacked.

Also, as shown in FIGS. 36 and 37, $Sb_2Te_3$ (38A) and GeTe (38B) contained in the variable resistance layer 38 are stacked along the XY plane direction perpendicular to the direction in which the memory pillar MP extends (Z direction).

In such a configuration, a current in a selected memory cell MC enters the plane of the variable resistance layer 38 from the semiconductor layer 32 in a direction perpendicular thereto (XY plane direction), flows through the selected memory cell MC in parallel with the direction in which the variable resistance layer 38 extends, and flows out of the variable resistance layer 38 in a direction perpendicular to the semiconductor layer 32 (XY plane direction); in a non-selected memory cell MC, a current flows through the semiconductor layer 32.

<1-5-8> Pattern 8

Figure 38:
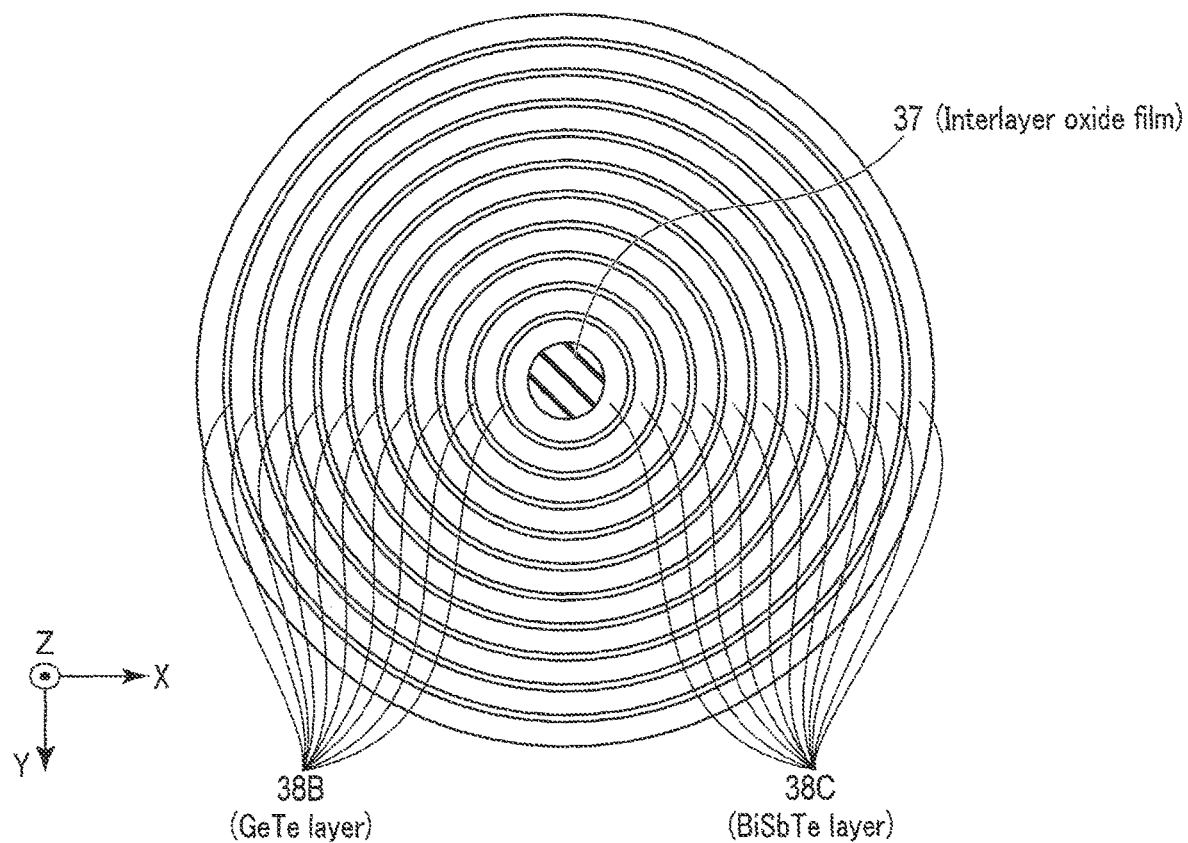
FIG. 38 is a cross-sectional view showing another example of the variable resistance layer of FIG. 34 in more detail.
Figure 39:
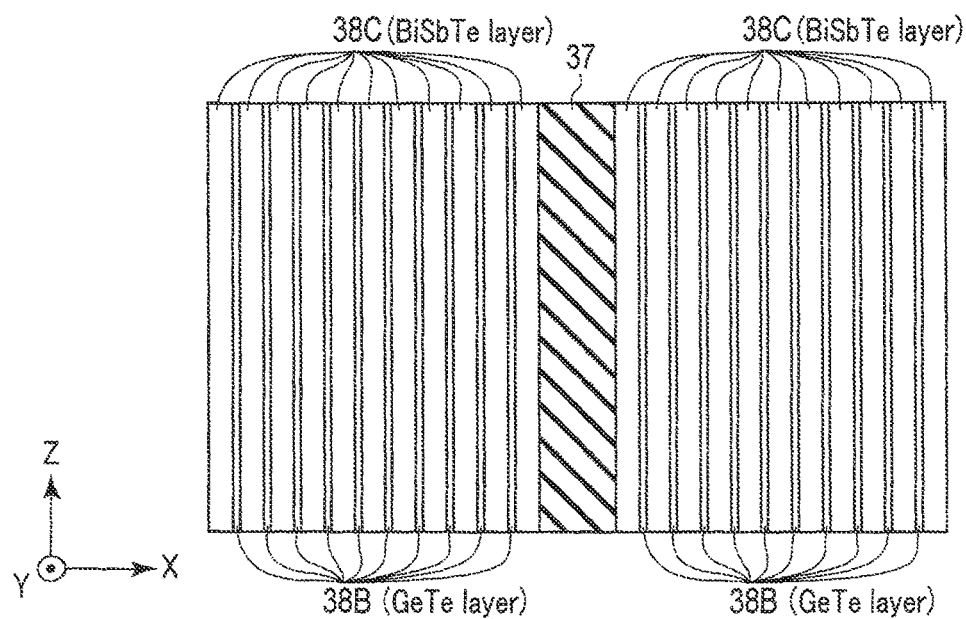
FIG. 39 is a cross-sectional view showing another example of F in FIG. 36.

Next, Pattern 8 of the second modification of the first embodiment will be described with reference to FIGS. 38 and 39. FIG. 38 is a cross-sectional view showing another example of the variable resistance layer 38 of FIG. 34 in more detail. FIG. 39 is a cross-sectional view showing another example of F in FIG. 36.

As shown in FIGS. 38 and 39, the variable resistance layer 38 may be configured in such a manner that superlattice layers of BiSbTe (38C) and GeTe (38B), which function as interfacial phase-change memories (iPCM), are alternately stacked. A basic stacking structure of BiSbTe (38C) and GeTe (38B) may be similar to that of Pattern 7.

<1-5-9> Pattern 9

Figure 40:
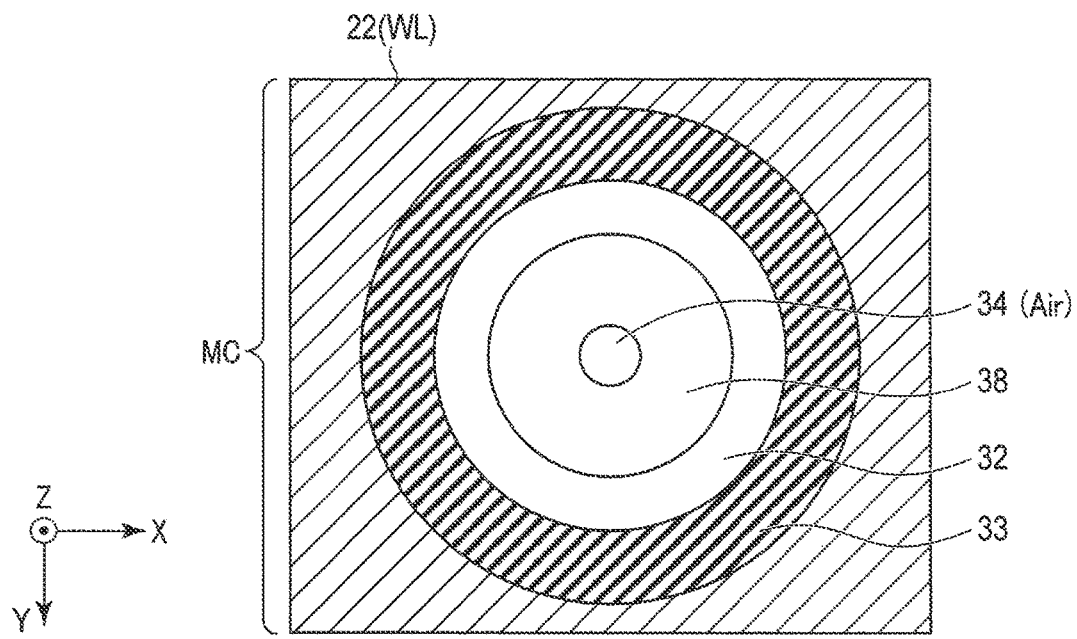
FIG. 40 is a cross-sectional view in which a single memory cell is extracted.

Next, Pattern 9 of the second modification of the first embodiment will be described with reference to FIG. 40. FIG. 40 is a cross-sectional view in which a single memory cell MC is extracted. As shown in FIG. 40, in the memory cell MC, an insulating layer 33, a semiconductor layer 32, a variable resistance layer 38, and air 34 are provided in a memory hole MH that penetrates the conductive layers 22. The difference from Pattern 7 of the second modification of the first embodiment is that the air 34 is provided in the memory pillar MP instead of the interlayer oxide film 37.

<1-5-10> Pattern 10

Figure 41:
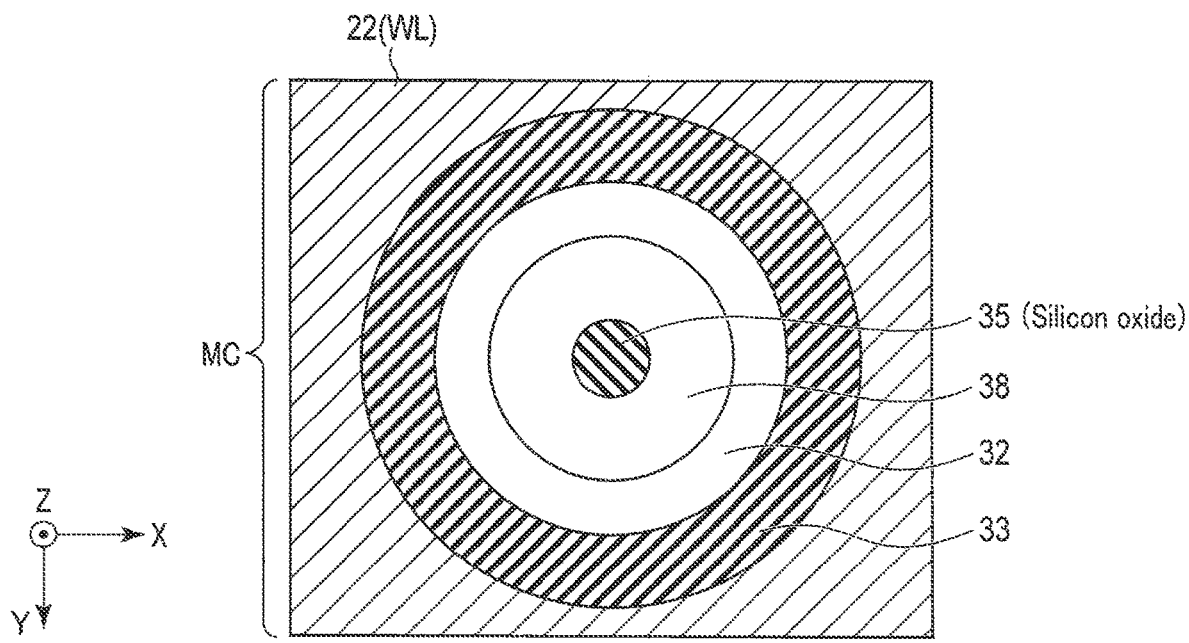
FIG. 41 is a cross-sectional view in which a single memory cell is extracted.

Next, Pattern 10 of the second modification of the first embodiment will be described with reference to FIG. 41. FIG. 41 is a cross-sectional view in which a single memory cell MC is extracted. As shown in FIG. 41, in the memory cell MC, an insulating layer 33, a semiconductor layer 32, a variable resistance layer 38, and a silicon oxide film 35 are provided in a memory hole MH that penetrates the conductive layers 22. The difference from Pattern 7 of the second modification of the first embodiment is that a silicon oxide film 35 is provided in the memory pillar MP instead of the interlayer oxide film 37.

The variable resistance layer 38 may be configured in such a manner that Ge, Sb, and Te are alternately stacked, or may contain a chalcogenide material.

<1-6> Third Modification

Next, a third modification of the first embodiment will be described. In the third modification of the first embodiment, a description will be given of an operation waveform in a case where a bipolar-type ReRAM or a CBRAM is adopted as a variable resistance layer of a memory cell MC.

Figure 42:
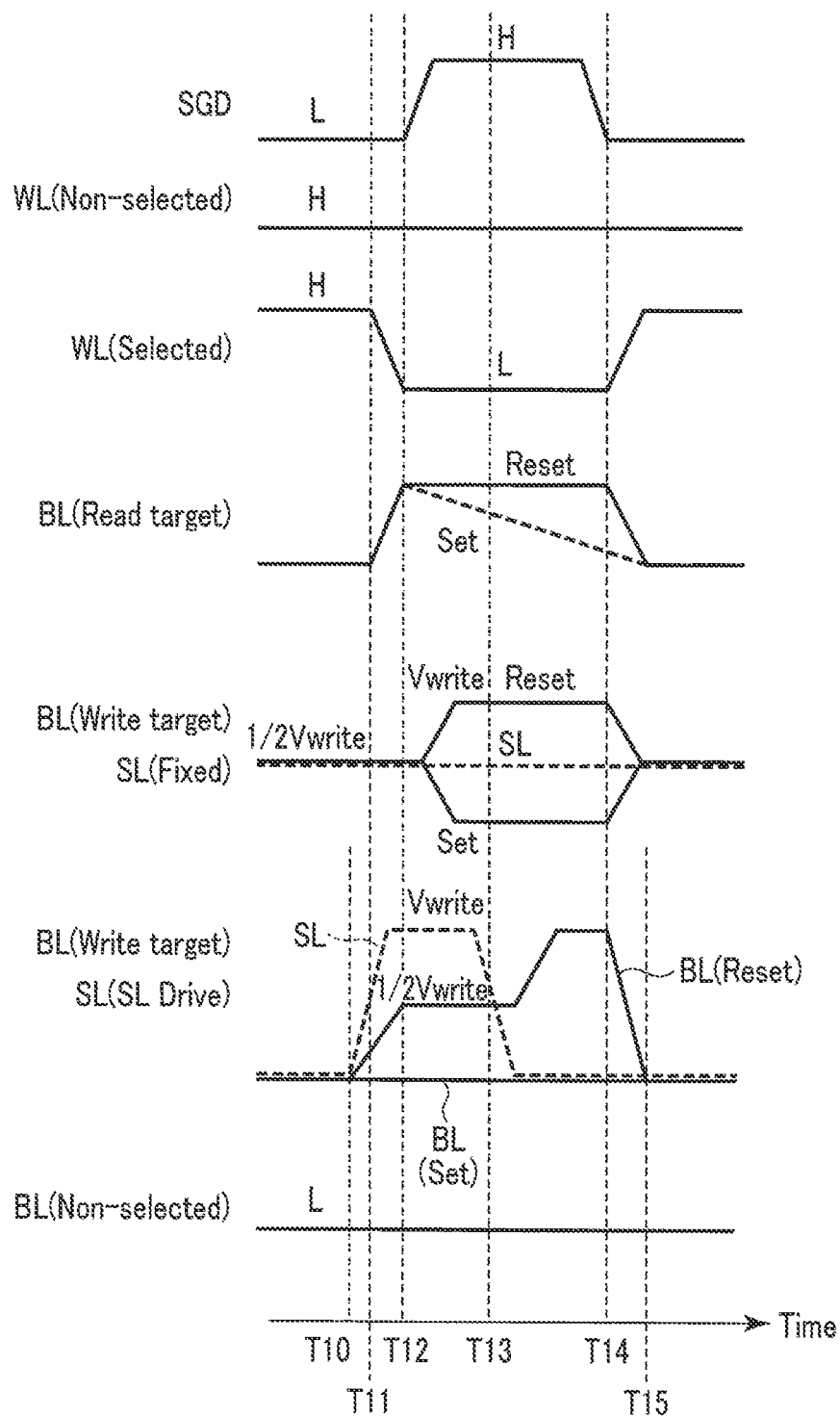
FIG. 42 shows a timing chart of an operation waveform.

A description will be given of an operation waveform of a memory chip 100 according to the present embodiment, with reference to FIG. 42. FIG. 42 shows a timing chart of an operation waveform.

A read operation is performed similarly to the operation described with reference to FIG. 14, and a description thereof will be omitted.

A write operation will be described below.

First, a case will be described where a voltage of a source line SL is fixed.

At time T11, a sequencer 170 maintains the voltages of the bit line BL and the source line SL to be write targets at ½ Vwrite, maintains the voltage of the non-selected bit line BL at the L level, maintains the voltage of the non-selected word line WL at the H level (L<H), and decreases the voltage of the selected word line WL from the H level to the L level; at time T12 and thereafter, the sequencer 170 maintains the voltage of the selected word line WL at the L level.

At time T12, the sequencer 170 increases the voltage of the select gate line SGD of a select transistor ST(1) corresponding to the selected memory cell MC from the L level to the H level. Since the voltage of the non-selected word line WL is maintained at the H level, the selector SW in the non-selected memory cell MC is maintained in the on state.

At time T12, the sequencer 170 applies a write pulse (voltage) to a bit line BL that is to be a write target. Specifically, the sequencer 170 raises the voltage of the bit line BL to Vwrite at the time of reset writing, and brings the voltage of the bit line BL to L level at the time of set writing. The sequencer 170 maintains the voltage of the source line SL at ½ Vwrite. This is because positively or negatively charged ions are actually moved to form or separate a filament.

Next, a case will be described where the source line SL is driven. A description of matters similar to those in the case where the voltage of the source line SL is fixed will be omitted.

In this case, at the time of set writing, the sequencer 170 causes the source line voltage to be higher than the bit line voltage. At the time of reset writing, the sequencer 170 causes the bit line voltage to be higher than the source line voltage, opposite in polarity to the set writing. The voltage of the source line SL increases from the L level to Vwrite, and then decreases to the L level. At the time of reset writing, the voltage of the bit line BL increases from the L level to ½ Vwrite. Subsequently, after the voltage of the source line SL decreases to the L level, the voltage of the bit line BL increases to Vwrite. Thereafter, the voltage of the bit line BL decreases to the L level. On the other hand, at the time of set writing, the voltage of the bit line BL is maintained at the L level.

In the present case, both the bit line and the source line need to be driven, unlike the case where the voltage of the source line is fixed. However, the present case is advantageous in that a voltage difference between the bit line and the source can be doubled, compared to the case where the voltage of the source line is fixed.

<2> Second Embodiment

Next, a second embodiment will be described. In the second embodiment, another example of the memory cell array 110 will be described. In the second embodiment, a description of matters similar to those of the first embodiment, or matters that can be inferred by analogy, will be omitted.

<2-1> Configuration

<2-1-1> Circuit Configuration of Memory Cell Array 110

Next, a circuit configuration (equivalent circuit) of a memory cell array 110 will be described with reference to FIG. 43.

As shown in FIG. 43, each block BLK of the memory cell array 110 includes, for example, four string units SU (SU (0)-SU(3)). The number of string units SU in each block BLK may be designed to be any number. The string unit SU includes a plurality of memory groups MG. Each of the memory groups MG includes two memory cell strings MSa and MSb. Hereinafter, when memory cell strings MSa and MSb are not distinguished from one another, they will be referred to as "memory cell strings MS".

Each memory cell string MSa includes, for example, 16 memory cells MCa (MCa(0) to MCa(15)) and a select transistor STa(1). Similarly, each memory cell string MSb includes, for example, 16 memory cells MCb (MCb(0) to MCb(15)) and a select transistor STb(1). Hereinafter, when memory cells MCa(0) to MCa(15) and MCb(0) to MCb(15) are not distinguished from one another, they will be referred to as "memory cells MC". Also, when, for example, memory cells MCa(0) and MCb(0) are not distinguished from one another, they will be referred to as "memory cells MC(0)". The same is true of memory cells MC(1) to MC(15). Moreover, when select transistors STa(1) and STb(1) are not distinguished from one another, they will be referred to as "select transistors ST(1)". The number of select transistors ST(1) included in each memory cell string MS may be designed to be any number greater than one.

Each memory cell MC includes a memory element MR and a selector SW. Examples of the memory element MR include an alloy-based phase-change element ($Ge_2Sb_2Te_5$). The memory element MR according to the present embodiment takes either a low resistance state or a high resistance state according to a change in crystallization state. Hereinafter, a change in the crystallization state of the memory element MR will be referred to as a "phase change", a low resistance state (LRS) of the memory element MR will be referred to as a "set state", and a high resistance state (HRS) of the memory element MR will be referred to as a "reset state". In the present embodiment, the selector SW includes a semiconductor layer, a gate insulating film, and a gate electrode. In the memory cell MC, the memory element MR and the selector SW are coupled in parallel. Also, the number of memory cells MC included in each memory cell string MS is not limited to a particular number, and may be 8, 32, 48, 64, 96, 128, etc.

The memory cells MCa(0) to MCa(15) included in each memory cell string MSa are coupled in series between the select transistor STa(1) and a source line SL. Control gates of the memory cells MCa(0) of a plurality of memory cell strings MSa included in the same block BLK are commonly coupled to a word line WLa(0). Similarly, control gates of the memory cells MCa(1) to MCa(15) of a plurality of memory cell strings MSa included in the same block BLK are commonly coupled to word lines WLa(1) to WLa(15).

Similarly, the memory cells MCb(0) to MCb(15) included in each memory cell string MSb are coupled in series between the select transistor STb(1) and the source line SL. Control gates of the memory cells MCb(0) of a plurality of memory cell strings MSb included in the same block BLK are commonly coupled to a word line WLb(0). Similarly, control gates of the memory cells MCb(1) to MCb(15) of a plurality of memory cell strings MSb included in the same block BLK are commonly coupled to word lines WLb(1) to WLb(15).

Hereinafter, when word lines WLa and WLb are not distinguished from one another, they will be referred to as "word lines WL". Also, when, for example, word lines WLa(0) and WLb(0) are not distinguished from one another, they will be referred to as "word lines WL(0)". The same is true of word lines WL(1) to WL(15).

A drain of select transistor STa(1) and a drain of select transistor STb(1) included in a memory group MG are commonly coupled to one of the bit lines BL (BL(0), . . . , BL(m)). The bit lines BL are independently controlled by the sense amplifier 140. A source of memory cell MCa(15) and a source of memory cell MCb(15) included in each memory group MG in a block BLK are commonly coupled to a source line SL.

Gates of select transistors STa(1) included in a string unit SU are commonly coupled to a select gate line SGDa, and gates of select transistors STb(1) in the string unit SU are commonly coupled to a select gate line SGDb. More specifically, gates of select transistors STa(1) in a string unit SU(0) are commonly coupled to a select gate line SGDa(0), and gates of select transistors STb(1) in the string unit SU(0) are commonly coupled to a select gate line SGDb(0). Similarly, gates of select transistors STa(1) in a string unit SU(1) are commonly coupled to a select gate line SGDa(1), and gates of select transistors STb(1) in the string unit SU(1) are commonly coupled to a select gate line SGDb(1). The same is true of string units SU(2) and SU(3).

Hereinafter, when select gate lines SGDa (SGDa(0), SGDa(1), . . . ) and SGDb (SGDb(0), SGDb(1), . . . are not distinguished from one another, they will be referred to as "select gate lines SGD".

Both the select gate lines SGD and the word lines WL are independently controlled by the row decoder 120.

Also, drains of select transistors ST(1) of memory group MG in the same column in the memory cell array 110 are commonly coupled to bit lines BL (BL(0) to BL(m)). That is, the bit lines BL commonly couple memory group MG of different blocks BLK. In addition, sources of memory cells MC (15) are commonly coupled to the source line SL.

That is, each string unit SU includes a plurality of memory cell strings MS that are coupled to different bit lines BL and coupled to the same select gate line SGD. Each block BLK includes a plurality of string units SU that share the same word line WL. The memory cell array 110 includes a plurality of blocks BLK that share the same bit line BL.

<2-1-2> Structure of Memory Cell Array 110

Hereinafter, an example of a structure of a memory cell array 110 according to the second embodiment will be described.

In the drawings to which reference will be made below, an "X direction" refers to a direction in which the bit lines BL extend, a "Y direction" corresponds to a direction in which the word lines WL extend, and a "Z direction" corresponds to a direction vertical to a surface of the semiconductor substrate 20 on which the memory cell array 110 is formed.

In the drawings, components such as insulating layers (interlayer insulating films), interconnects, contact plugs, etc. are suitably omitted for ease of reference.

Figure 44:
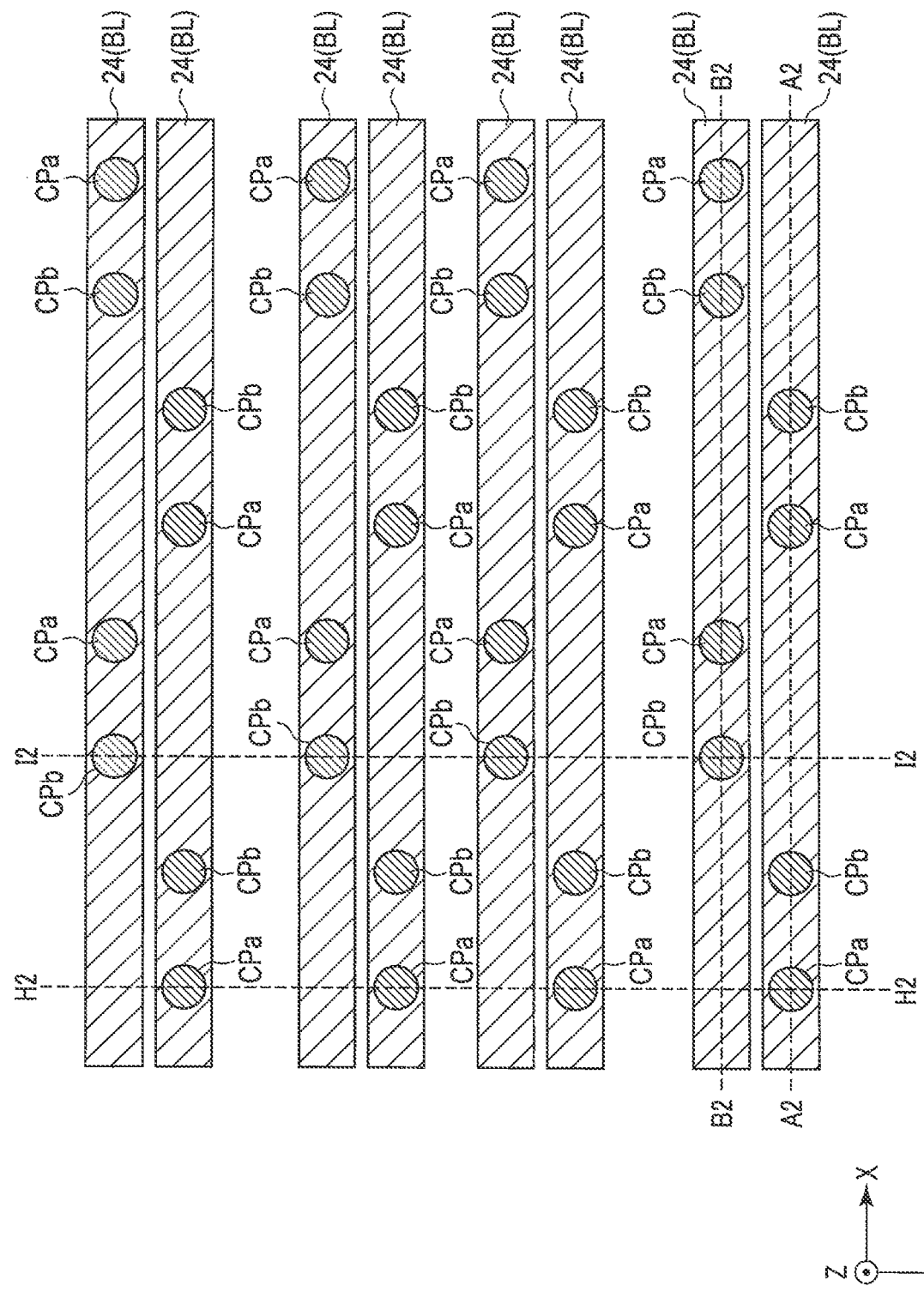
FIG. 44 is a cross-sectional view showing a relationship between a bit line of a memory cell array included in a memory chip and a contact plug that couples the bit line and a memory pillar, according to a second embodiment.
Figure 45:
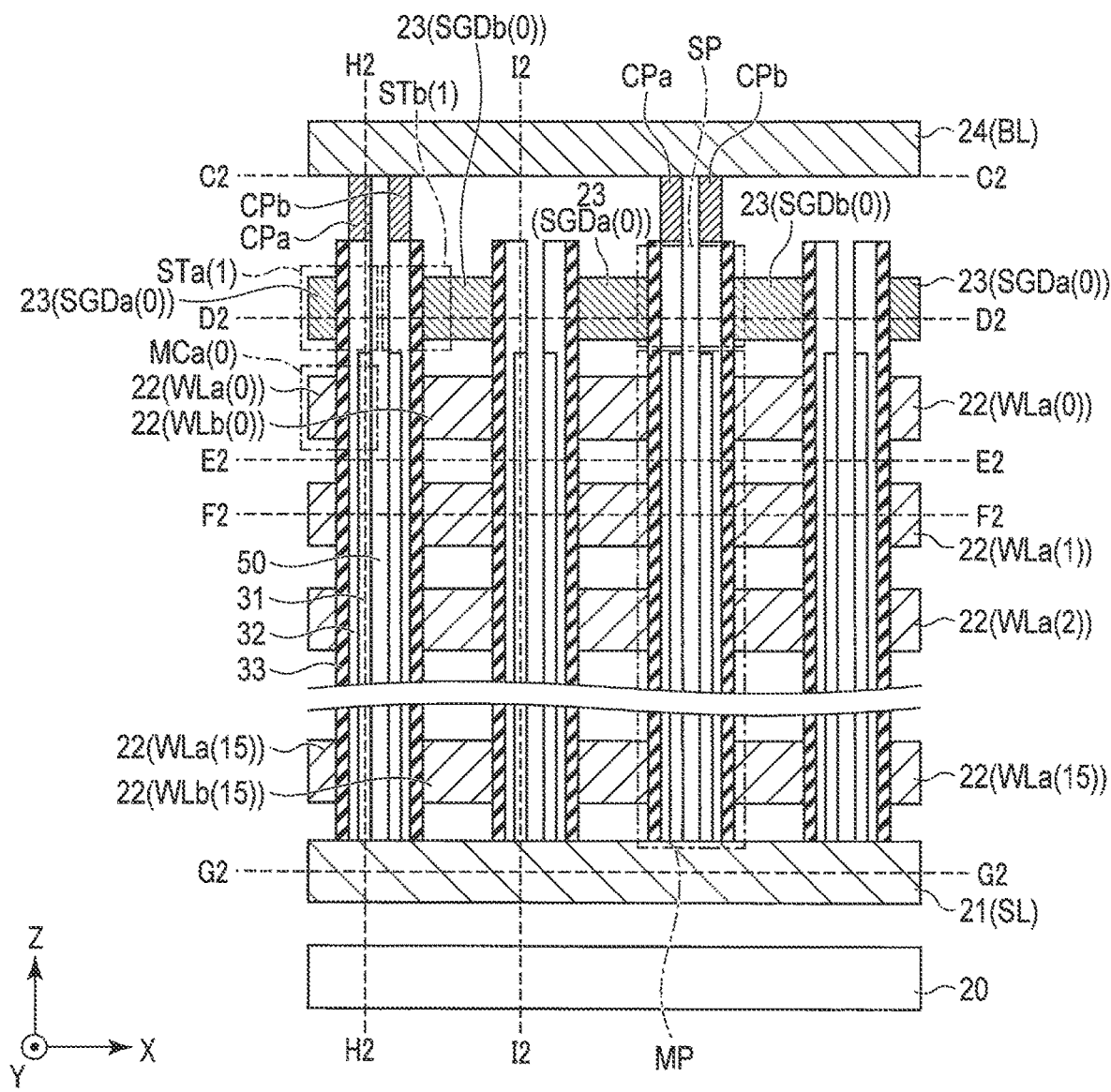
FIG. 45 is a cross-sectional view taken along line A2-A2 of FIG. 44.
Figure 46:
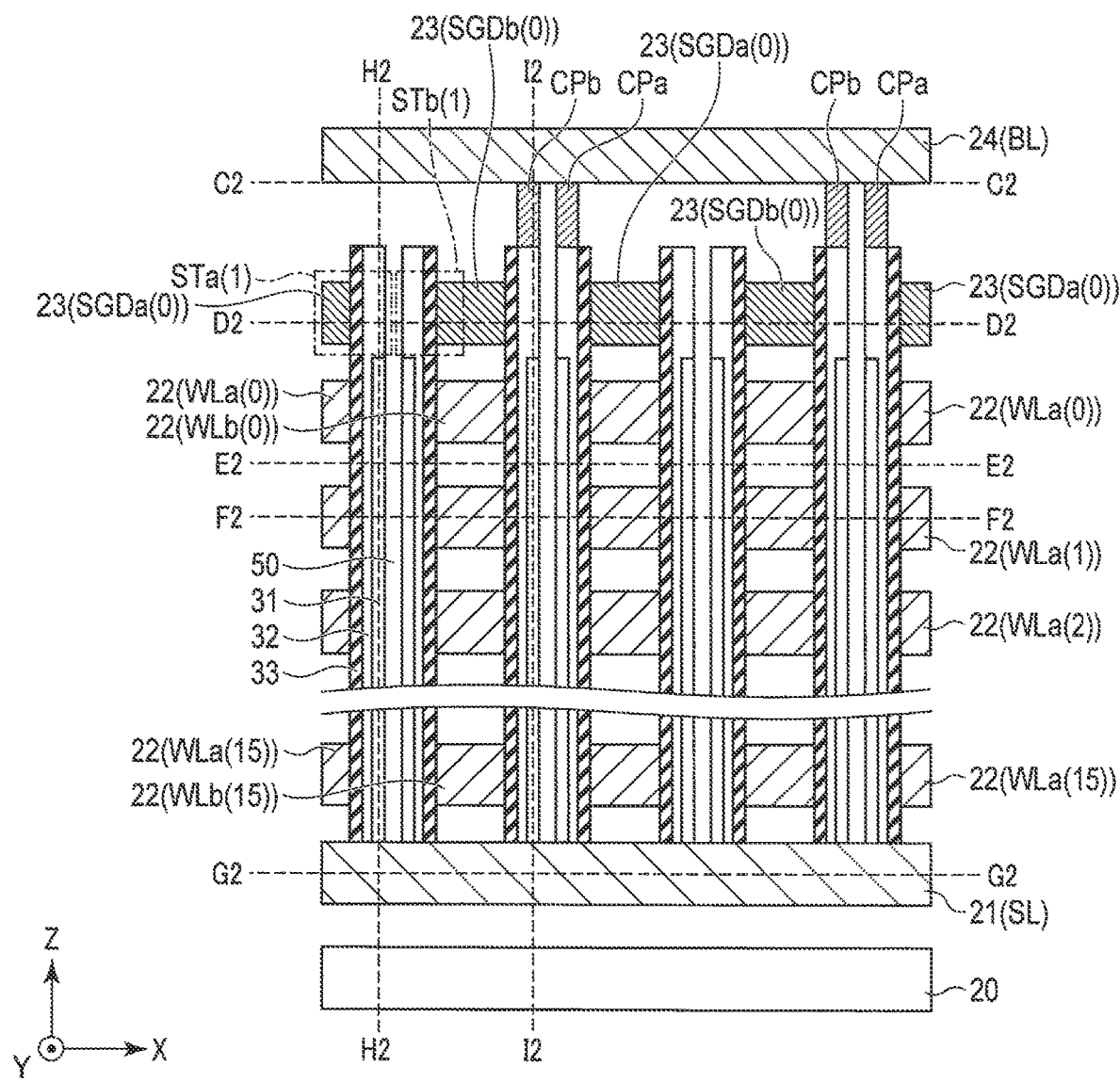
FIG. 46 is a cross-sectional view taken along line B2-B2 of FIG. 44.
Figure 47:
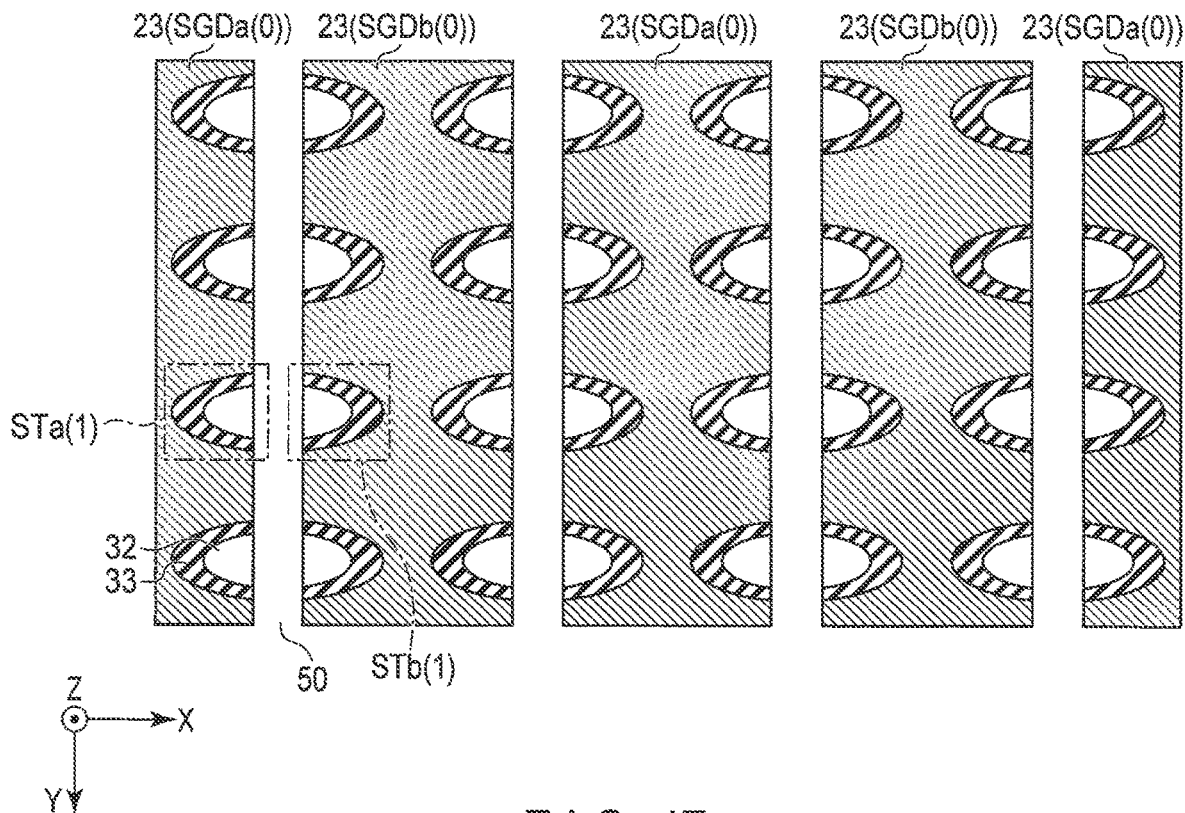
FIG. 47 is a cross-sectional view taken along line D2-D2 of FIGS. 45 and 46.
Figure 48:
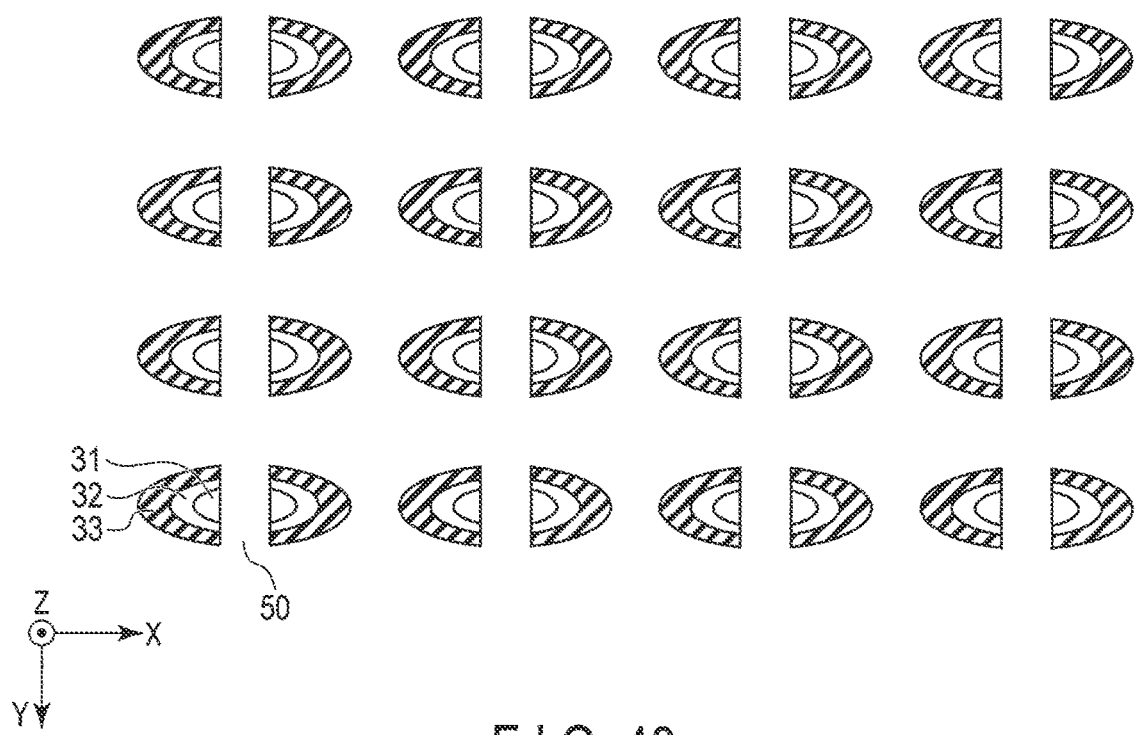
FIG. 48 is a cross-sectional view taken along line E2-E2 of FIGS. 45 and 46.
Figure 49:
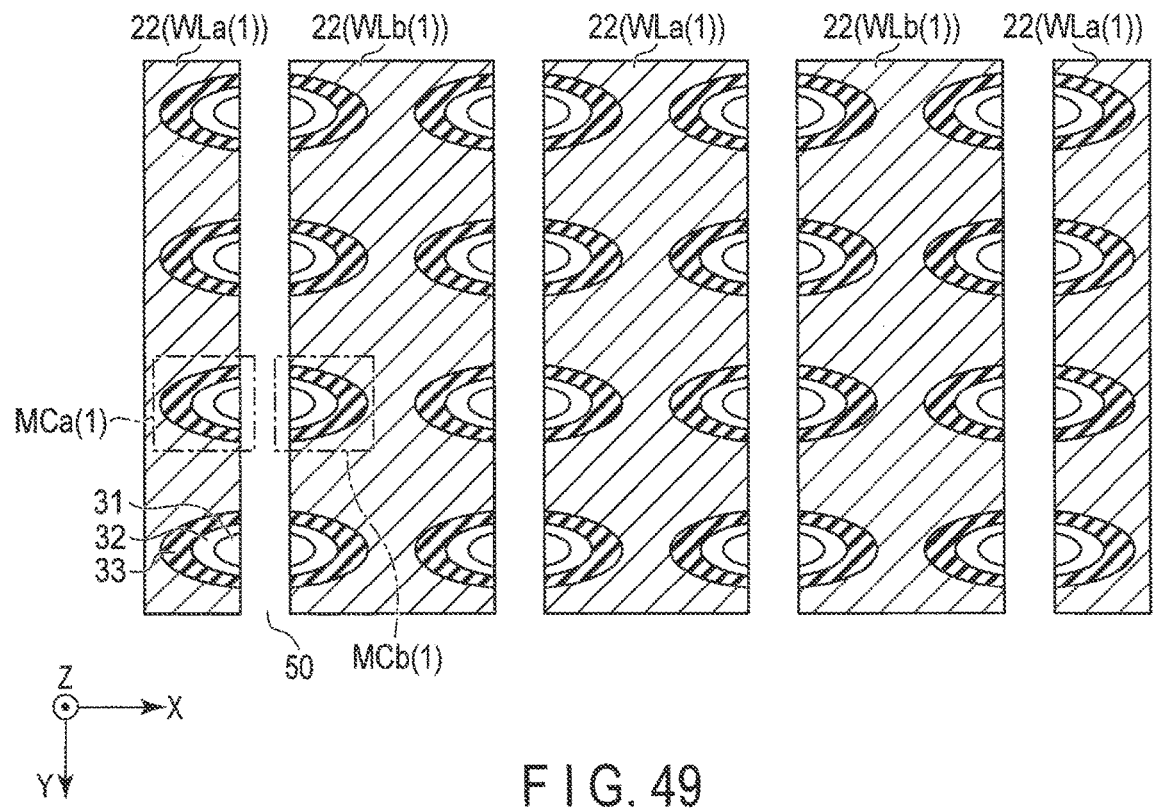
FIG. 49 is a cross-sectional view taken along line F2-F2 of FIGS. 45 and 46.
Figure 50:
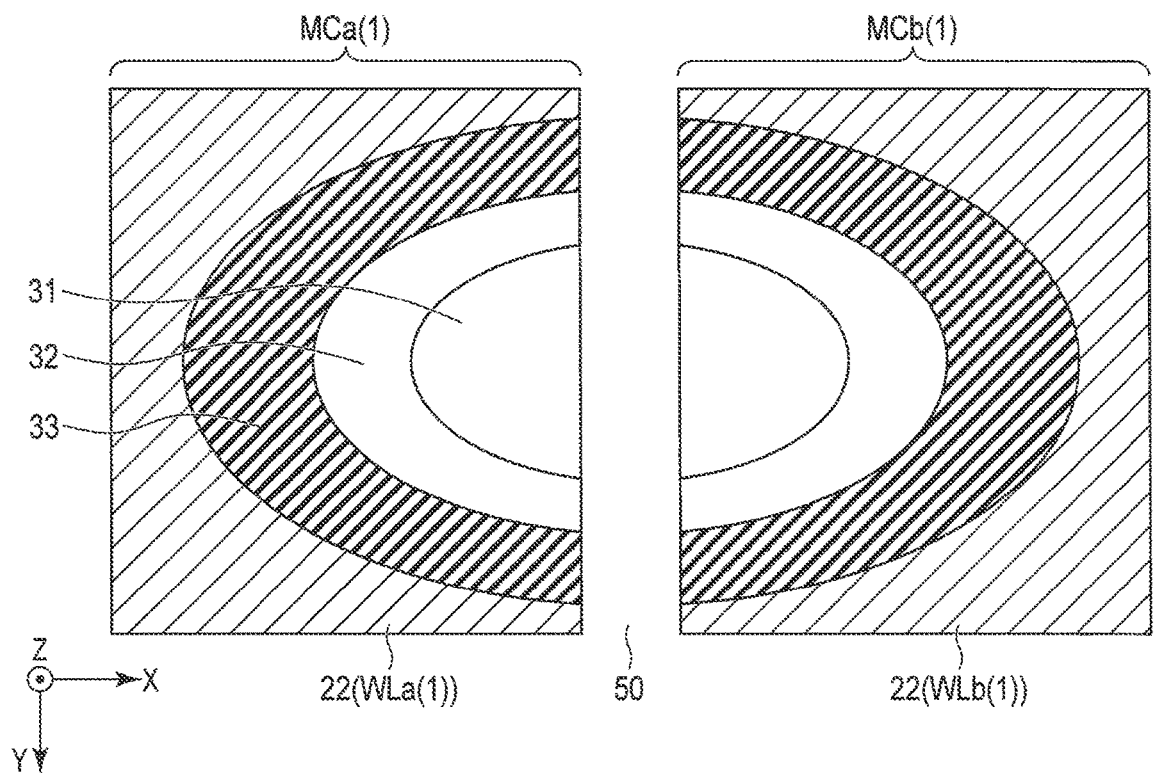
FIG. 50 is a cross-sectional view showing two memory cells separated by a memory trench.
Figure 51:
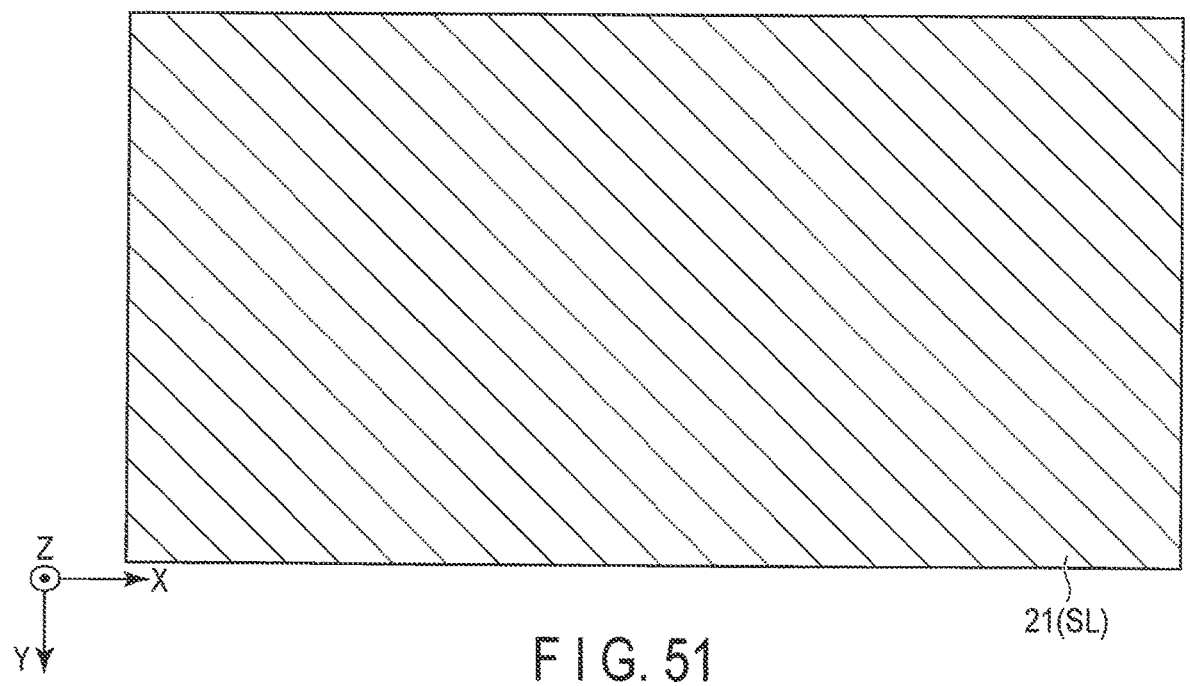
FIG. 51 is a cross-sectional view taken along line G2-G2 of FIGS. 45 and 46.
Figure 52:
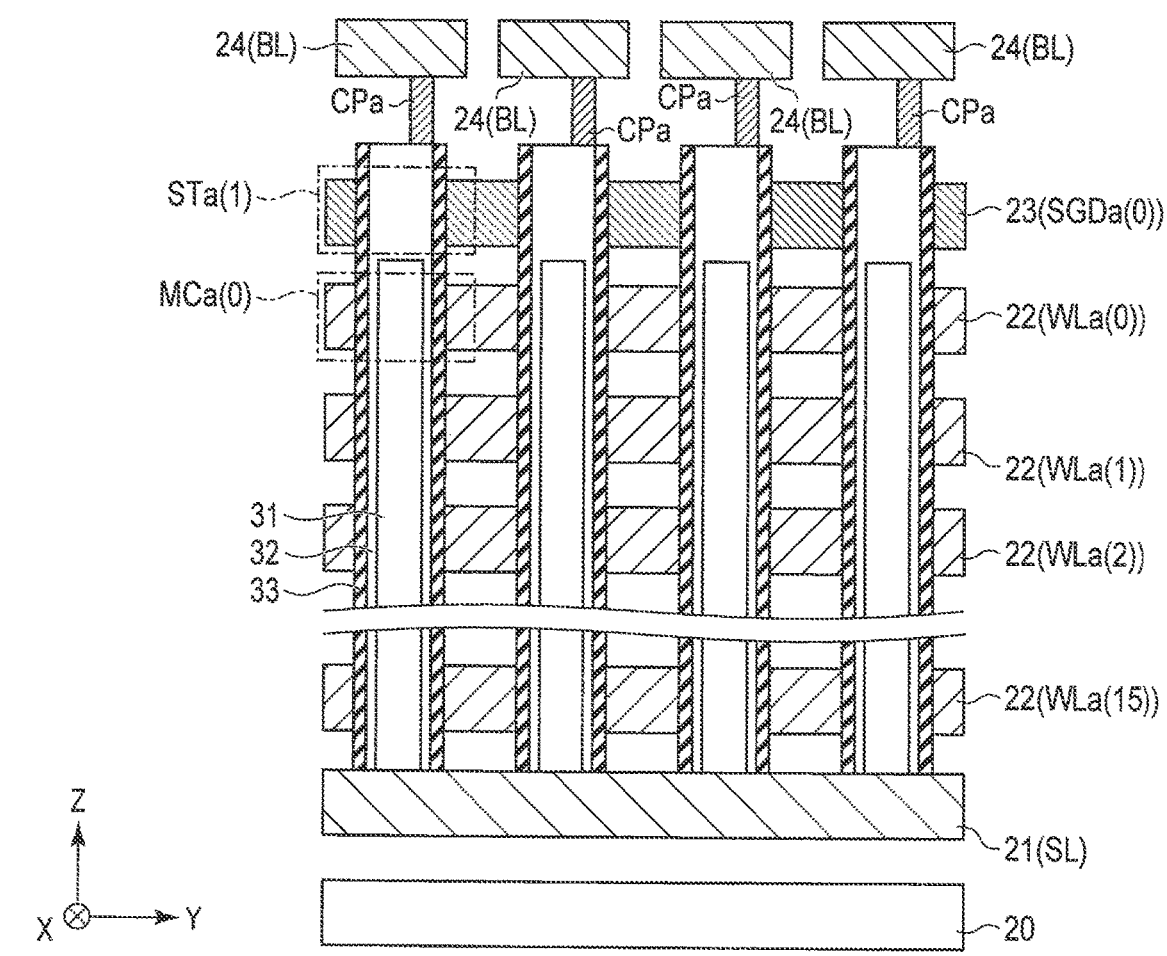
FIG. 52 is a cross-sectional view taken along line H2-H2 of FIGS. 45 and 46.
Figure 53:
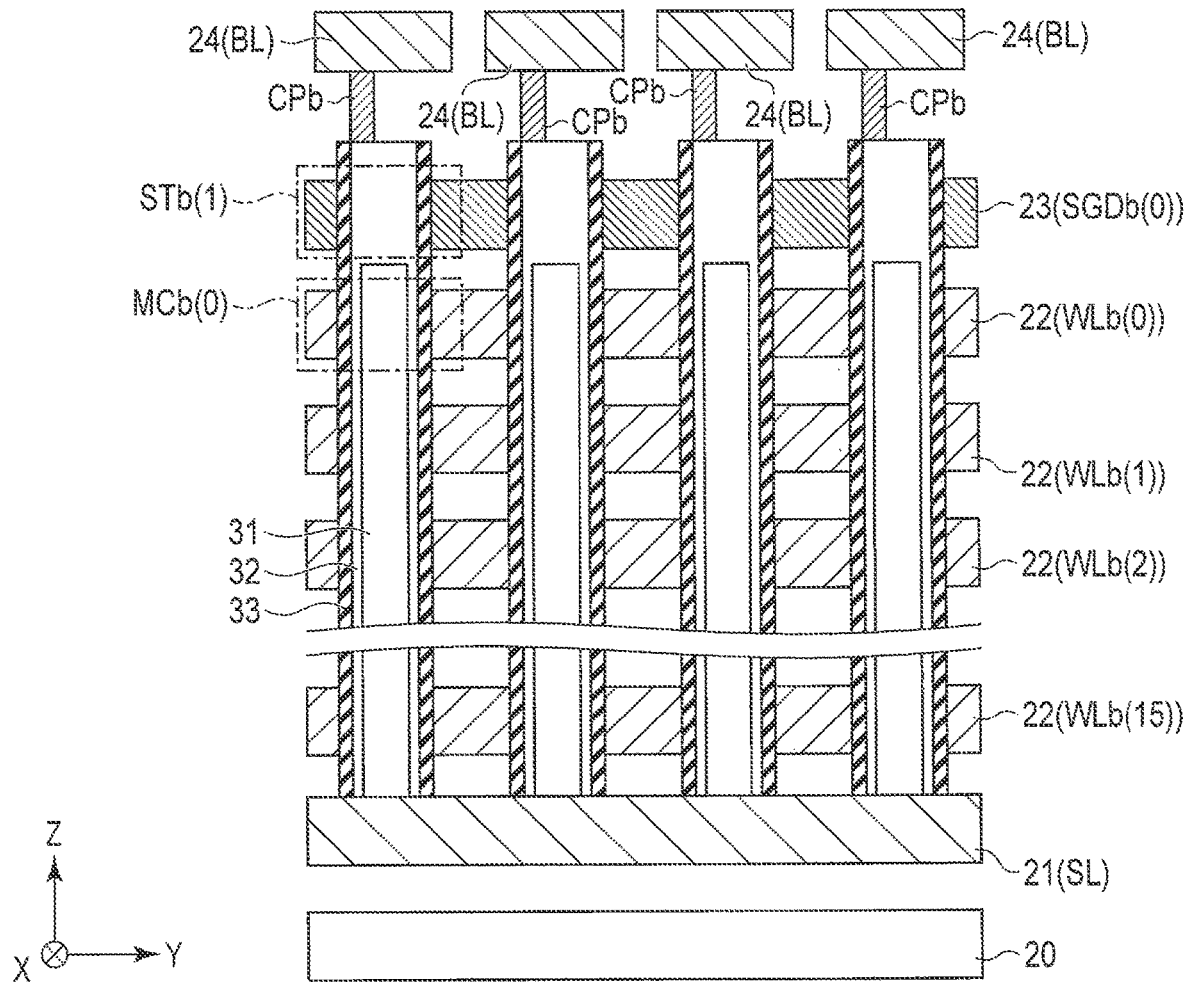
FIG. 53 is a cross-sectional view taken along line 12-12 of FIGS. 45 and 46.

FIG. 44 is a cross-sectional view showing a relationship between bit lines BL of a memory cell array 110 included in a memory chip 100 according to the second embodiment, and contact plugs that couples the bit line BL and a memory pillar. FIG. 45 is a cross-sectional view taken along line A2-A2 of FIG. 44. FIG. 46 is a cross-sectional view taken along line B2-B2 of FIG. 44. FIG. 44 corresponds to a cross-sectional view taken along line C2-C2 of FIGS. 45 and 46. FIG. 47 is a cross-sectional view taken along line D2-D2 of FIGS. 45 and 46. FIG. 48 is a cross-sectional view taken along line E2-E2 of FIGS. 45 and 46. FIG. 49 is a cross-sectional view taken along line F2-F2 of FIGS. 45 and 46. FIG. 50 is a cross-sectional view showing two memory cells separated by a memory trench 50. FIG. 51 is a cross-sectional view taken along line G2-G2 of FIGS. 45 and 46. FIG. 52 is a cross-sectional view taken along line H2-H2 of FIGS. 45 and 46. FIG. 53 is a cross-sectional view taken along line I2-I2 of FIGS. 45 and 46.

As shown in FIGS. 44 to 53, the large difference between the memory cell array 110 in the second embodiment and the memory cell array 110 in the first embodiment is that a memory pillar MP is divided into two segments by a memory trench 50 (e.g., an insulating film) along the direction in which the word lines extend (Y direction). In accordance therewith, the number of memory cells that are provided in a memory pillar MP of the second embodiment is double the number of memory pillars MP provided in a memory pillar MP of the first embodiment. In the second embodiment, a select gate line SGD and word lines WL are also divided into two by the memory trench 50 along the direction in which the word lines extend, unlike the select gate line SGD and the word line WL of the first embodiment. This allows the sequencer 170 to select the two segments into which the memory pillar MP is divided. Also, contact plugs CPa and CPb are provided above the two segments into which the memory pillar MP is divided, and are coupled to the bit lines BL, respectively. At this time, contact plugs are provided in such a manner that adjacent memory pillars MP are not coupled to the same bit line BL. Accordingly, even when a word line WL and a select gate line SGD are selected, signals of the two segments into which the memory pillar MP is divided are selectively output to the bit line BL.

The materials described in the first embodiment may be adopted for the memory element MR of the memory cell MC. Specifically, a memory element MR may be configured to include one of (I) an alloy-based phase-change element ($Ge_2Sb_2Te_5$), (II) an interfacial phase-change element of GeTe and $Sb_2Te_3$ that are alternately stacked, (III) an interfacial phase-change element of GeTe and BiSbTe that are alternately stacked, (IV) an alternate layer stack of Ge, Sb, and Te, or a chalcogenide material, (V) a variable resistance film of $TiO_x$, $WO_x$, $HfO_x$, $TaO_x$, etc., and (VI) an MTJ element of a CoFe alloy, NiFe alloy, etc.

<2-2> Operation

Next, an outline of an operation of the memory chip 100 according to the second embodiment will be described.

In the memory chip 100 according to the second embodiment, read and write operations are performed by letting a current flow between the bit line BL and the source line SL.

Figure 54:
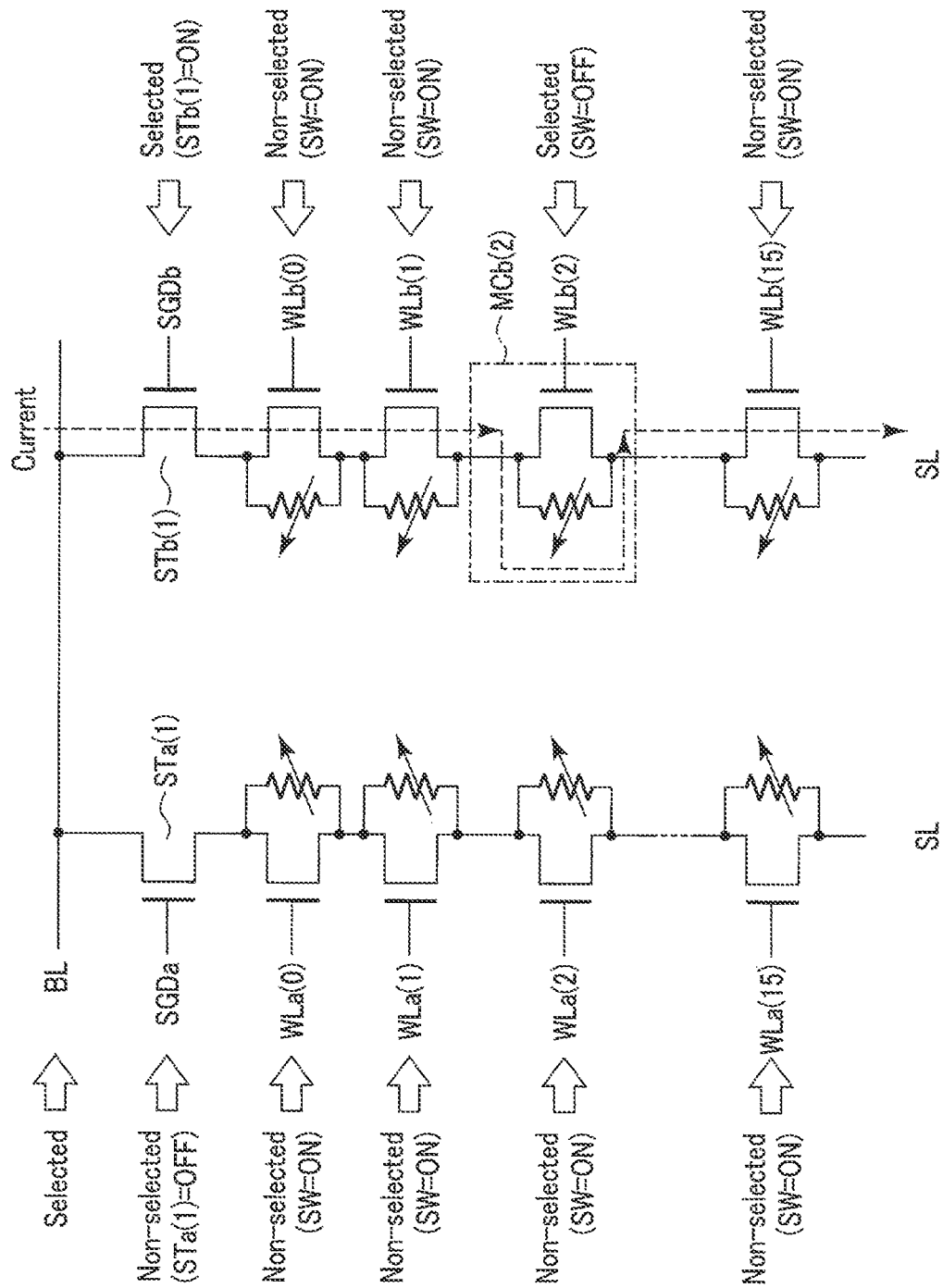
FIG. 54 is a circuit diagram in which two memory cell strings are extracted.

A brief description will be given of a method of selecting a memory cell MC that performs a read or write operation, with reference to FIGS. 54 and 55. FIG. 54 is a circuit diagram in which two memory cell strings MS are extracted.

FIG. 55 is a cross-sectional view in which a memory pillar MP corresponding to two memory cell strings MS is extracted.

As shown in FIGS. 54 and 55, a predetermined voltage is applied to a select gate line SGDb of a select transistor STb(1) that is in contact with a memory pillar MP to which a memory cell MC (e.g., MCb(2)) to be selected belongs. Thereby, an inversion layer is formed in a semiconductor layer 32 of the select transistor STb(1), allowing a current to flow therethrough (the select transistor STb(1) is switched on). This causes the bit line BL, the select transistor STb(1), and the semiconductor layer of the memory pillar MP that is in contact with the select transistor STb(1) to be brought into conduction. Also, a voltage of the word line WLb(2) corresponding to the selected memory cell MCb(2) is not increased, and voltages of word lines WLb(0), (1), (3)-(15) and WLa(0)-(15) corresponding to the non-selected memory cells MC are increased. Thereby, a current path between the bit line BL and the source line SL flows through a variable resistance layer MR in the memory cell MCb(2) to be selected, and flows through semiconductor layers 32 of selectors SW in the non-selected memory cells MC. Since the select transistor STa(1) is switched off, a current does not flow through the memory pillar MP corresponding to the select transistor STa(1).

With the above-described configuration, it is possible to select a variable resistance layer both in a read operation and a write operation. When the present scheme is compared with a three-dimensional NAND-type flash memory, it has the advantages that it can operate at a lower voltage and at a higher speed, that there are less restrictions on the number of times of rewriting, and that the writing time is shorter.

<2-3> Advantageous Effect

According to the above-described embodiment, the memory pillar of the first embodiment is divided into two segments, and thereby the number of memory cells is doubled. In this case, too, an advantageous effect similar to that of the first embodiment can be obtained.

<2-4> First Modification

<2-4-1> Overview

Next, a first modification of the second embodiment will be described. In the above-described embodiment, a conductive layer is disposed as a source line in parallel with a semiconductor substrate. However, in a first modification of the second embodiment, a conductive layer corresponding to the source line functions as a semiconductor layer (P-well region), and a select transistor ST (2) is provided between a source line and a memory cell.

<2-4-2> Circuit Configuration of Memory Cell Array 110

A circuit configuration (equivalent circuit) of a memory cell array 110 according to a first modification of the second embodiment will be described with reference to FIG. 56.

Figure 56:
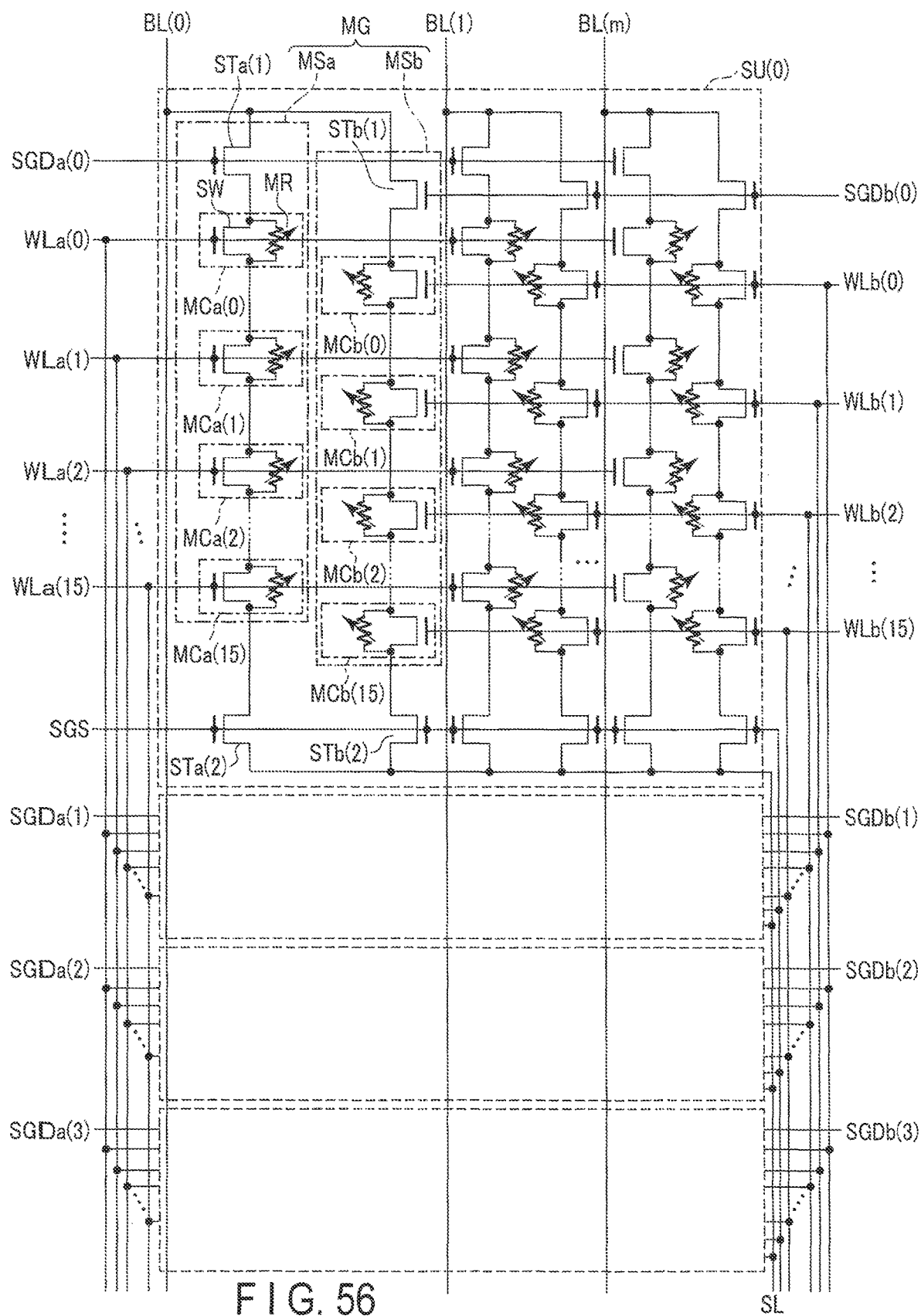
FIG. 56 is a circuit diagram showing a circuit (equivalent circuit) of a memory cell array.

As shown in FIG. 56, each memory cell string MS further includes, for example, a select transistor ST(2) in addition to 16 memory cells MC (MC(0) to MC(15)) and a select transistor ST(1), in contrast to the circuit shown in FIG. 43. In the example of FIG. 56, a memory element MR that is coupled in parallel with a select transistor ST(1) or ST(2) is not provided; however, the configuration is not limited thereto. To simplify the processing, a memory element MR that is coupled in parallel to both of or one of the select transistors ST(1) and ST(2) may be provided.

Gates of select transistors STa(2) and gates of select transistors STb(2) in a block BLK are commonly coupled to a select gate line SGS. The select gate line SGS may be provided for each string unit SU.

When select transistors STa(2) and STb(2) are not distinguished from one another, they will be referred to as "select transistors ST(2)". The number of select transistors ST(2) included in each memory cell string MS may be designed to be any number greater than one.

Both the select gate lines SGD and SGS and the word lines WL are independently controlled by the row decoder 120.

Drains of select transistors ST(2) of memory cell strings MS in the same column in the memory cell array 110 are coupled to a source of a memory cell MC(15), and sources of the select transistors ST(2) are commonly coupled to the source line SL.

By bringing the select gate line SGS of the select transistor ST(2) to the H level, an inversion layer is formed in the semiconductor layer of the select transistor ST(2) and the semiconductor substrate, allowing a current to flow through the source line.

<2-4-3> Structure of Memory Cell Array 110

Hereinafter, an example of a structure of the memory cell array 110 according to the first modification of the second embodiment will be described.

In the drawings to which reference will be made below, an "X direction" refers to a direction in which the bit lines BL extend, a "Y direction" corresponds to a direction in which the word lines WL extend, and a "Z direction" corresponds to a direction vertical to a surface of the semiconductor substrate 20 on which the memory cell array 110 is formed. In the drawings, components such as insulating layers (interlayer insulating films), interconnects, contact plugs, etc. are suitably omitted for ease of reference.

FIG. 57 is a cross-sectional view showing a relationship between bit lines BL of a memory cell array 110 included in a memory chip 100 and contact plugs that couple the bit lines BL and memory pillars, according to a first modification of the second embodiment. FIG. 58 is a cross-sectional view taken along line A3-A3 of FIG. 57. FIG. 59 is a cross-sectional view taken along line B3-B3 of FIG. 57. FIG. 57 corresponds to a cross-sectional view taken along line C3-C3 of FIGS. 58 and 59.

Figure 60:
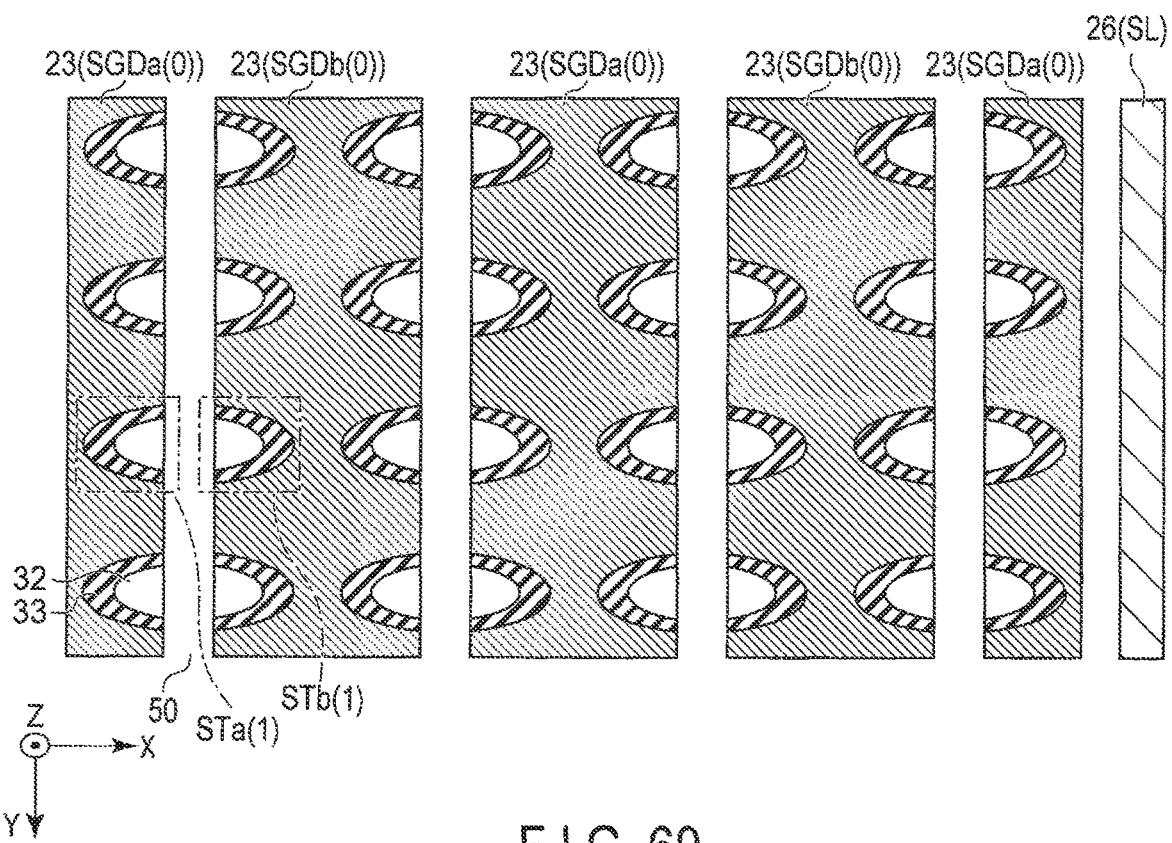
FIG. 60 is a cross-sectional view taken along line D3-D3 of FIGS. 58 and 59.
Figure 61:
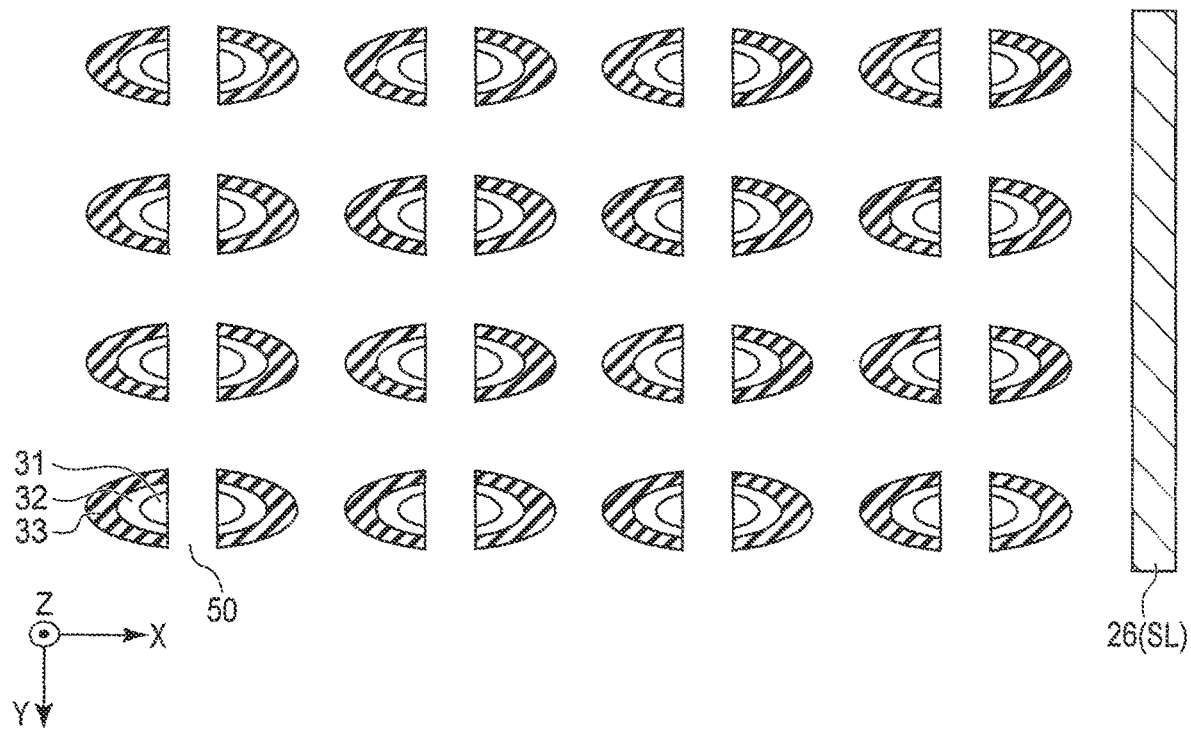
FIG. 61 is a cross-sectional view taken along line E3-E3 of FIGS. 58 and 59.
Figure 62:
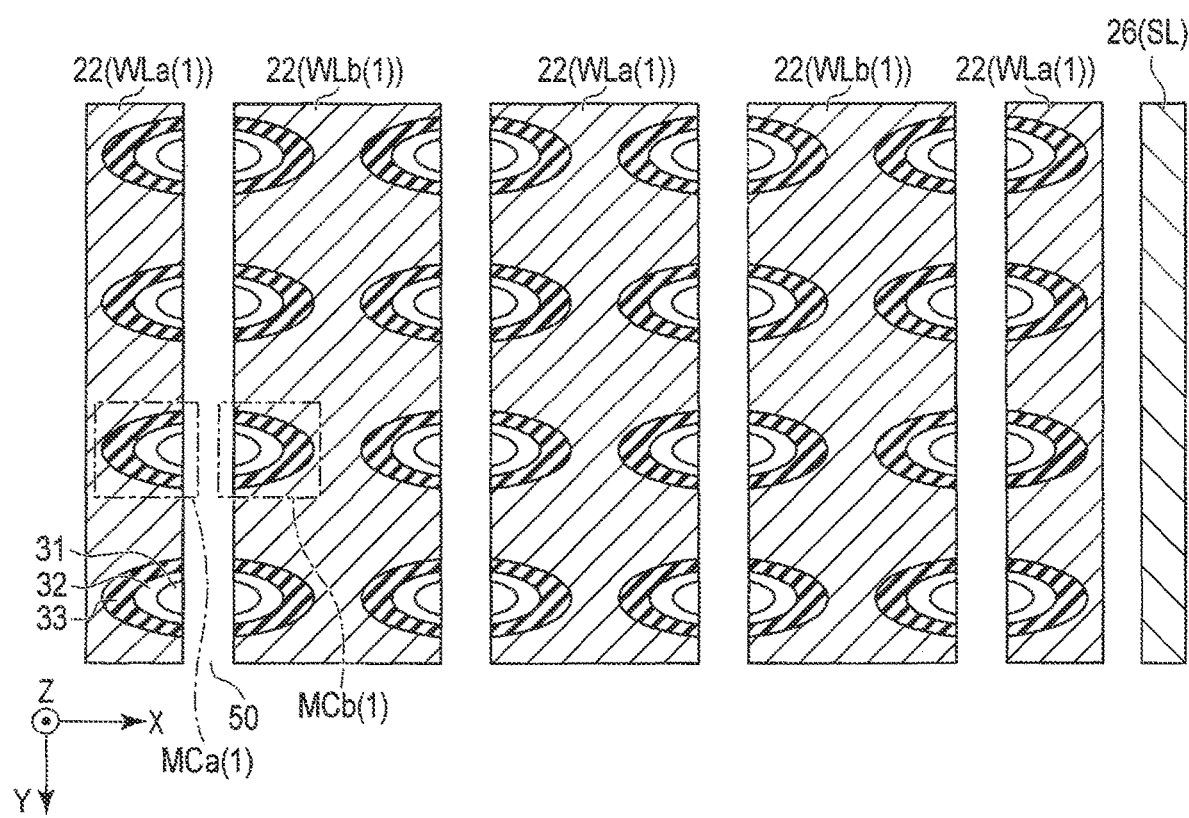
FIG. 62 is a cross-sectional view taken along line F3-F3 of FIGS. 58 and 59.
Figure 63:
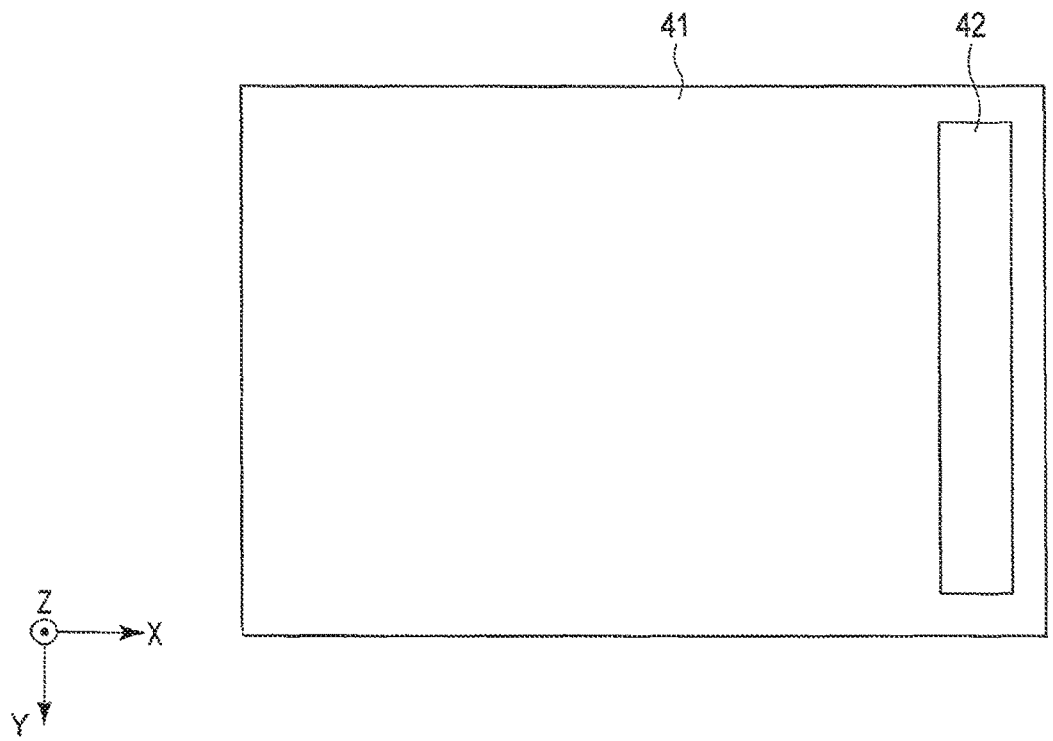
FIG. 63 is a cross-sectional view taken along line G3-G3 of FIGS. 58 and 59.
Figure 65:
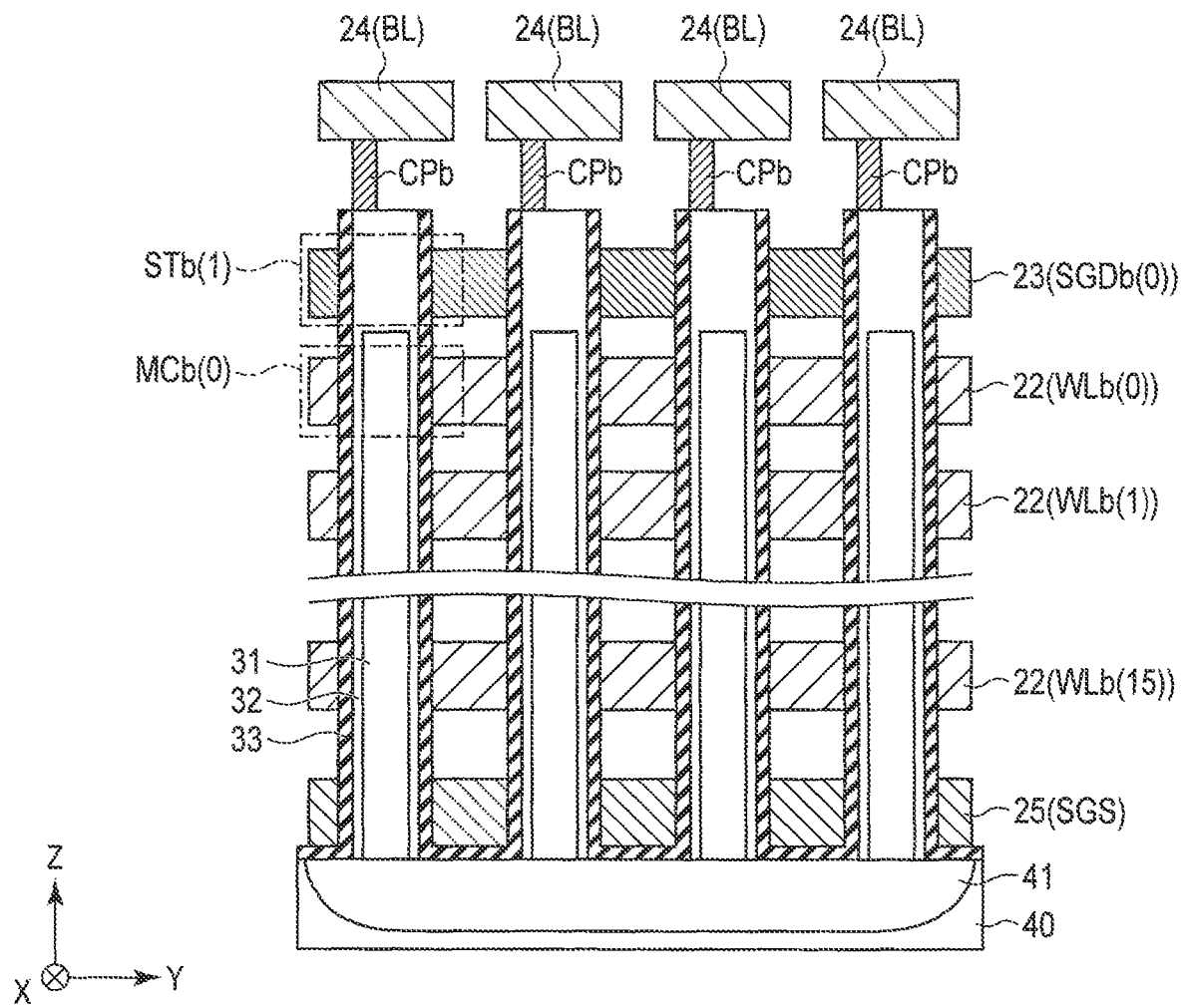
FIG. 65 is a cross-sectional view taken along line 12-12 of FIGS. 58 and 59.

FIG. 60 is a cross-sectional view taken along line D3-D3 of FIGS. 58 and 59. FIG. 61 is a cross-sectional view taken along line E3-E3 of FIGS. 58 and 59. FIG. 62 is a cross-sectional view taken along line F3-F3 of FIGS. 58 and 59. FIG. 63 is a cross-sectional view taken along line G3-G3 of FIGS. 58 and 59. FIG. 64 is a cross-sectional view taken along line H3-H3 of FIGS. 58 and 59. FIG. 65 is a cross-sectional view taken along line 13-13 of FIGS. 58 and 59.

As shown in FIGS. 57 to 65, a select transistor ST(2) is provided on a semiconductor substrate in the first modification of the second embodiment. When the select transistor ST(2) is turned on, an inversion layer is formed in a P-well region of the semiconductor substrate, and a current flows through a source line via an N-type diffusion layer provided in the semiconductor substrate.

Specifically, a P-well region 41 is provided in a surface region of the semiconductor substrate 40, and an N-type diffusion layer (N+ diffusion layer) 42 is provided in the P-well region 41. The semiconductor substrate 40 is, for example, formed in a plate shape extending along the XY plane, and contains silicon (Si).

A conductive layer 25 is provided on the P-well region 41 via an insulating film 33. The conductive layer 25 is, for example, formed in a plate shape extending along the XY plane, and functions as a select gate line SGS. The conductive layer 25 contains, for example, tungsten (W).

On the N-type diffusion layer 42, a conductive layer 26 is provided. The conductive layer 26 is, for example, formed in a plate shape extending along the ZY plane, and functions as a source line. The conductive layer 26 contains, for example, tungsten (W).

The select transistor ST(2) includes a conductive layer 25, a semiconductor layer 32, and a P-well region 41. When the conductive layer 25 is brought to an H level, an inversion layer is formed in the semiconductor layer 32 and the P-well region 41, allowing a current to flow therethrough.

Insulating layers and conductive layers 22 are alternately stacked above the conductive layer 25. The conductive layers 22 are formed, for example, in a plate shape extending along the XY plane. The conductive layers 22 are respectively used as, in the order from the side of the semiconductor substrate 40, word lines WL(15) to WL(0). The conductive layers 22 contain, for example, tungsten (W).

<2-4-4> Operation

Next, an overview of an operation of the memory chip 100 according to a first modification of the second embodiment will be described.

Read and write operations in the memory chip 100 according to the first modification of the second embodiment are performed by letting a current flow between the bit line BL and the source line SL.

A brief description will be given of a method of selecting a memory cell MC that performs a read or write operation with reference to FIGS. 66 and 67. FIG. 66 is a circuit diagram in which two memory cell strings MS are extracted. FIG. 67 is a cross-sectional view in which a memory pillar MP corresponding to two memory cell strings MS is extracted. In the present example, a memory element MR that is coupled in parallel with a select transistor ST(1) is not provided; however, the configuration is not limited thereto. To simplify the processing, a memory element MR that is coupled in parallel to both of or one of the select transistors ST(1) and ST(2) may be provided.

As shown in FIGS. 66 and 67, a predetermined voltage (positive voltage) is applied to a select gate line SGDb of a select transistor STb(1) that is in contact with a memory pillar MP to which a memory cell MC (e.g., MCb(2)) to be selected belongs. Thereby, an inversion layer is formed in a semiconductor layer 32 of the select transistor STb(1), allowing a current to flow therethrough (the select transistor STb(1) is switched on). This causes the bit line BL, the select transistor STb(1), and the semiconductor layer 32 of the memory pillar MP that is in contact with the select transistor STb(1) to be brought into conduction. Also, a voltage of the word line WLb(2) corresponding to the selected memory cell MCb(2) is not increased, and voltages of word lines WLb(0), (1), (3)-(15) and WLa(0)-(15) corresponding to the non-selected memory cells MC are increased. Thereby, a current path between the bit line BL and the source line SL flows through a variable resistance layer MR in the memory cell MCb (2) to be selected, and flows through semiconductor layers 32 of selectors SW in the non-selected memory cells MC. Also, a predetermined voltage is applied to the select gate line SGS of the select transistor ST(2). Thereby, an inversion layer is formed in a semiconductor layer 32 of the select transistor ST(2), allowing a current to flow therethrough (the select transistor ST(1) is switched on). This causes the bit line BL, the select transistor STb(1), the semiconductor layer 32 of the memory pillar MP that is in contact with the select transistor STb(1), the select transistor STb(2), and the source line SL to be brought into conduction.

With the above-described configuration, it is possible to select a variable resistance layer both in a read operation and a write operation. When the present scheme is compared with a three-dimensional NAND-type flash memory, it has the advantages that it can operate at a lower voltage and at a higher speed, that there are less restrictions on the number of times of rewriting, and that the writing time is shorter.

<2-5> Modification 2

Next, a second modification of the second embodiment will be described. In the second modification of the second embodiment, another example of a memory cell MC will be described.

<2-5-1> Pattern 1

Figure 68:
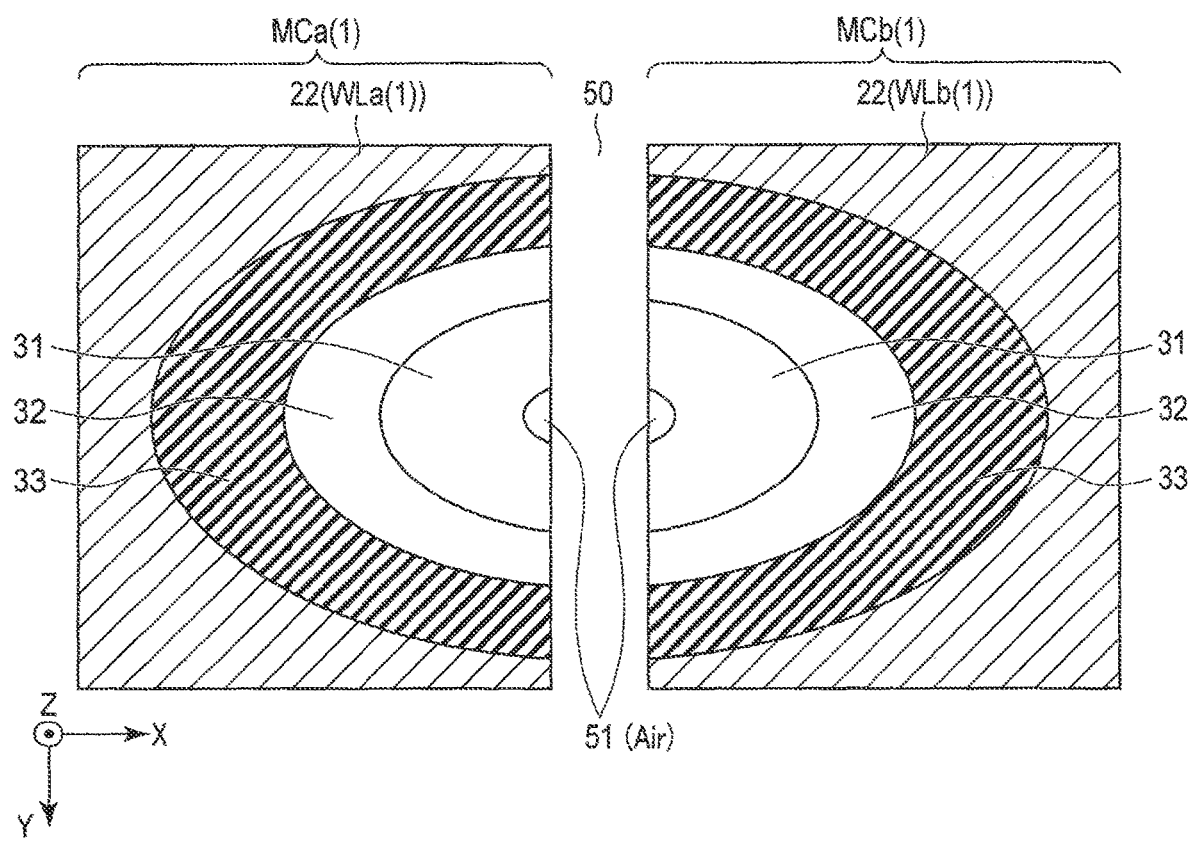
FIG. 68 is a cross-sectional view in which two memory cells are extracted.

Next, Pattern 1 of the second modification of the second embodiment will be described with reference to FIG. 68. FIG. 68 is a cross-sectional view in which two memory cells MC are extracted. A memory cell MC is configured in such a manner that an insulating layer 33, a semiconductor layer 32, a variable resistance layer 31, and air 51 are provided in a memory hole MH that penetrates the conductive layers 22, as shown in FIG. 68. The difference from the second embodiment is that the air 51 is provided at the center of the memory pillar.

<2-5-2> Pattern 2

Figure 69:
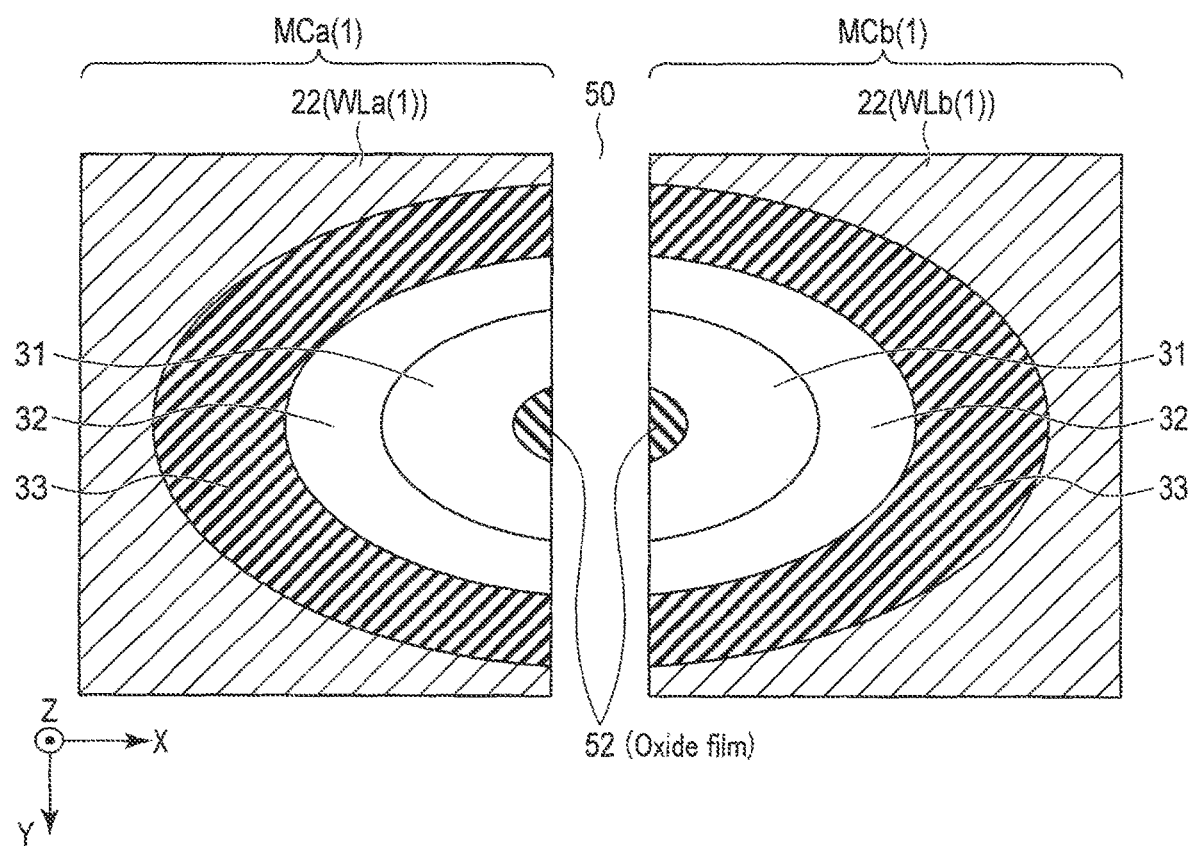
FIG. 69 is a cross-sectional view in which two memory cells are extracted.

Next, Pattern 2 of the second modification of the second embodiment will be described, with reference to FIG. 69. FIG. 69 is a cross-sectional view in which two memory cells MC are extracted. A memory cell MC is configured in such a manner that an insulating layer 33, a semiconductor layer 32, a variable resistance layer 31, and a silicon oxide film (core oxide film) 52 are provided in a memory hole MH that penetrates the conductive layers 22, as shown in FIG. 69. The difference from Pattern 1 is that a silicon oxide film 52 is provided in the memory pillar MP, instead of the air 51.

<3> Third Embodiment

Next, a third embodiment will be described. For comparison with the third embodiment, a relationship between memory pillars MP and bit lines BL in the first embodiment and the second embodiment will be described. In the third embodiment, a description of matters similar to those of the above-described embodiments, or matters that can be inferred by analogy, will be omitted.

<3-1> Relationship Between Memory Pillars and Bit Lines According to First Embodiment First, a relationship between memory pillars and bit lines according to the first embodiment will be described.

Figure 70:
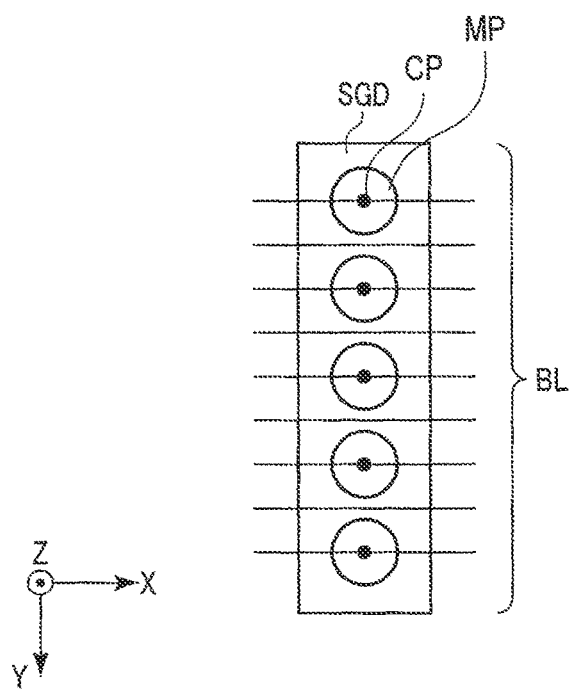
FIG. 70 is a plan view showing a first example of a relationship between a memory pillar and a bit line according to the first embodiment.
Figure 71:
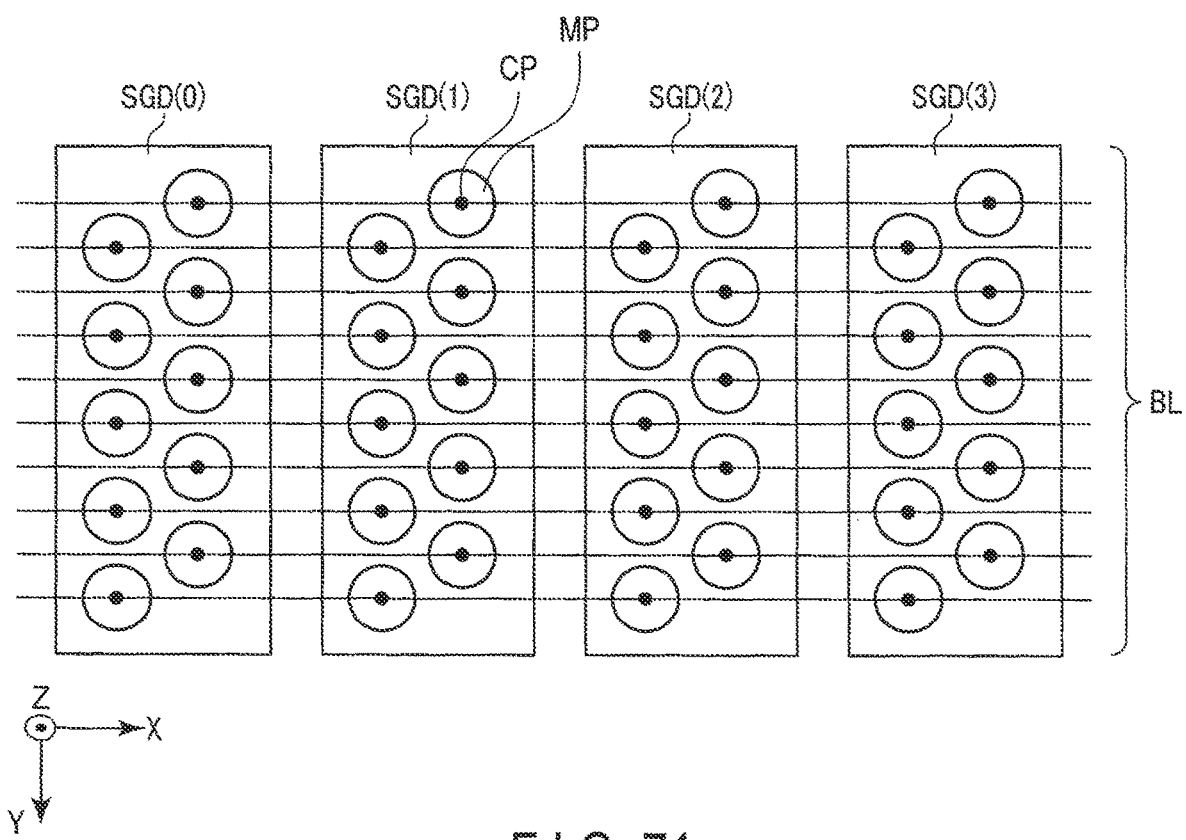
FIG. 71 is a plan view showing a second example of a relationship between memory pillars and bit lines according to the first embodiment.
Figure 73:
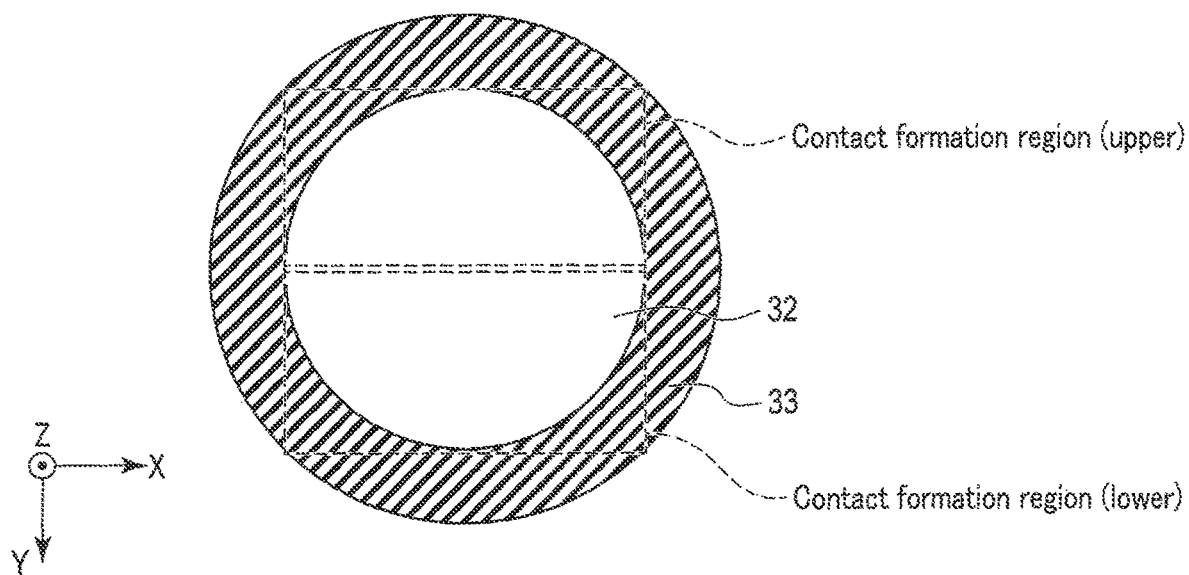
FIG. 73 is a cross-sectional view showing J in FIG. 72.

FIG. 70 is a plan view showing a first example of a relationship between memory pillars MP and bit lines BL according to the first embodiment. FIG. 71 is a plan view showing a second example of a relationship between memory pillars MP and bit lines BL according to the first embodiment. FIG. 72 is a plan view showing a third example of a relationship between memory pillars MP and bit lines BL according to the first embodiment. FIG. 73 is a cross-sectional view showing J in FIG. 72.

As shown in FIG. 70, in the first example, a single bit line BL is arranged on a memory pillar, and the memory pillar MP and the bit line BL are coupled via a contact plug CP.

As shown in FIG. 71, in the second example, memory pillars MP may be arranged in a staggered manner in a direction in which the bit lines extend. In this case, memory pillars adjacent to each other in the X direction are coupled to different bit lines BL.

As shown in FIGS. 72 and 73, in the third example, two patterns (see the contact formation region in FIG. 73) are prepared as the position of contact plugs CP provided on the memory pillars MP, and thereby two bit lines BL are arranged on the memory pillars MP, and the memory pillars MP and the bit lines BL are coupled via contact plugs CP.

As shown in FIG. 73, a contact plug CP provided on the memory pillar MP is positioned on the contact formation region.

<3-2> Relationship Between Memory Pillars and Bit Lines According to Second Embodiment Next, a relationship between memory pillars MP and bit lines BL according to the second embodiment will be described.

Figure 74:
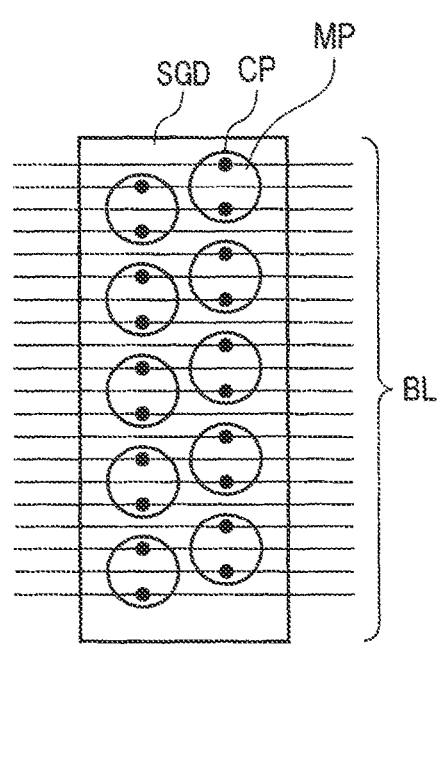
FIG. 74 is a plan view showing a first example of a relationship between a memory pillar and a bit line according to the second embodiment.
Figure 75:
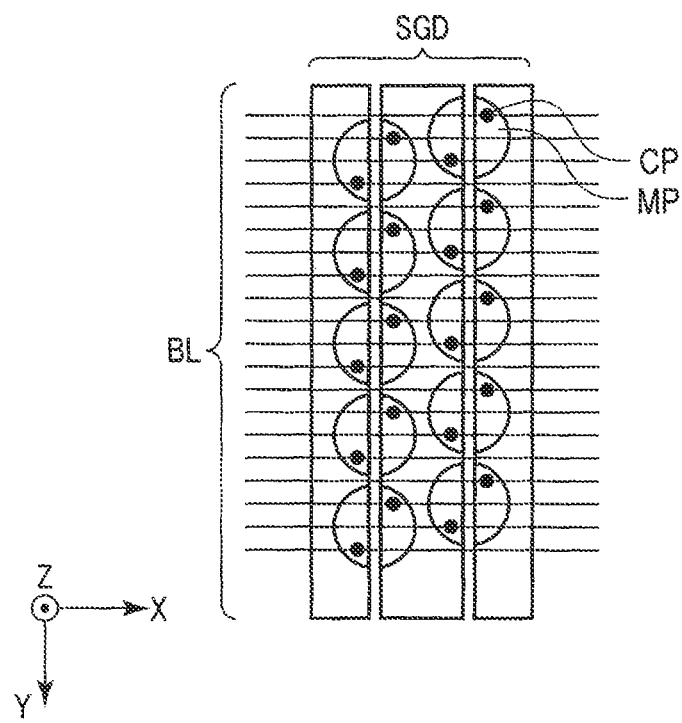
FIG. 75 is a plan view showing a second example of a relationship between memory pillars and bit lines according to the second embodiment.
Figure 76:
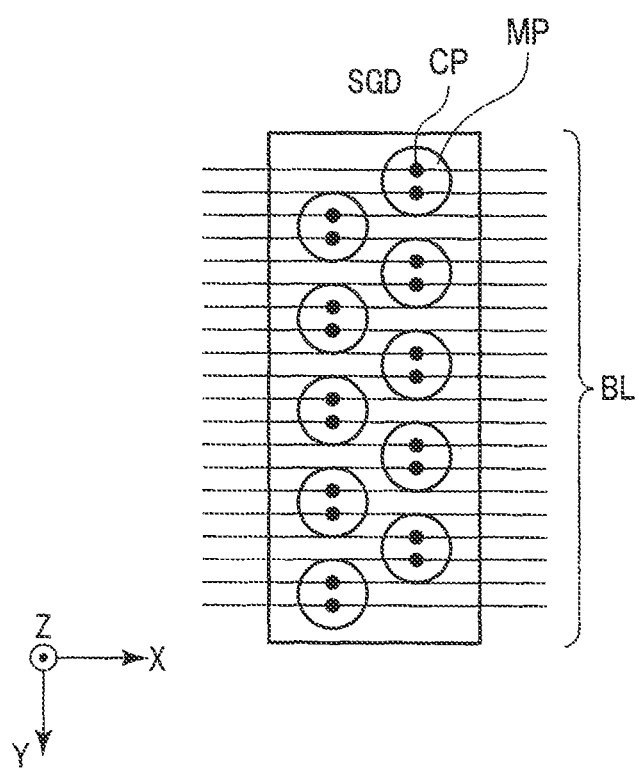
FIG. 76 is a plan view showing a third example of a relationship between memory pillars and bit lines according to the second embodiment.
Figure 77:
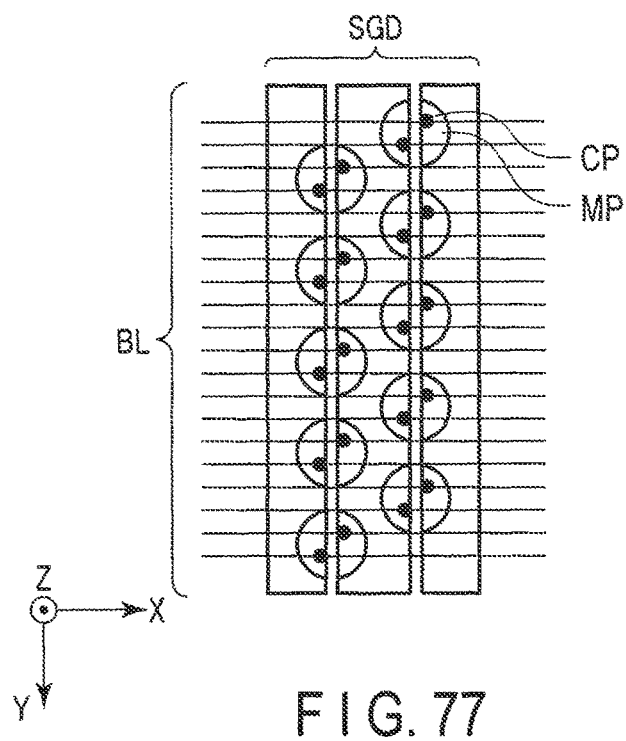
FIG. 77 is a plan view showing a fourth example of a relationship between memory pillars and bit lines according to the second embodiment.
Figure 78:
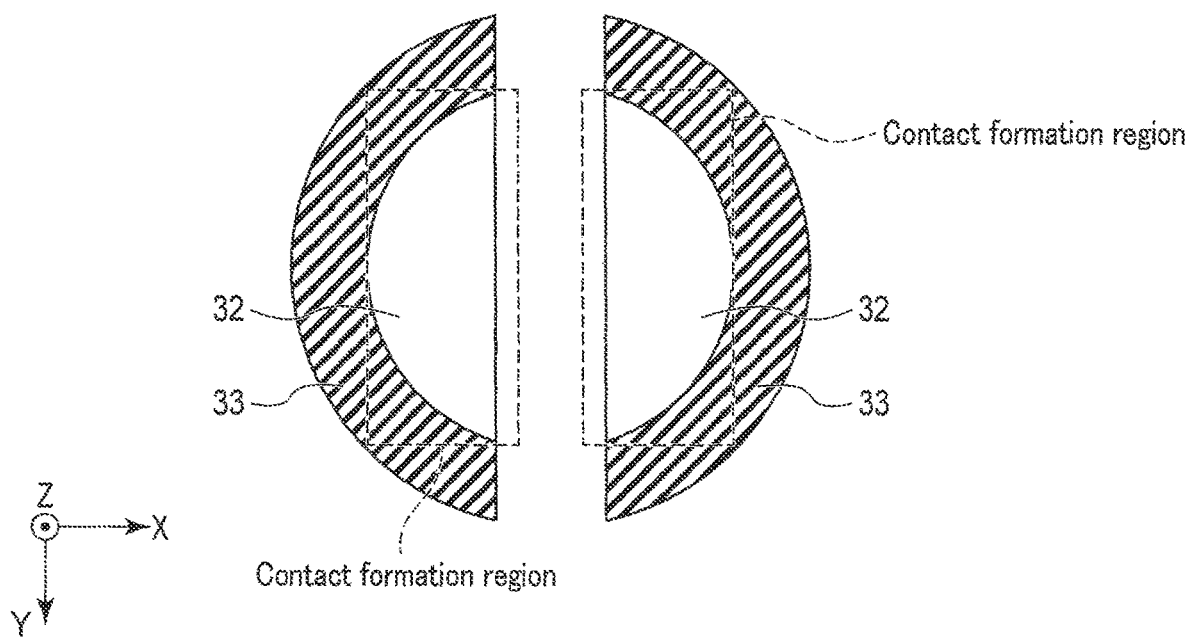
FIG. 78 is a cross-sectional view showing a memory pillar.

FIG. 74 is a plan view showing a first example of a relationship between memory pillars MP and bit lines BL according to the second embodiment. FIG. 75 is a plan view showing a second example of a relationship between memory pillars MP and bit lines BL according to the second embodiment. FIG. 76 is a plan view showing a third example of a relationship between memory pillars MP and bit lines BL according to the second embodiment. FIG. 77 is a plan view showing a fourth example of a relationship between memory pillars MP and bit lines BL according to the second embodiment. FIG. 78 is a cross-sectional view showing a memory pillar MP.

As shown in FIGS. 74 to 77, in first to fourth examples, four bit lines BL are arranged on a memory pillar MP, and the memory pillar MP and the bit line BL are coupled via a contact plug CP.

As shown in FIG. 78, a contact plug CP provided on the memory pillar MP is positioned on the contact formation region.

<4> Others

The above-described embodiments include the following aspects:

[1]
A memory device is configured of: a memory cell including a columnar-shaped or cylindrical variable resistance memory region, with its outer periphery covered with a cylindrical silicon region (semiconductor layer), with its outer periphery further covered with a first voltage application electrode via an oxide film; and a memory string including the memory cells that are stacked on one another on a silicon substrate (semiconductor substrate) in a perpendicular direction and a select element that is coupled to one end of the stack of the memory cells, with one end of the memory string coupled to a data reading/writing bit line, and another end of the memory cell string coupled to a second voltage application electrode.

[2]
A memory device is configured of: a memory cell including a variable resistance memory region, a silicon region adjacent thereto, and a first voltage application electrode that is in contact with the silicon region via an oxide film; a memory cell string including the memory cells that are stacked so as to be coupled via the silicon regions, and a select element that is coupled to one end of the stack of memory cells, with one end of the memory string coupled to a data reading/writing bit line, and another end of the memory cell string coupled to a second voltage application electrode.

[3]
In the memory device according to [1] or [2],
the second voltage application electrode is shared among a plurality of memory cell strings that are adjacent to each other in a direction of the data reading/writing bit line.

[4]
In the memory device according to one of [1] to [3],
the first voltage application electrode is shared among a plurality of memory cell strings that are adjacent to each other in a direction perpendicular to the direction of the data reading/writing bitline.

[5]
In the memory device according to one of [1] to [4],
silicon nitride is disposed inside the cylindrical variable resistance layer.

[6]
In the memory device according to one of [1] to [4],
an air layer is disposed inside the cylindrical variable resistance layer.

[7]
In the memory device according to one of [1] to [4],
a core oxide film layer is disposed inside the cylindrical variable resistance layer.

[8]
In the memory device according to one of [1] to [4],
the variable resistance layer is a phase-change element, and contains at least one of: GeTe and $Sb_2Te_3$; GeTe and BiSbTe; or Ge, Sb, and Te or a chalcogenide material.

[9]
In the memory device according to one of [1] to [4],
the variable resistance memory region contains at least one of $TiO_x$, $WO_x$, $HfO_x$, or $TaO_x$.

[10]
In the memory device according to [8],
the phase-change elements are alternately stacked in a direction perpendicular to the substrate.

[11]
In the memory device according to one of [1] to [4],
two most adjacent memory cell strings that are respectively coupled to two adjacent data reading/writing bit lines are shifted in a direction of the data reading/writing bit lines.

[12]
A memory device is configured by alternately stacking a first voltage application layer and an insulating layer in a direction perpendicular to a silicon substrate, opening a memory hole through the layers stack in a direction perpendicular to the substrate, covering the memory hole with a silicon region to form a cylindrical shape, filling an inside of a region covered with the silicon region with a variable resistance memory element, coupling a topmost layer of the silicon region to a data reading/writing bit line via a select element, and coupling a second voltage application layer to a bottommost layer of the silicon region.

[13]
In the memory device according to [12],
the variable resistance element is divided into a plurality of segments in the memory cell hole in a direction of the silicon substrate.

[14]
In the memory device according to one of [1] to [4],
a memory cell array is configured by arranging the memory cell strings, a plurality of data reading/writing bit lines are arranged in the memory cell array, and data is read/written by applying a voltage between some of the data reading/writing bit lines and the second voltage application electrode.

[15]

A first voltage application layer is shared among a plurality of memory cell strings that are adjacent to each other in a direction of a bit line.

In the above-described embodiments, the variable resistance layer 31 extends over a plurality of memory cells MC in the Z direction; however, the configuration is not limited thereto. That is, the variable resistance layer 31 may be divided into a plurality of segments in a memory cell hole in the Z direction. In other words, the variable resistance layer 31 may be divided for each word line WL in the Z direction.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device, comprising:
a plurality of first memory cells each including:
a first variable resistance memory region extending in a first direction that is orthogonal to a semiconductor substrate;
a first semiconductor layer extending in the first direction and being in contact with the first variable resistance memory region; and
a first insulating layer extending in the first direction and being in contact with the first semiconductor layer,
wherein the first memory cells are connected in series along the first direction, and an air layer is provided inside the first variable resistance memory region;
a plurality of first word lines each extending in a second direction that is orthogonal to the first direction and being in contact with the first insulating layer;
a first select transistor including:
a second semiconductor layer extending in the first direction; and
a second insulating layer extending in the first direction and being in contact with the second semiconductor layer,
wherein one end of the first select transistor is coupled to one end of an uppermost one of the first memory cells in the first direction, and the first select transistor and the first memory cells form a first memory cell string;
a first select gate line extending in the second direction and being in contact with the second insulating layer;
a first bit line extending in a third direction that is orthogonal to each of the first direction and the second direction, the first bit line being coupled to the other end of the first select transistor; and
a source line extending in the second direction and the third direction, the source line being coupled to one end of a lowermost one of the first memory cells in the first direction,
wherein, during a read operation to a selected one of the first memory cells connected to a selected one of the first word lines:

at a first timing:
a first voltage is supplied to the selected one of the first word lines;
a second voltage is supplied to remaining ones of the first word lines other than the selected one of the first word lines;
a third voltage lower than the first voltage and the second voltage is supplied to the first select gate line;
a fourth voltage is supplied to the first bit line; and
the fourth voltage is supplied to the source line,
at a second timing after the first timing:
a fifth voltage lower than the first voltage is supplied to the selected one of the first word lines, and
at a third timing after the second timing:
a sixth voltage different from the fourth voltage is supplied to one of the first bit line and the source line.

2. The memory device according to claim 1, further comprising:
a plurality of second memory cells each including:
a second variable resistance memory region extending in the first direction;
a third semiconductor layer extending in the first direction and being in contact with the second variable resistance memory region; and
a third insulating layer extending in the first direction and being in contact with the third semiconductor layer,
wherein the second memory cells are connected in series along the first direction; and
a second select transistor including:
a fourth semiconductor layer extending in the first direction; and
a fourth insulating layer extending in the first direction and being in contact with the fourth semiconductor layer,
wherein one end of the second select transistor is coupled to one end of an uppermost one of the second memory cells in the first direction, the other end of the second select transistor is coupled to the first bit line, and the second select transistor and the second memory cells form a second memory cell string, and
wherein the source line is commonly coupled to the first memory cell string and the second memory cell string that are adjacent to each other in the third direction.

3. The memory device according to claim 1, wherein the first variable resistance memory region is a phase-change element, and contains at least one of: GeTe and $Sb_2Te_3$; GeTe and BiSbTe; or Ge, Sb, and Te or a chalcogenide material.

4. The memory device according to claim 1, wherein the first variable resistance memory region contains at least one of $TiO_x$, $WO_x$, $HfO_x$, or $TaO_x$.

5. The memory device according to claim 2, further comprising:
a plurality of third memory cells each including:
a third variable resistance memory region extending in the first direction;
a fifth semiconductor layer extending in the first direction and being in contact with the third variable resistance memory region; and
a fifth insulating layer extending in the first direction and being in contact with the fifth semiconductor layer and with the first word line,
wherein the third memory cells are connected in series along the first direction;

a third select transistor including:
  a sixth semiconductor layer extending in the first direction; and
  a sixth insulating layer extending in the first direction and being in contact with the sixth semiconductor layer,
  wherein one end of the third select transistor is coupled to one end of an uppermost one of the third memory cells in the first direction, and the third select transistor and the third memory cells form a third memory cell string;
a second bit line extending in the third direction in parallel with the first bit line, the second bit line being coupled to the other end of the third select transistor; and
a sequencer configured to simultaneously perform a write operation to each of a selected one of the first memory cells and a selected one of the third memory cells that are connected to a selected one of the first word lines while applying different voltages to the first bit line and the second bit line.

6. The memory device according to claim 1, wherein, during the read operation to the selected one of the first memory cells connected to the selected one of the first word lines:
  at the second timing:
    the second voltage is supplied to the remaining ones of the first word lines;
    the third voltage is supplied to the first select gate line;
    the fourth voltage is supplied to the first bit line; and
    the fourth voltage is supplied to the source line, and
  at the third timing:
    the second voltage is supplied to the remaining ones of the first word lines; and
    a seventh voltage higher than the third voltage is supplied to the first select gate line.

7. The memory device according to claim 6, wherein, during the read operation to the selected one of the first memory cells connected to the selected one of the first word lines:
  at a fourth timing after the third timing:
    the fifth voltage is supplied to the selected one of the first word lines;
    the second voltage is supplied to the remaining ones of the first word lines;
    the third voltage is supplied to the first select gate line; and
    the fourth voltage is supplied the source line, and
  at a fifth timing after the fourth timing:
    the first voltage is supplied to the selected one of the first word lines;
    the second voltage is supplied to the remaining ones of the first word lines;
    the third voltage is supplied to the first select gate line;
    the fourth voltage is supplied to the first bit line; and
    the fourth voltage is supplied to the source line.

8. The memory device according to claim 7, wherein:
the second voltage is the same as the first voltage;
the sixth voltage is higher than the fourth voltage; and
during the read operation to the selected one of the first memory cells connected to the selected one of the first word lines:
  at the third timing:
    the sixth voltage is supplied to the first bit line; and
    the fourth voltage is supplied to the source line.

9. A memory device comprising:
a plurality of first memory cells each including:
  a first variable resistance memory region extending in a first direction that is orthogonal to a semiconductor substrate;
  a first semiconductor layer extending in the first direction and being in contact with the first variable resistance memory region; and
  a first insulating layer extending in the first direction and being in contact with the first semiconductor layer,
  wherein the first memory cells are connected in series along the first direction, and an air layer is provided inside the first variable resistance memory region;
a plurality of second memory cells each including:
  a second variable resistance memory region extending in the first direction;
  a second semiconductor layer extending in the first direction and being in contact with the second variable resistance memory region; and
  a second insulating layer extending in the first direction and being in contact with the second semiconductor layer,
  wherein the second memory cells are connected in series along the first direction;
a plurality of first word lines each extending in a second direction that is orthogonal to the first direction and being in contact with the first insulating layer and the second insulating layer;
a first select transistor including:
  a third semiconductor layer extending in the first direction; and
  a third insulating layer extending in the first direction and being in contact with the third semiconductor layer,
  wherein one end of the first select transistor is coupled to one end of an uppermost one of the first memory cells in the first direction, and the first select transistor and the first memory cells form a first memory cell string;
a first select gate line extending in the second direction and being in contact with the third insulating layer;
a second select transistor including:
  a fourth semiconductor layer extending in the first direction; and
  a fourth insulating layer extending in the first direction and being in contact with the fourth semiconductor layer,
  wherein one end of the second select transistor is coupled to one end of an uppermost one of the second memory cells in the first direction, and the second select transistor and the second memory cells form a second memory cell string;
a second select gate line extending in the second direction and being in contact with the fourth insulating layer;
a first bit line extending in a third direction that is orthogonal to each of the first direction and the second direction, the first bit line being coupled to the other end of the first select transistor and the second select transistor; and
a source line extending in the second direction and the third direction, the source line being coupled to one end of a lowermost one of the first memory cells in the first direction and coupled to one end of a lowermost one of the second memory cells in the first direction, wherein, during a read operation to a selected one of the first memory cells connected to a selected one of the first word lines:
- at a first timing:
  - a first voltage is supplied to the selected one of the first word lines;
  - a second voltage is supplied to remaining ones of the first word lines other than the selected one of the first word lines;
  - a third voltage lower than the first voltage and the second voltage is supplied to the first select gate line;
  - a fourth voltage is supplied to the first bit line; and the fourth voltage is supplied to the source line,
- at a second timing after the first timing:
  - a fifth voltage lower than the first voltage is supplied to the selected one of the first word lines, and
- at a third timing after the second timing:
  - a sixth voltage different from the fourth voltage is supplied to one of the first bit line and the source line.

10. The memory device according to claim 9, wherein the source line is commonly coupled to the first memory cell string and the second memory cell string which are adjacent to each other in the third direction.

11. The memory device according to claim 9, wherein the first variable resistance memory region is a phase-change element, and contains at least one of: GeTe and $Sb_2Te_3$; GeTe and BiSbTe; or Ge, Sb, and Te or a chalcogenide material.

12. The memory device according to claim 9, wherein the first variable resistance memory region contains at least one of $TiO_x$, $WO_x$, $HfO_x$, or $TaO_x$.

13. The memory device according to claim 9, further comprising:
- a plurality of third memory cells each including:
  - a third variable resistance memory region extending in the first direction;
  - a fifth semiconductor layer extending in the first direction and being in contact with the third variable resistance memory region; and
  - a fifth insulating layer extending in the first direction and being in contact with the fifth semiconductor layer and with the first word line,
  wherein the third memory cells are connected in series along the first direction;
- a third select transistor including:
  - a sixth semiconductor layer extending in the first direction; and
  - a sixth insulating layer extending in the first direction and being in contact with the sixth semiconductor layer,
  wherein one end of the third select transistor is coupled to one end of an uppermost one of the third memory cells in the first direction, and the third select transistor and the third memory cells form a third memory cell string;
- a second bit line extending in the third direction in parallel with the first bit line, the second bit line being coupled to the other end of the third select transistor; and
- a sequencer configured to simultaneously perform a write operation to each of a selected one of the first memory cells and a selected one of the third memory cells that are connected to a selected one of the first word lines while applying different voltages to the first bit line and the second bit line.

* * * * *